US011261291B2

(12) United States Patent
Burkhart et al.

(10) Patent No.: US 11,261,291 B2
(45) Date of Patent: Mar. 1, 2022

(54) MATERIALS FOR ELECTRONIC DEVICES

(71) Applicant: Merck Patent GmbH, Darmstadt (DE)

(72) Inventors: Beate Burkhart, Darmstadt (DE);
Katja Maria Scheible, Darmstadt (DE); Nils Koenen, Griesheim (DE);
Holger Heil, Frankfurt am Main (DE)

(73) Assignee: MERCK PATENT GMBH, Darmstadt (DE)

( * ) Notice: Subject to any disclaimer, the term of this patent is extended or adjusted under 35 U.S.C. 154(b) by 183 days.

(21) Appl. No.: 16/472,581

(22) PCT Filed: Dec. 19, 2017

(86) PCT No.: PCT/EP2017/083436
§ 371 (c)(1),
(2) Date: Jun. 21, 2019

(87) PCT Pub. No.: WO2018/114882
PCT Pub. Date: Jun. 28, 2018

(65) Prior Publication Data
US 2019/0322796 A1 Oct. 24, 2019

(30) Foreign Application Priority Data
Dec. 22, 2016 (EP) .................... 16206079

(51) Int. Cl.
*C08G 61/12* (2006.01)
*H01L 51/00* (2006.01)
*H01L 51/50* (2006.01)

(52) U.S. Cl.
CPC .......... *C08G 61/12* (2013.01); *H01L 51/0035* (2013.01); *H01L 51/0043* (2013.01); *H01L 51/0059* (2013.01); *H01L 51/0073* (2013.01); *H01L 51/5056* (2013.01); *C08G 2261/148* (2013.01); *C08G 2261/19* (2013.01); *C08G 2261/312* (2013.01); *C08G 2261/314* (2013.01); *C08G 2261/3162* (2013.01); *C08G 2261/3424* (2013.01); *C08G 2261/411* (2013.01); *C08G 2261/512* (2013.01); *C08G 2261/76* (2013.01); *C08G 2261/95* (2013.01)

(58) Field of Classification Search
CPC ............ C09K 11/06; C09K 2211/1011; C07D 209/86; C07D 307/91; C07D 405/12; H01L 51/06; H01L 51/006; H01L 51/0061; H01L 51/0072; H01L 51/5012; H01L 51/5056; H01L 51/5088; H05B 33/14
See application file for complete search history.

(56) References Cited

U.S. PATENT DOCUMENTS

| 2010/0108989 | A1 | 5/2010 | Buesing et al. |
| 2012/0056170 | A1 | 3/2012 | Pan et al. |
| 2013/0207095 | A1 | 8/2013 | Eberle et al. |
| 2015/0069303 | A1* | 3/2015 | Eckes .................... C08G 61/10 252/500 |
| 2015/0076415 | A1* | 3/2015 | Heil ........................ C08L 79/02 252/500 |

FOREIGN PATENT DOCUMENTS

| CA | 2641399 A1 | 9/2007 |
| CN | 101080477 A | 11/2007 |
| CN | 102449796 A | 5/2012 |
| CN | 103108896 A | 5/2013 |
| CN | 104245784 A | 12/2014 |
| GB | 2484253 A | 11/2012 |
| GB | 2508410 A | 6/2014 |
| JP | 2013-209300 A | 10/2013 |
| WO | 2006063852 A1 | 6/2006 |
| WO | 2012024778 A1 | 4/2012 |
| WO | 2013156129 A1 | 10/2013 |
| WO | 2013156130 A1 | 10/2013 |
| WO | 2015144298 A1 | 10/2015 |
| WO | 2016/188609 A1 | 12/2016 |

OTHER PUBLICATIONS

International Search Report dated Oct. 4, 2018 in International Patent Application No. PCT/EP2017/083436.
M. Kreyenschmidt et al., "Thermally Stable Blue-Light-Emitting Copolymers of Poly(alkylfluorene)", Macromolecules, 1998, pp. 1099-1103, vol. 31.

* cited by examiner

Primary Examiner — Shane Fang
(74) Attorney, Agent, or Firm — Faegre Drinker Biddle & Reath LLP

(57) ABSTRACT

The present application relates to a polymer containing at least one structural unit of a formula (I) and at least one further structural unit selected from structural units A, B and C. The present application further relates to the use of the polymer in an electronic device and to a process for preparing the polymer. The present application further relates to an electronic device comprising the polymer.

21 Claims, No Drawings

MATERIALS FOR ELECTRONIC DEVICES

RELATED APPLICATIONS

This application is a national stage entry, filed pursuant to 35 U.S.C. § 371, of PCT/EP2017/083436, filed Dec. 19, 2017, which claims the benefit of European Patent Application No. 16206079.2, filed Dec. 22, 2016, which is incorporated herein by reference in its entirety.

The present application relates to a polymer containing at least one structural unit of a formula (I) and at least one further structural unit selected from structural units A, B and C. The polymer is suitable for use in an electronic device.

Electronic devices in the context of this application are understood to mean what are called organic electronic devices, which contain organic semiconductor materials as functional materials. More particularly, these are understood to mean OLEDs. The term OLEDs is understood to mean electronic devices which have one or more layers comprising organic compounds and emit light on application of electrical voltage. The construction and general principle of function of OLEDs are known to those skilled in the art.

In electronic devices, especially OLEDs, there is great interest in improving the performance data, especially lifetime, efficiency and operating voltage.

In these aspects, it has not yet been possible to find any entirely satisfactory solution.

There is therefore a continuing search for novel materials, especially polymers, for use in OLEDs.

In the case of OLEDs, two important methods of applying the materials in layer form are known: application from the gas phase, by sublimation, and application from solution. For the latter method, suitable materials include polymers.

In this specific case of application of the material from solution, a multitude of properties are of significance, especially including solubility of the material in the solvents used and film-forming properties.

A factor of particular significance in the case of use of polymers in a hole-transporting layer of the OLED is that they bring about a long lifetime and efficiency of the device. This is especially true when polymers are used in the hole-transporting layer, in combination with a subsequent blue-emitting layer which is likewise applied from solution. A particular requirement for this purpose is for polymers having a large band gap, i.e. a large distance between HOMO and LUMO.

It has now been found that at least one, preferably more than one, of the abovementioned technical problems can be solved by the provision of a novel polymer containing particular structural units.

The present application thus provides a polymer containing at least one structural unit of the formula (I)

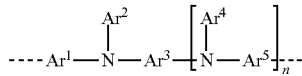

Formula (I)

where the variables that occur are as follows:

$Ar^1$, $Ar^2$, $Ar^3$, $Ar^4$ and $Ar^5$ are the same or different and are selected from heteroaromatic ring systems which have 5 to 40 aromatic ring atoms and may be substituted by one or more $R^1$ radicals, and from aromatic ring systems which have 6 to 40 aromatic ring atoms and may be substituted by one or more $R^1$ radicals, with the proviso that at least one of the two $Ar^2$ and $Ar^4$ groups is substituted in each case by an $R^4$ group in at least one ortho position to the bond to N, where the $R^4$ group may form a ring with the corresponding $Ar^2$ or $Ar^4$ group to which it is bonded, and where $R^4$ is bonded to the group selected from $Ar^2$ and $Ar^4$ groups directly or via a linker group X;

$R^1$ is the same or different at each instance and is selected from H, D, F, $C(=O)R^2$, CN, $Si(R^2)_3$, $N(R^2)_2$, $P(=O)(R^2)_2$, $OR^2$, $S(=O)R^2$, $S(=O)_2R^2$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; where two or more $R^1$ radicals may be joined to one another and may form a ring; where the alkyl, alkoxy, alkenyl and alkynyl groups mentioned and the aromatic ring systems and heteroaromatic ring systems mentioned may each be substituted by one or more $R^2$ radicals; and where one or more $CH_2$ groups in the alkyl, alkoxy, alkenyl and alkynyl groups mentioned may be replaced by $-R^2C=CR^2-$, $-C\equiv C-$, $Si(R^2)_2$, $C=O$, $C=NR^2$, $-C(=O)O-$, $-C(=O)NR^2-$, $NR^2$, $P(=O)(R^2)$, $-O-$, $-S-$, SO or $SO_2$;

$R^2$ is the same or different at each instance and is selected from H, D, F, $C(=O)R^3$, CN, $Si(R^3)_3$, $N(R^3)_2$, $P(=O)(R^3)_2$, $OR^3$, $S(=O)R^3$, $S(=O)_2R^3$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; where two or more $R^1$ and/or $R^2$ radicals may be joined to one another and may form a ring; where the alkyl, alkoxy, alkenyl and alkynyl groups mentioned and the aromatic ring systems and heteroaromatic ring systems mentioned may each be substituted by one or more $R^3$ radicals; and where one or more $CH_2$ groups in the alkyl, alkoxy, alkenyl and alkynyl groups mentioned may be replaced by $-R^3C=CR^3-$, $-C\equiv C-$, $Si(R^3)_2$, $C=O$, $C=NR^3$, $-C(=O)O-$, $-C(=O)NR^3-$, $NR^3$, $P(=O)(R^3)$, $-O-$, $-S-$, SO or $SO_2$;

$R^3$ is the same or different at each instance and is selected from H, D, F, CN, alkyl or alkoxy groups having 1 to 20 carbon atoms, alkenyl or alkynyl groups having 2 to 20 carbon atoms, aromatic ring systems having 6 to 40 aromatic ring atoms and heteroaromatic ring systems having 5 to 40 aromatic ring atoms; where two or more $R^3$ radicals may be joined to one another and may form a ring; and where the alkyl, alkoxy, alkenyl and alkynyl groups, aromatic ring systems and heteroaromatic ring systems mentioned may be substituted by F or CN;

$R^4$ is the same or different at each instance and is selected from heteroaromatic ring systems which have 5 to 40 aromatic ring atoms and may be substituted by one or more $R^2$ radicals, and from aromatic ring systems which have 6 to 40 aromatic ring atoms and may be substituted by one or more $R^2$ radicals;

X is the same or different at each instance and is selected from $C(R^2)_2$, $Si(R^2)_2$, $NR^2$, O, S, and $C=O$;

n is 0 or 1;

and at least one structural unit selected from structural units A consisting of a planar aromatic group selected from aryl groups having 6 to 40 aromatic ring atoms and heteroaryl groups having 6 to 40 aromatic ring atoms, where the planar aromatic group has at least one $R^5$ radical which, on account of the space that it occupies, brings about twisting of the planar aromatic group with respect to that plane which is formed by the planar aromatic groups of the directly adjacent structural units, and where the abovementioned aryl groups and heteroaryl groups may each be substituted by one or more further $R^5$ radicals;

structural units B containing two groups bonded directly to one another, selected from aryl groups which have 6 to 40 aromatic ring atoms and may be substituted in each case by one or more $R^5$ radicals and heteroaryl groups which have 5 to 40 aromatic ring atoms and may be substituted in each case by one or more $R^5$ radicals, where the conjugation plane of the second aryl or heteroaryl group is twisted about the axis of the bond between the two groups with respect to the conjugation plane of the first aryl or heteroaryl group; and structural units C corresponding to the formula (II-C)

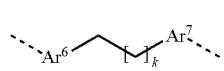

Formula (II-C)

where $Ar^6$ and $Ar^7$ are the same or different at each instance and are selected from aromatic ring systems which have 6 to 40 aromatic ring atoms and may be substituted by one or more $R^5$ radicals and heteroaromatic ring systems which have 5 to 40 aromatic ring atoms and may be substituted by one or more $R^5$ radicals;

$R^5$ is the same or different at each instance and is selected from H, D, F, $C(=O)R^2$, CN, $Si(R^2)_3$, $N(R^2)_2$, $P(=O)(R^2)_2$, $OR^2$, $S(=O)R^2$, $S(=O)_2R^2$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; where two or more $R^1$ radicals may be joined to one another and may form a ring; where the alkyl, alkoxy, alkenyl and alkynyl groups mentioned and the aromatic ring systems and heteroaromatic ring systems mentioned may each be substituted by one or more $R^2$ radicals; and where one or more $CH_2$ groups in the alkyl, alkoxy, alkenyl and alkynyl groups mentioned may be replaced by $—R^2C=CR^2—$, $—C\equiv C—$, $Si(R^2)_2$, $C=O$, $C=NR^2$, $—C(=O)O—$, $—C(=O)NR^2—$, $NR^2$, $P(=O)(R^2)$, $—O—$, $—S—$, $SO$ or $SO_2$;

k has a value of 0 to 9, and where one or more $CH_2$ units in the alkylene chain of formula (II-C) may be replaced by a divalent unit selected from $C=O$, $C=NR^5$, $—C(=O)O—$, $—C(=O)NR^5—$, $Si(R^5)_2$, $NR^5$, $P(=O)(R^5)$, O, S, SO and $SO_2$; and where one or more hydrogen atoms in the alkylene chain of formula (II-C) may each be replaced by an $R^5$ radical.

In the formulae for structural units, the dotted lines indicate the bonds to adjacent structural units of the polymer.

The term "structural unit" in the present application is understood to mean a unit that occurs multiple times with the structure specified in the polymer. It may occur repeatedly, i.e. more than once in succession, and/or in isolated form in the polymer. Preferably, a multitude of structural units having the structure specified occur in the polymer, more preferably 10 to 1000, most preferably 50 to 500. If a unit is specified as a structural unit of the polymer, the proportion thereof in the polymer is preferably in the range from 0.01 to 50 mol %, more preferably in the range from 0.1 to 30 mol % and most preferably in the range from 0.5 to 20 mol %, based on 100 mol % of all polymerized monomers present as structural units in the polymer.

Further preferably, a structural unit in the context of the present application is derived from a monomer used in the polymerization in that the reactive groups of the monomer have reacted in accordance with their chemical reactivity and purpose. For example, in the case of a monomer containing two bromine atoms as reactive groups in a Suzuki polymerization reaction, the structural unit formed in the polymer is characterized in that it corresponds to the monomer structure, except that the bromine atoms are absent and the bonds to the bromine atoms are now bonds to the adjacent structural units. In the case of monomers containing crosslinker groups or precursor groups for crosslinker groups, it is possible here for one or more further reactions of the crosslinker group or of the corresponding precursor groups of the crosslinker group to proceed until the corresponding ultimate structural unit of the polymer is obtained.

The wording that the $R^4$ group can form a ring with the corresponding $Ar^2$ or $Ar^4$ group to which it is bonded is understood to mean that the corresponding $R^4$ group, in addition to the bond to the $Ar^2$ or $Ar^4$ group, is also bonded to the $Ar^2$ or $Ar^4$ group by a bridge, preferably selected from a single bond, $C(R^2)_2$, $Si(R^2)_2$, $NR^2$, O, S and $C=O$, more preferably selected from a single bond and $C(R^2)_2$. This is illustrated by the following scheme in which the $Ar^2$ group is a phenyl group, in which the $R^4$ group is a phenyl group, and in which the bridge is $C(R^2)_2$:

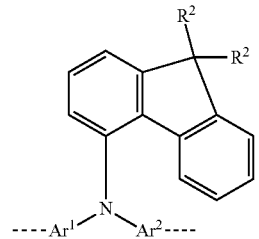

The term "conjugation plane" of aryl or heteroaryl groups is understood in the present application to mean the plane in which the corresponding planar rings of the aryl or heteroaryl groups lie. Twisting of the conjugation plane of a group with respect to the conjugation plane of the other group to which the first group is bonded directly is understood here to mean that the corresponding planar rings are twisted with respect to one another, about the axis of the bond between the two groups. The twist may assume any value in degrees that is not negligibly small and that, by definition, can be up to 90°. Preference is given to values between 35° and 90°.

An aryl group in the context of this invention contains 6 to 40 aromatic ring atoms of which none is a heteroatom. An aryl group in the context of this invention is understood to mean either a simple aromatic cycle, i.e. benzene, or a fused aromatic polycycle, for example naphthalene, phenanthrene or anthracene. A fused aromatic polycycle in the context of the present application consists of two or more simple aromatic cycles fused to one another. Fusion between cycles is understood here to mean that the cycles share at least one edge with one another.

A heteroaryl group in the context of this invention contains 5 to 40 aromatic ring atoms of which at least one is a heteroatom. The heteroatoms of the heteroaryl group are preferably selected from N, O and S. A heteroaryl group in the context of this invention is understood to mean either a simple heteroaromatic cycle, for example pyridine, pyrimidine or thiophene, or a fused heteroaromatic polycycle, for example quinoline or carbazole. A fused heteroaromatic polycycle in the context of the present application consists of two or more simple heteroaromatic cycles fused to one another. Fusion between cycles is understood here to mean that the cycles share at least one edge with one another.

An aryl or heteroaryl group, each of which may be substituted by the abovementioned radicals and which may be joined to the aromatic or heteroaromatic system via any desired positions, is especially understood to mean groups derived from benzene, naphthalene, anthracene, phenanthrene, pyrene, dihydropyrene, chrysene, perylene, triphenylene, fluoranthene, benzanthracene, benzophenanthrene, tetracene, pentacene, benzopyrene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, benzopyridazine, pyrimidine, benzopyrimidine, quinoxaline, pyrazine, phenazine, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole.

An aromatic ring system in the context of this invention contains 6 to 40 carbon atoms in the ring system and does not include any heteroatoms as aromatic ring atoms. An aromatic ring system in the context of this invention therefore does not contain any heteroaryl groups. An aromatic ring system in the context of this invention shall be understood to mean a system which does not necessarily contain only aryl groups but in which it is also possible for a plurality of aryl groups to be bonded by a single bond or by a non-aromatic unit, for example one or more optionally substituted C, Si, N, O or S atoms. In this case, the non-aromatic unit comprises preferably less than 10% of the atoms other than H, based on the total number of atoms other than H in the system. For example, systems such as 9,9'-spirobifluorene, 9,9'-diarylfluorene, triarylamine, diaryl ethers and stilbene are also to be regarded as aromatic ring systems in the context of this invention, and likewise systems in which two or more aryl groups are joined, for example, by a linear or cyclic alkyl, alkenyl or alkynyl group or by a silyl group. In addition, systems in which two or more aryl groups are joined to one another via single bonds are also regarded as aromatic ring systems in the context of this invention, for example systems such as biphenyl and terphenyl.

A heteroaromatic ring system in the context of this invention contains 5 to 40 aromatic ring atoms, at least one of which is a heteroatom. The heteroatoms of the heteroaromatic ring system are preferably selected from N, O and/or S. A heteroaromatic ring system corresponds to the abovementioned definition of an aromatic ring system, but has at least one heteroatom as one of the aromatic ring atoms. In this way, it differs from an aromatic ring system in the sense of the definition of the present application, which, according to this definition, cannot contain any heteroatom as aromatic ring atom.

An aromatic ring system having 6 to 40 aromatic ring atoms or a heteroaromatic ring system having 5 to 40 aromatic ring atoms is especially understood to mean groups derived from the groups mentioned above under aryl groups and heteroaryl groups, and from biphenyl, terphenyl, quaterphenyl, fluorene, spirobifluorene, dihydrophenanthrene, dihydropyrene, tetrahydropyrene, indenofluorene, truxene, isotruxene, spirotruxene, spiroisotruxene, indenocarbazole, or from combinations of these groups.

In the context of the present invention, a straight-chain alkyl group having 1 to 20 carbon atoms and a branched or cyclic alkyl group having 3 to 20 carbon atoms and an alkenyl or alkynyl group having 2 to 40 carbon atoms in which individual hydrogen atoms or $CH_2$ groups may also be substituted by the groups mentioned above in the definition of the radicals are preferably understood to mean the methyl, ethyl, n-propyl, i-propyl, n-butyl, i-butyl, s-butyl, t-butyl, 2-methylbutyl, n-pentyl, s-pentyl, cyclopentyl, neopentyl, n-hexyl, cyclohexyl, neohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl or octynyl radicals.

An alkoxy or thioalkyl group having 1 to 20 carbon atoms in which individual hydrogen atoms or $CH_2$ groups may also be replaced by the groups mentioned above in the definition of the radicals is preferably understood to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy, 2,2,2-trifluoroethoxy, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio.

The wording that two or more radicals together may form a ring, in the context of the present application, shall be understood to mean, inter alia, that the two radicals are joined to one another by a chemical bond. In addition, however, the abovementioned wording shall also be understood to mean that, if one of the two radicals is hydrogen, the second radical binds to the position to which the hydrogen atom was bonded, forming a ring.

Preferably, $Ar^1$, $Ar^2$, $Ar^3$, $Ar^4$ and $Ar^5$ are the same or different at each instance and are selected from aromatic ring systems which have 6 to 25 aromatic ring atoms and may be substituted by one or more $R^1$ radicals. More preferably, $Ar^1$, $Ar^2$, $Ar^3$, $Ar^4$ and $Ar^5$ are the same or different at each instance and are selected from benzene, biphenyl, terphenyl, fluorene, naphthalene, phenanthrene, indenofluorene and spirobifluorene, which may be substituted by one or more $R^1$ radicals. Most preferably, $Ar^1$, $Ar^2$, $Ar^3$, $Ar^4$ and $Ar^5$ are benzene which may be substituted by one or more $R^1$ radicals.

Preferably, $R^1$ is the same or different at each instance and is selected from H, D, F, CN, $Si(R^2)_3$, $N(R^2)_2$, straight-chain alkyl or alkoxy groups having 1 to 20 carbon atoms, branched or cyclic alkyl or alkoxy groups having 3 to 20 carbon atoms, aromatic ring systems having 6 to 40 aromatic ring atoms and heteroaromatic ring systems having 5 to 40 aromatic ring atoms, where the alkyl and alkoxy groups mentioned, the aromatic ring systems mentioned and the heteroaromatic ring systems mentioned may each be substituted by one or more $R^2$ radicals; and where one or more $CH_2$ groups in the alkyl or alkoxy groups mentioned may be replaced by —C≡C—, —$R^2$C=C$R^2$—, Si($R^2$)$_2$, C=O, C=N$R^2$, —N$R^2$—, —O—, —S—, —C(=O)O— or —C(=O)N$R^2$—.

Preferably, $R^2$ is the same or different at each instance and is selected from H, D, F, CN, Si($R^3$)$_3$, N($R^3$)$_2$, straight-chain alkyl or alkoxy groups having 1 to 20 carbon atoms, branched or cyclic alkyl or alkoxy groups having 3 to 20 carbon atoms, aromatic ring systems having 6 to 40 aromatic ring atoms and heteroaromatic ring systems having 5 to 40 aromatic ring atoms, where the alkyl and alkoxy groups mentioned, the aromatic ring systems mentioned and the heteroaromatic ring systems mentioned may each be substituted by one or more $R^3$ radicals; and where one or more $CH_2$ groups in the alkyl or alkoxy groups mentioned may be replaced by —C≡C—, —$R^3$C=C$R^3$—, Si($R^3$)$_2$, C=O, C=N$R^3$, —N$R^3$—, —O—, —S—, —C(=O)O— or —C(=O)N$R^3$—.

Preferably, $R^4$ is the same or different at each instance and is selected from aromatic ring systems which have 6 to 20 aromatic ring atoms and may be substituted by one or more $R^2$ radicals.

Preferably, X is C($R^2$)$_2$.

Preferably, n is 0. A preferred structural unit of the formula (I) thus conforms to the formula (I-1)

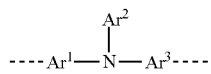

Formula (I-1)

where the variables that occur are as defined above for formula (I).

If n=1, which may likewise be preferred, the structural unit of the formula (I) conforms to the formula (I-2)

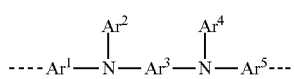

Formula (I-2)

where the variables that occur are as defined above for formula (I).

Preferably, at least one group selected from $Ar^2$ and $Ar^4$ groups contains exactly one or exactly two $R^4$ group(s) in the ortho position to the nitrogen atom, more preferably exactly one $R^4$ group in the ortho position to the nitrogen atom, where $R^4$ is bonded to the group selected from $Ar^2$ and $Ar^4$ groups directly or via a linker group X.

In a preferred embodiment of the invention, the $R^4$ group does not form a ring with the $Ar^2$ or $Ar^4$ group to which it is bonded.

In this embodiment, preferred structural units of the formula (I) conform to one of the formulae (I-1-A), (I-2-A-1), (I-2-A-2) and (I-2-A-3)

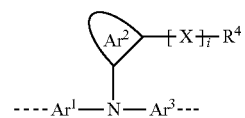

Formula (I-1-A)

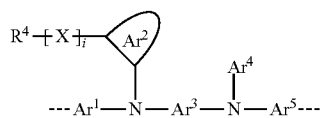

Formula (I-2-A-1)

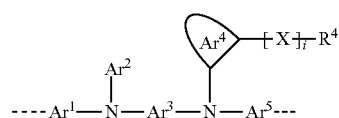

Formula (I-2-A-2)

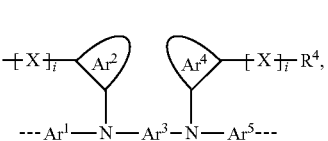

(Formula (I-2-A-3)

where i is 0 or 1 and is preferably 0, and the other variables are as defined above. Preferably, in the above formulae, $Ar^2$ and $Ar^4$ are phenyl which may be substituted in each case by one or more $R^1$ radicals. The $Ar^2$ and $Ar^4$ groups may also, in addition to the first [X]$_i$—$R^4$ group shown, be substituted by a further [X]$_i$—$R^4$ group in the ortho position.

When i is 0, the $R^4$ and $Ar^2$ or $Ar^4$ units in question are bonded directly to one another.

Among the abovementioned formulae, particular preference is given to the formula (I-1-A).

The bond position of [X]$_i$—$R^4$ and N in the illustrative $Ar^2$ or $Ar^4$ ring in the above formulae indicates here that these two groups are each in ortho positions to one another.

In an alternative, likewise preferred embodiment of the invention, the $R^4$ group forms a ring with the $Ar^2$ or $Ar^4$ group to which it is bonded.

Corresponding preferred embodiments of the formula (I) in this case conform to the following formulae (I-1-B), (I-2-B-1), (I-2-B-2) and (I-2-B-3):

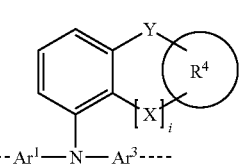

Formula (I-1-B)

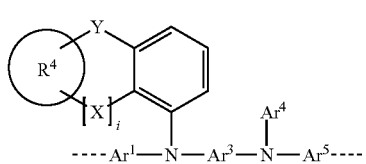

Formula (I-2-B-1)

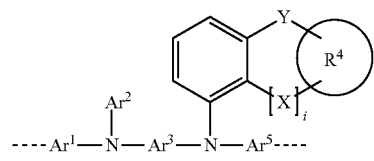

Formula (I-2-B-2)

Formula (I-2-B-3)

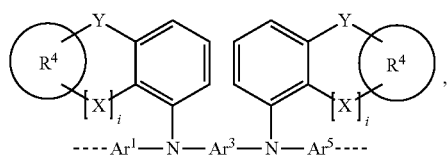

where i is 0 or 1, and is preferably 0,
where Y is the same or different at each instance and is selected from a single bond, $C(R^2)_2$, $Si(R^2)_2$, $NR^2$, O, S and C=O, and is preferably selected from a single bond and $C(R^2)_2$,
and the other variables are as defined above.

In a preferred embodiment, the two $R^2$ radicals on a Y group as $C(R^2)_2$ form a ring, giving rise to a spiro unit. Preferably, a spirobifluorene is formed here in that the $R^2$ radicals are phenyl, the two $R^2$ radicals are joined to one another by a single bond, $R^4$ is phenyl, and the index i is zero, such that $R^4$ is bonded directly to the group in question to which it binds.

Among the abovementioned formulae, particular preference is given to the formula (I-1-B).

More preferably, the structural unit of the formula (I) conforms to one of the formulae (I-1-A-A), (I-1-A-B) and (I-1-B-A)

Formula (I-1-A-A)

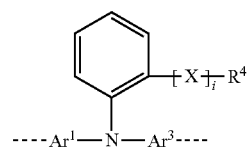

Formula (I-1-A-B)

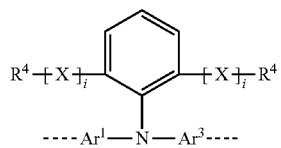

Formula (I-1-B-A)

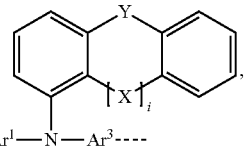

where i is 0 or 1, and is preferably 0,
where the aromatic six-membered rings may each be substituted at the positions shown as unsubstituted by an $R^1$ or $R^2$ radical, and where the variables that occur are as defined above. Among the abovementioned formulae, particular preference is given to the formulae (I-1-A-A) and (I-1-B-A).

Preferably, in formula (I-1-A-A) and (I-1-A-B), i is 0, such that $R^4$ and the phenyl group are bonded to one another directly.

Preferably, in formula (I-1-B-A), i is 0, such that the two phenyl groups are bonded directly to one another, and Y is $C(R^2)_2$. It is a preferred embodiment here that $R^2$ in a Y group that corresponds to $C(R^2)_2$ is phenyl, and the two $R^2$ groups are joined to one another by a single bond, such that a spirobifluorene unit is bonded to the nitrogen atom.

Preferred embodiments of the formula (I) correspond to the formulae (VIIIa) to (VIIIh), (IXa) to (IXg) and (Xa) to (Xc) disclosed in WO 2013/156130, where R is to be replaced by $R^1$ or $R^2$, k, m, n and p indicate the number of substituents possible in each ring in question, and v is 1 to 20, preferably 1 to 10. In addition, preferred embodiments of the formula (I) are the formulae disclosed in WO 2013/156129 in the tables on pages 26-34, where R is to be replaced by $R^1$ or $R^2$, k, m, n and p indicate the number of substituents possible in each ring in question, s is 1 to 20, preferably 1 to 10, and X is $C(R^5)_2$.

Particularly preferred structural units of the formula (I) are depicted in the following table:

(I-a)

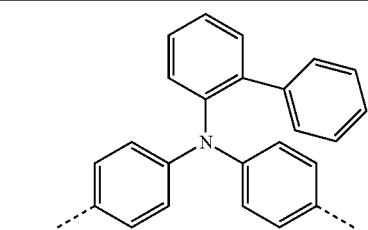

(I-b)

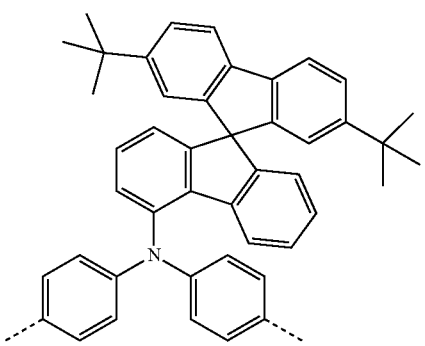

-continued
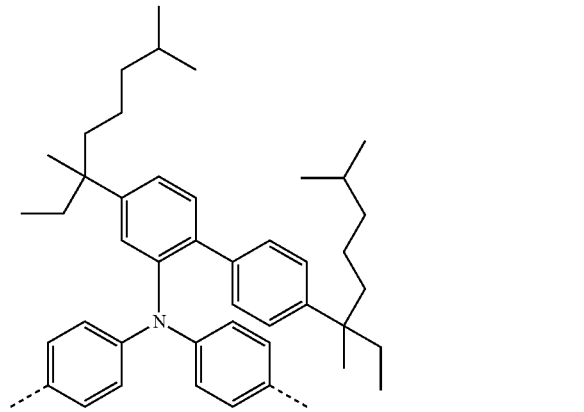
(I-c)
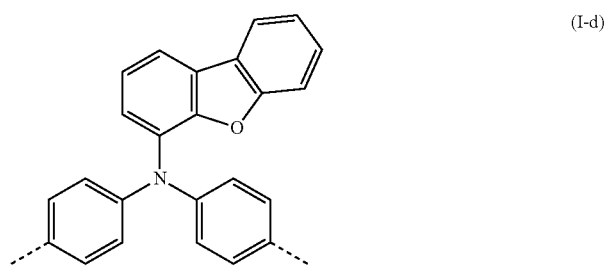
(I-d)
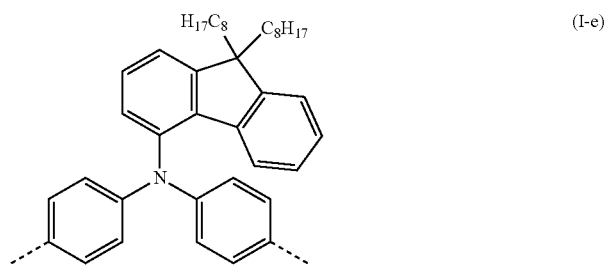
(I-e)
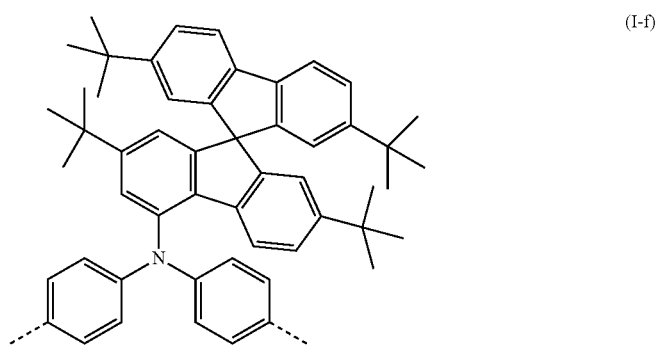
(I-f)
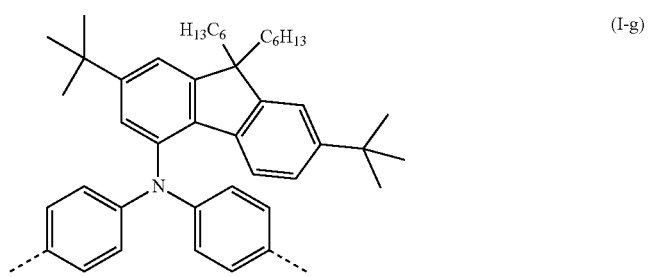
(I-g)

-continued
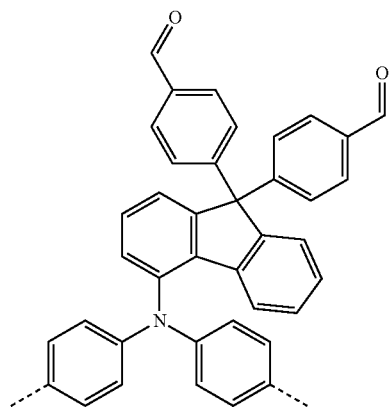
(I-h)
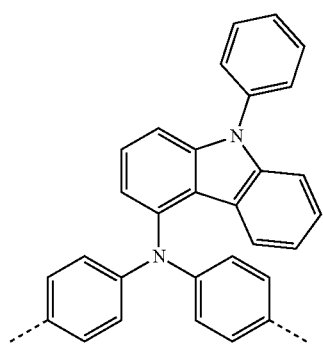
(I-i)
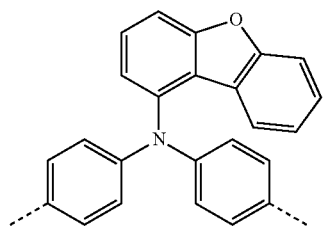
(I-j)
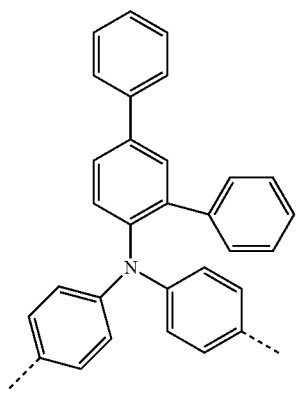
(I-k)

-continued
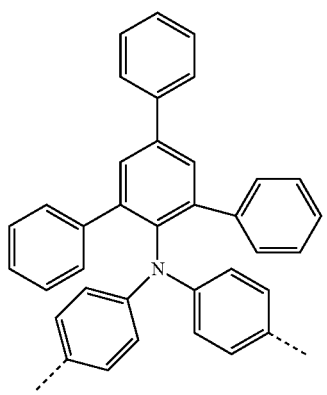
(I-l)
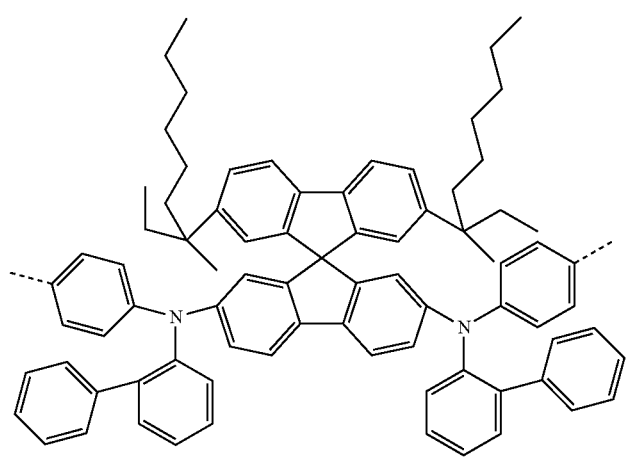
(I-m)
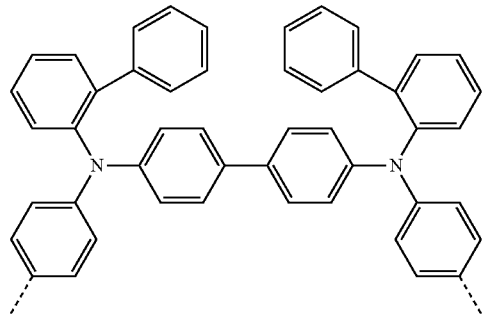
(I-n)
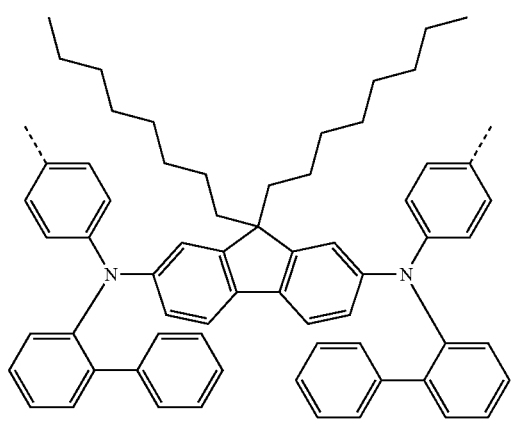
(I-o)

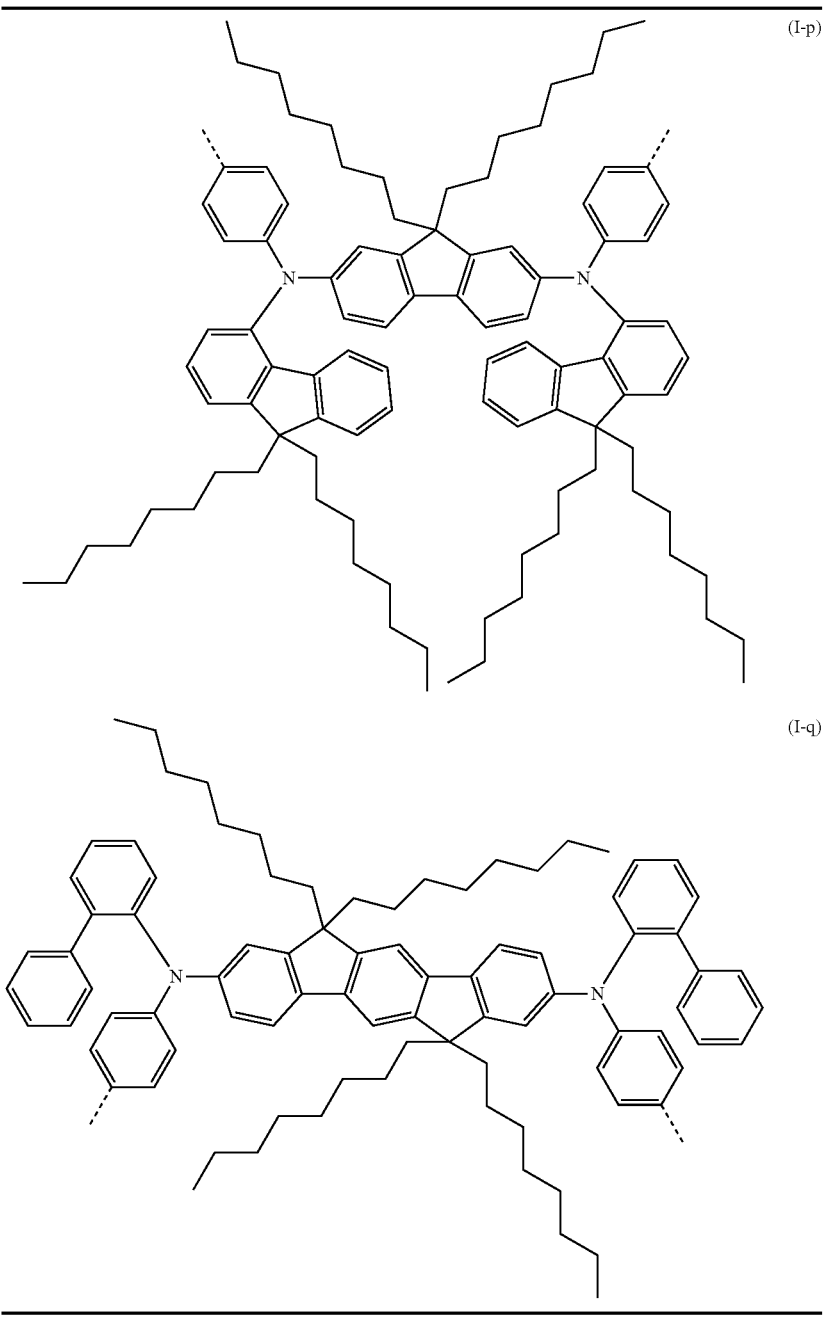

Preferably, the polymer contains at least one structural unit selected from structural units A and B.

Preferred structural units A conform to the formula (II-A)

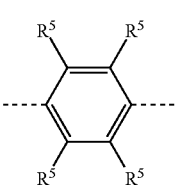

Formula (II-A)

where $R^5$ is as defined above and there is at least one $R^5$ group other than H and D. Preferably, in formula (II-A), there are at least two $R^5$ groups other than H and D. More preferably, in formula (II-A), there are exactly two $R^5$ groups other than H and D.

Preferably, in formula (II-A), there is at least one $R^5$ group selected from straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms and heteroaromatic ring systems having 5 to 40 aromatic ring atoms, where said alkyl, alkoxy, alkenyl and alkynyl groups and said aromatic ring systems and heteroaromatic ring systems may each be substituted by one or more R² radicals. Preferably, there are exactly two R⁵ groups of this kind.

A preferred embodiment of the formula (II-A) conforms to the formula (II-A-1)

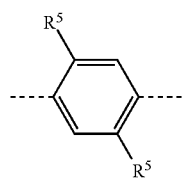

Formula (II-A-1)

where $R^5$ is the same or different at each instance and is selected from straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms and heteroaromatic ring systems having 5 to 40 aromatic ring atoms, where said alkyl, alkoxy, alkenyl and alkynyl groups and said aromatic ring systems and heteroaromatic ring systems may each be substituted by one or more $R^2$ radicals.

Particularly preferred structural units of the formula (II-A) are shown below:

(II-A-a)

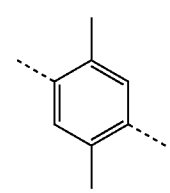

(II-A-b)

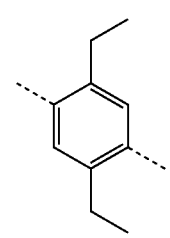

(II-A-c)

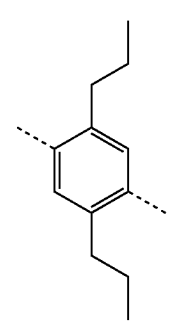

(II-A-d)

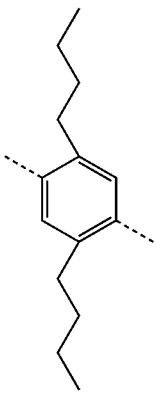

(II-A-e)

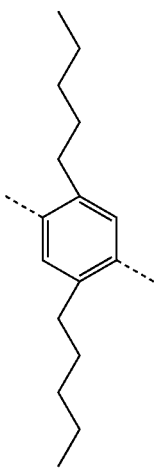

(II-A-f)

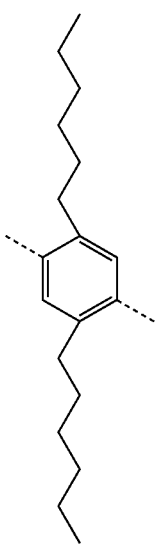

(II-A-g)
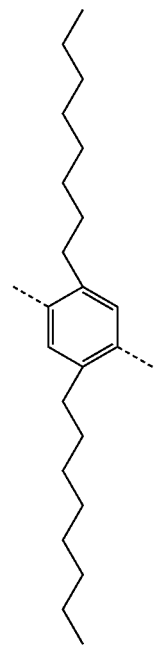
(II-A-h)
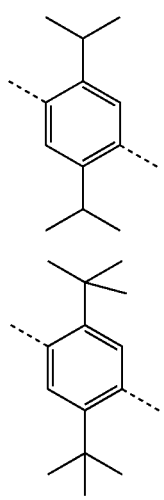
(II-A-i)
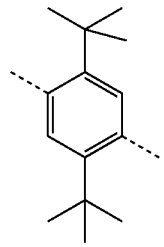
(II-A-j)
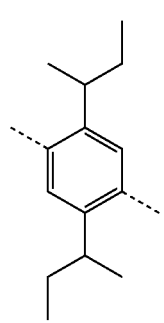
(II-A-k)
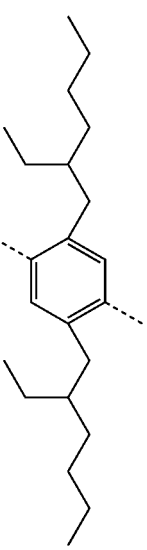
(II-a-l)
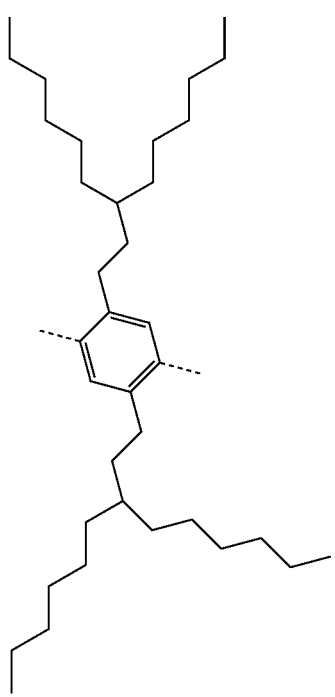

(II-A-m) 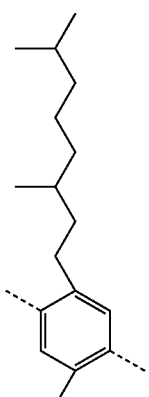
(II-A-n) 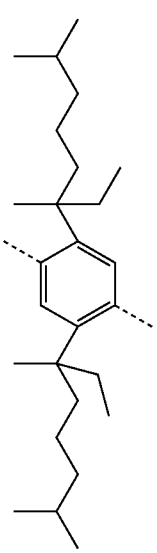
(II-A-o) 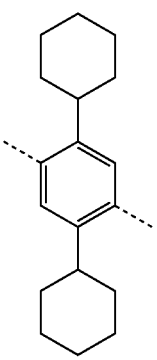
(II-A-p) 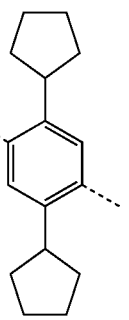
(II-A-q) 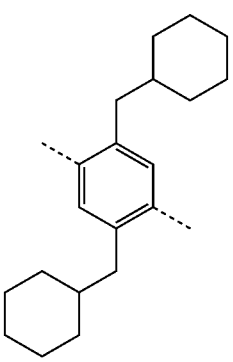
(II-A-r) 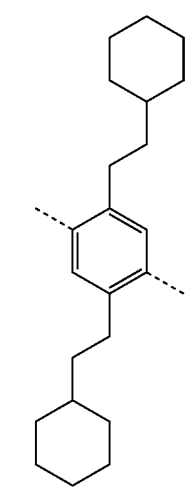
(II-A-s) 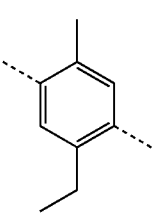
(II-A-t) 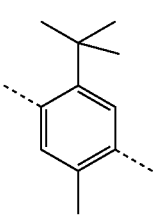

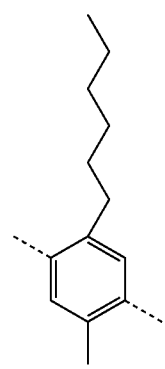
(II-A-u)
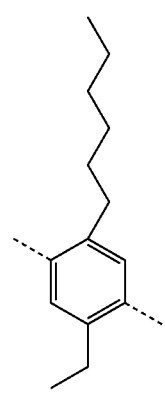
(II-A-v)
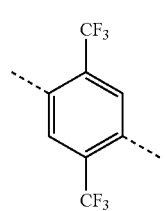
(II-A-w)
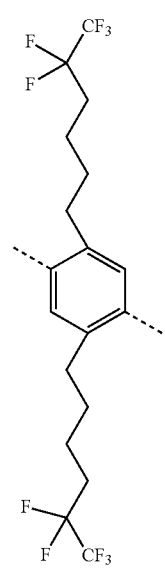
(II-A-x)
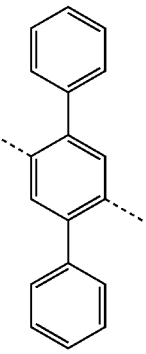
(II-A-y)
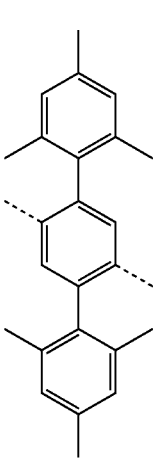
(II-A-z)
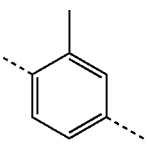
(II-A-aa)
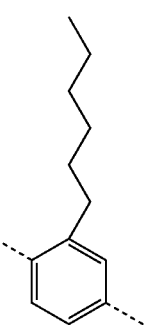
(II-A-ab)
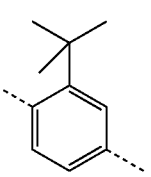
(II-A-ac)

(II-A-ad)

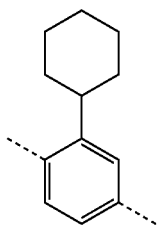

(II-A-ae)

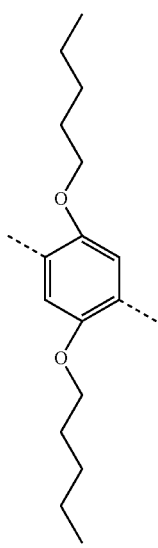

(II-A-af)

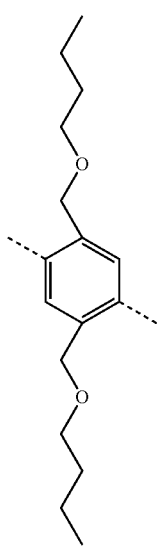

Preferred structural units B conform to the formula (II-B)

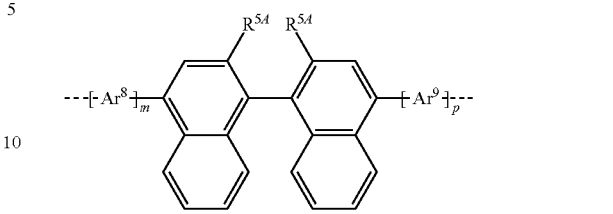

Formula (II-B)

where $R^{5A}$ is the same or different at each instance and is selected from H, D, F, C(=O)R$^2$, CN, Si(R$^2$)$_3$, N(R$^2$)$_2$, P(=O)(R$^2$)$_2$, OR$^2$, S(=O)R$^2$, S(=O)$_2$R$^2$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; where two or more R$^1$ radicals may be joined to one another and may form a ring; where the alkyl, alkoxy, alkenyl and alkynyl groups mentioned and the aromatic ring systems and heteroaromatic ring systems mentioned may each be substituted by one or more R$^2$ radicals; and where one or more CH$_2$ groups in the alkyl, alkoxy, alkenyl and alkynyl groups mentioned may be replaced by —R$^2$C=CR$^2$—, —C≡C—, Si(R$^2$)$_2$, C=O, C=NR$^2$, —C(=O)O—, —C(=O)NR$^2$—, NR$^2$, P(=O)(R$^2$), —O—, —S—, SO or SO$_2$;

Ar$^8$ and Ar$^9$ are the same or different at each instance and are selected from aromatic ring systems which have 6 to 40 aromatic ring atoms and may be substituted by one or more R$^5$ radicals and heteroaromatic ring systems which have 5 to 40 aromatic ring atoms and may be substituted by one or more R$^5$ radicals;

m and p are the same or different at each instance and are selected from 0 and 1;

and the naphthyl groups at the positions shown as unsubstituted may each be substituted by an R$^5$ radical.

Preferably, in formula (II-B), m and p are 0.

Further preferably, in formula (II-B), the R$^5$ groups are H.

Further preferably, at least one R$^{5A}$ group in the compound of the formula (II-B) is not H or D.

Further preferably, in formula (II-B), at least one of the two R$^{5A}$ groups, more preferably both of the two R$^{5A}$ groups, are the same or different at each instance and are selected from straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms and heteroaromatic ring systems having 5 to 40 aromatic ring atoms, where said alkyl, alkoxy, alkenyl and alkynyl groups and said aromatic ring systems and heteroaromatic ring systems may each be substituted by one or more R$^2$ radicals. More preferably, in formula (II-B), the two R$^{5A}$ groups selected are the same.

Particularly preferred structural units of the formula (II-B) are shown in the following table:
(II-B-a)
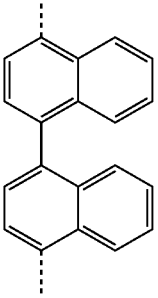
(II-B-b)
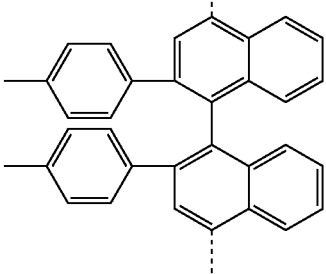
(II-B-c)
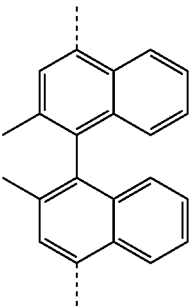
(II-B-d)
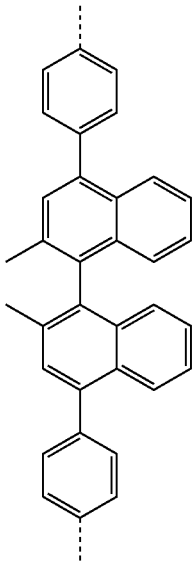
(II-B-e)
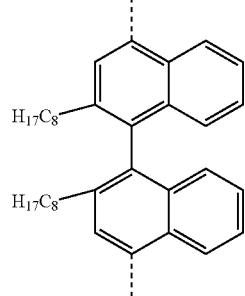
-continued
(II-B-f)
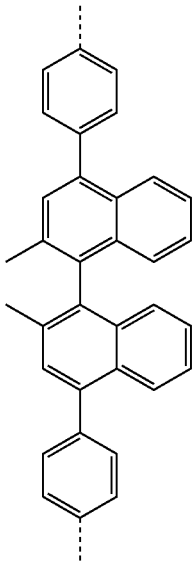
(II-B-g)
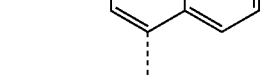
(II-B-h)
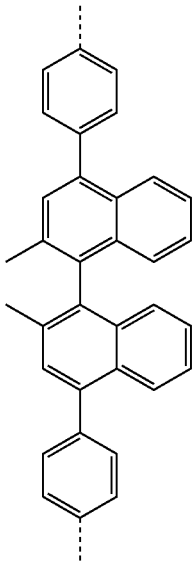

(II-B-i)

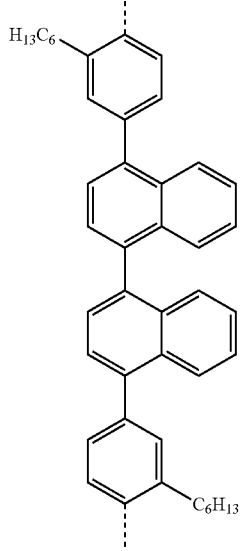

(II-B-j)

(II-B-k)

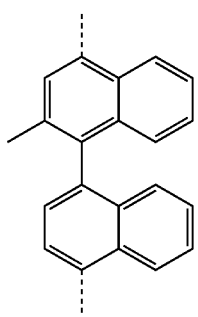

(II-B-l)

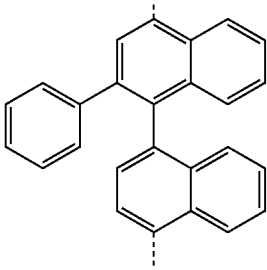

Preferably, in the structural unit of the formula (II-C), k has a value of 1 to 9, more preferably of 3 to 8, most preferably of 4 to 8.

It is further preferable that the alkylene chain of formula (II-C) is unsubstituted, meaning that no hydrogen atoms in the alkylene chain are replaced by $R^5$ radicals.

It is further preferable that no $CH_2$ groups in the alkylene chain of formula (II-C) are replaced by the abovementioned divalent groups. If $CH_2$ groups are replaced by the above-mentioned groups, these are preferably one, two or three $CH_2$ groups. The divalent groups which can replace $CH_2$ groups are preferably O.

Preferred structural units C conform to the formula (II-C-1)

Formula (II-C-1)

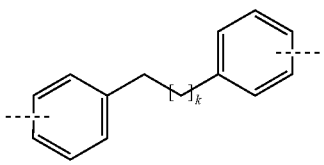

where the positions shown as unsubstituted on the benzene rings and in the alkylene chain may each be substituted by an $R^5$ radical, and where k has a value of 0 to 9, and where $CH_2$ groups in the alkylene chain may each be replaced by a divalent O group.

Preferably, k has a value generally specified as preferable above.

Particularly preferred structural units of the formula (II-C) are shown in the following table:

(II-C-1-a)

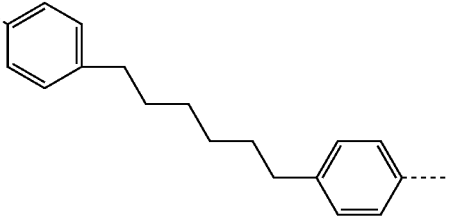

(II-C-1-b)

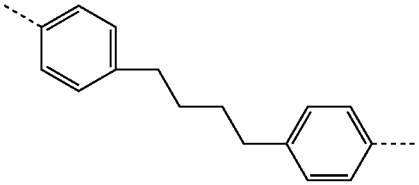

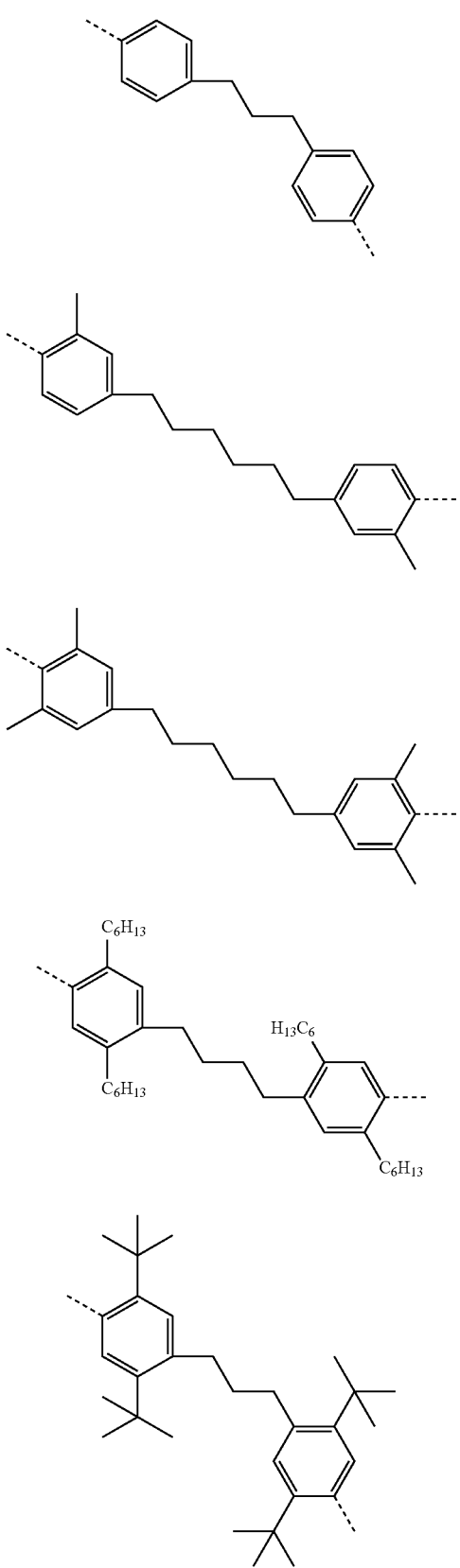

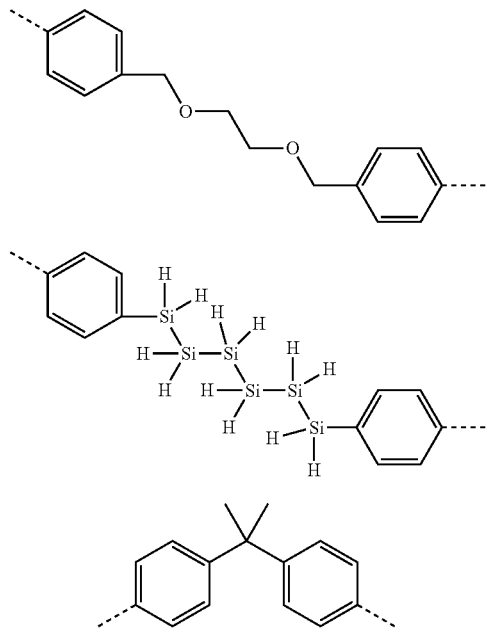

Preferably, the sum total of the proportions of those structural units that correspond to a structural unit A, B or C in the polymer is between 20 and 75 mol %, based on 100 mol % of all copolymerized monomers present as structural units in the polymer. Particular preference is given to 30 to 60 mol %.

Preferably, the sum total of the proportions of those structural units that correspond to a structural unit of the formula (I) in the polymer is between 10 and 60 mol %, based on 100 mol % of all copolymerized monomers present as structural units in the polymer. Particular preference is given to 20 to 50 mol %, the greatest preference to 25 to 45 mol %.

Preferably, the polymer contains at least one structural unit having a crosslinkable Q group. The structural unit containing the crosslinkable Q group may be a structural unit of the formula (I), a structural unit A, a structural unit B, a structural unit C or another structural unit. Other structural units having a crosslinkable Q group are preferably selected from structural units from group 1 specified further down (=units which affect the hole injection and/or hole transport properties of the polymers), especially triarylamine structural units, and structural units from group 4 specified further down (=units which are typically used as polymer backbone), especially fluorene, indenofluorene and spirobifluorene structural units.

"Crosslinkable group" in the context of the present application means a functional group capable of entering into a reaction within the polymer and thus forming an insoluble compound. The reaction may be with a further identical Q group, a further different Q group or any other portion of the same or another polymer chain. The crosslinkable group is thus a reactive group. This affords, as a result of the chemical reaction of the crosslinkable group, a correspondingly crosslinked polymer.

The crosslinking reaction can be conducted in a polymer layer comprising a polymer containing a structural unit containing a crosslinkable group, forming an insoluble polymer layer. The crosslinking can be promoted by means of heat or by means of UV radiation, microwave radiation, x-radiation or electron beams, and optionally take place in the presence of an initiator. "Insoluble" in the context of the present application preferably means that the polymer, after the crosslinking reaction, i.e. after the reaction of the crosslinkable groups, has a lower solubility at room temperature in an organic solvent at least by a factor of 3, preferably at least by a factor of 10, than that of the corresponding non-crosslinked polymer of the invention in the same organic solvent.

A particular task of the crosslinkable group is to join the polymers to one another by a crosslinking reaction. Which chemical groups are suitable in principle as crosslinkable groups is part of common art knowledge of the person skilled in the art in the field of the present application.

The crosslinking reaction leads to a crosslinked polymer compound and, when the reaction is conducted in a polymer layer, to a crosslinked polymer layer. A crosslinked layer in the context of the present invention is understood to mean a layer obtainable by conducting the crosslinking reaction from a layer of the crosslinkable polymer. The crosslinking reaction can generally be initiated by means of heat and/or by means of UV radiation, microwave radiation, x-radiation or electron beams and/or by the use of free-radical formers, anions, cations, acids and/or photoacids.

The presence of catalysts and/or initiators may likewise be advisable or necessary. Preferably, the crosslinking reaction is a reaction for which no initiator and no catalyst need be added.

Crosslinkable Q groups preferred in accordance with the invention are the following groups:

a) Terminal or Cyclic Alkenyl or Terminal Dienyl and Alkynyl Groups:

These include units containing a terminal or cyclic double bond, a terminal dienyl group or a terminal triple bond, especially terminal or cyclic alkenyl, terminal dienyl or terminal alkynyl groups having 2 to 40 carbon atoms, preferably having 2 to 10 carbon atoms. Additionally suitable are also groups which are precursors of the abovementioned groups and which are capable of in situ formation of a double or triple bond, for example aldehyde groups.

b) Alkenyloxy, Dienyloxy or Alkynyloxy Groups:

These include alkenyloxy, dienyloxy or alkynyloxy groups, preferably alkenyloxy groups.

c) Acrylic Acid Groups:

These include acrylic acid units in the broadest sense, preferably acrylic esters, acrylamides, methacrylic esters and methacrylamides. Particular preference is given to $C_{1-10}$-alkyl acrylate and $C_{1-10}$-alkyl methacrylate.

The crosslinking reaction of the groups mentioned above under a) to c) can be effected via a free-radical, cationic or anionic mechanism, or else via cycloaddition.

It may be advisable to add an appropriate initiator for the crosslinking reaction. Suitable initiators for the free-radical crosslinking are, for example, dibenzoyl peroxide, AIBN or TEMPO. Suitable initiators for the cationic crosslinking are, for example, $AlCl_3$, $BF_3$, triphenylmethyl perchlorate or tropylium hexachloroantimonate. Suitable initiators for the anionic crosslinking are bases, especially butyllithium.

In a preferred embodiment of the present invention, the crosslinking, however, is conducted without the addition of an initiator and is initiated exclusively by thermal means. This has the advantage that the absence of the initiator prevents contamination of the layer which could lead to worsening of the device properties.

d) Oxetanes and Oxiranes:

A further suitable class of crosslinkable Q groups is that of oxetanes and oxiranes which crosslink cationically via ring opening.

It may be advisable to add an appropriate initiator for the crosslinking reaction. Suitable initiators are, for example, $AlCl_3$, $BF_3$, triphenylmethyl perchlorate or tropylium hexachloroantimonate. It is likewise possible to add photoacids as initiators.

e) Silanes:

Additionally suitable as a class of crosslinkable groups are silane groups $SiR_3$ where at least two R groups, preferably all three R groups, are Cl or an alkoxy group having 1 to 20 carbon atoms. This group reacts in the presence of water to give an oligo- or polysiloxane.

f) Cyclobutane Groups

These include especially cyclobutane groups fused to an aryl or heteroaryl group, for example fused to a phenyl group.

The abovementioned crosslinkable Q groups are generally known to those skilled in the art, as are the suitable reaction conditions which are used for reaction of these groups.

Among the abovementioned Q groups, particular preference is given to Q groups according to the above groups a) and f), very particular preference to terminal alkenyl groups and cyclobutane groups.

Particularly preferred crosslinkable Q groups are as follows:

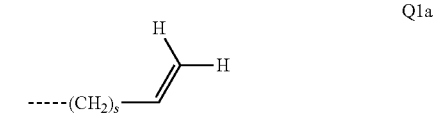

Q1a

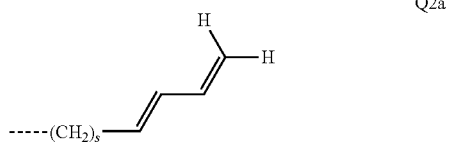

Q2a

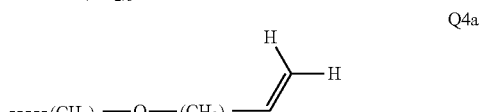

Q4a

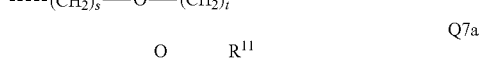

Q7a

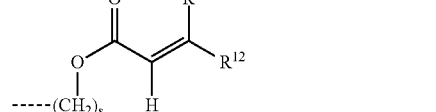

Q7b

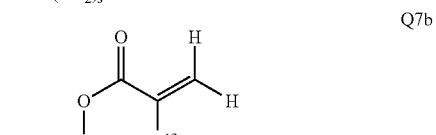

Q9a

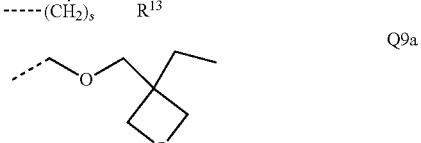

Q12

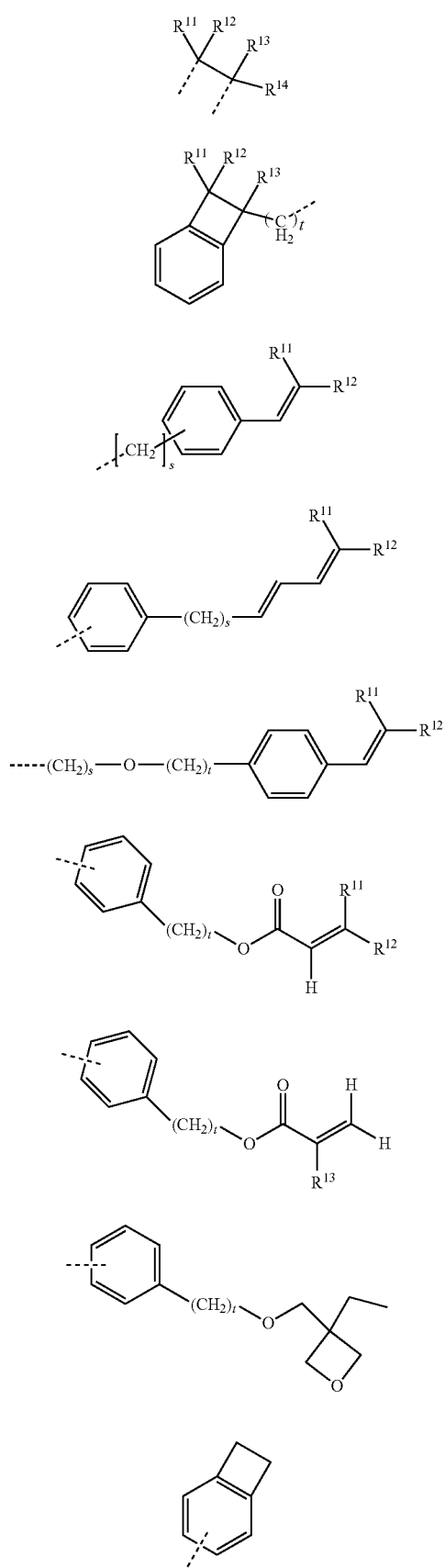
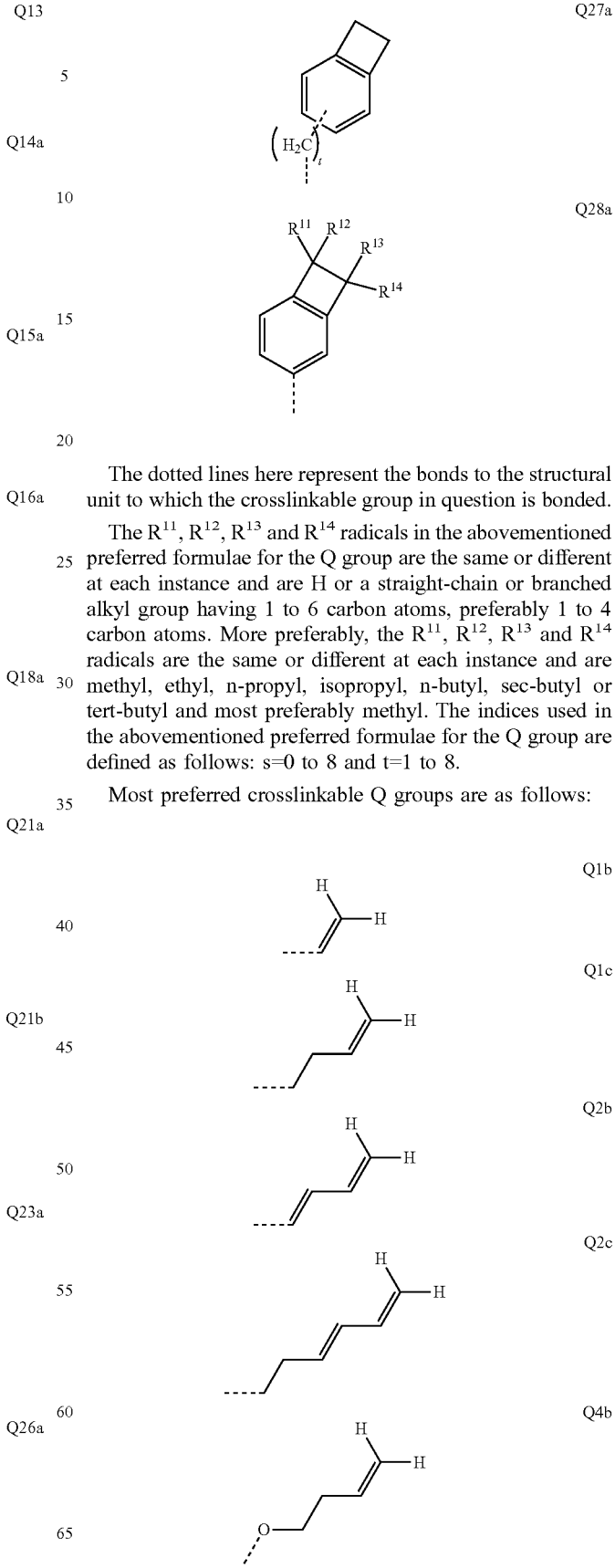

The dotted lines here represent the bonds to the structural unit to which the crosslinkable group in question is bonded.

The $R^{11}$, $R^{12}$, $R^{13}$ and $R^{14}$ radicals in the abovementioned preferred formulae for the Q group are the same or different at each instance and are H or a straight-chain or branched alkyl group having 1 to 6 carbon atoms, preferably 1 to 4 carbon atoms. More preferably, the $R^{11}$, $R^{12}$, $R^{13}$ and $R^{14}$ radicals are the same or different at each instance and are methyl, ethyl, n-propyl, isopropyl, n-butyl, sec-butyl or tert-butyl and most preferably methyl. The indices used in the abovementioned preferred formulae for the Q group are defined as follows: s=0 to 8 and t=1 to 8.

Most preferred crosslinkable Q groups are as follows:

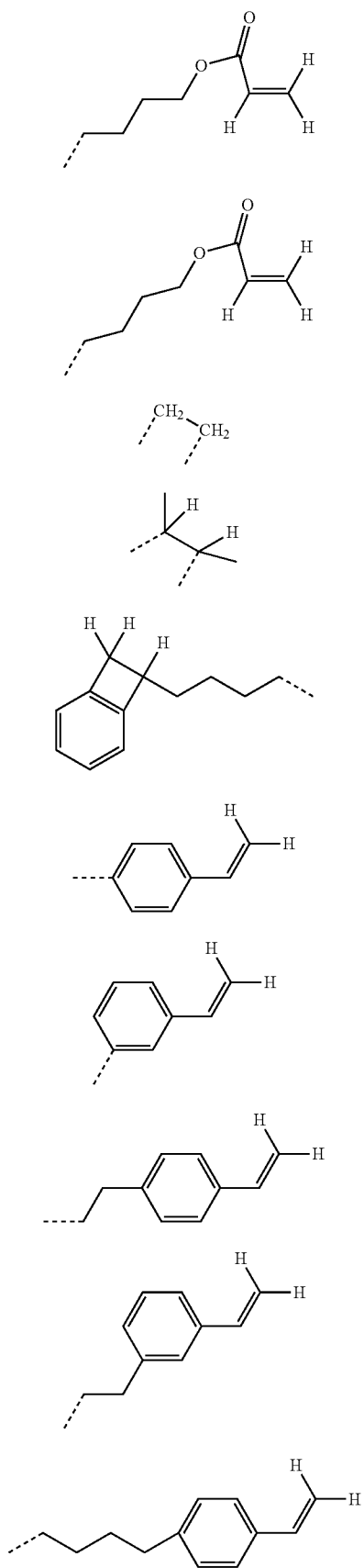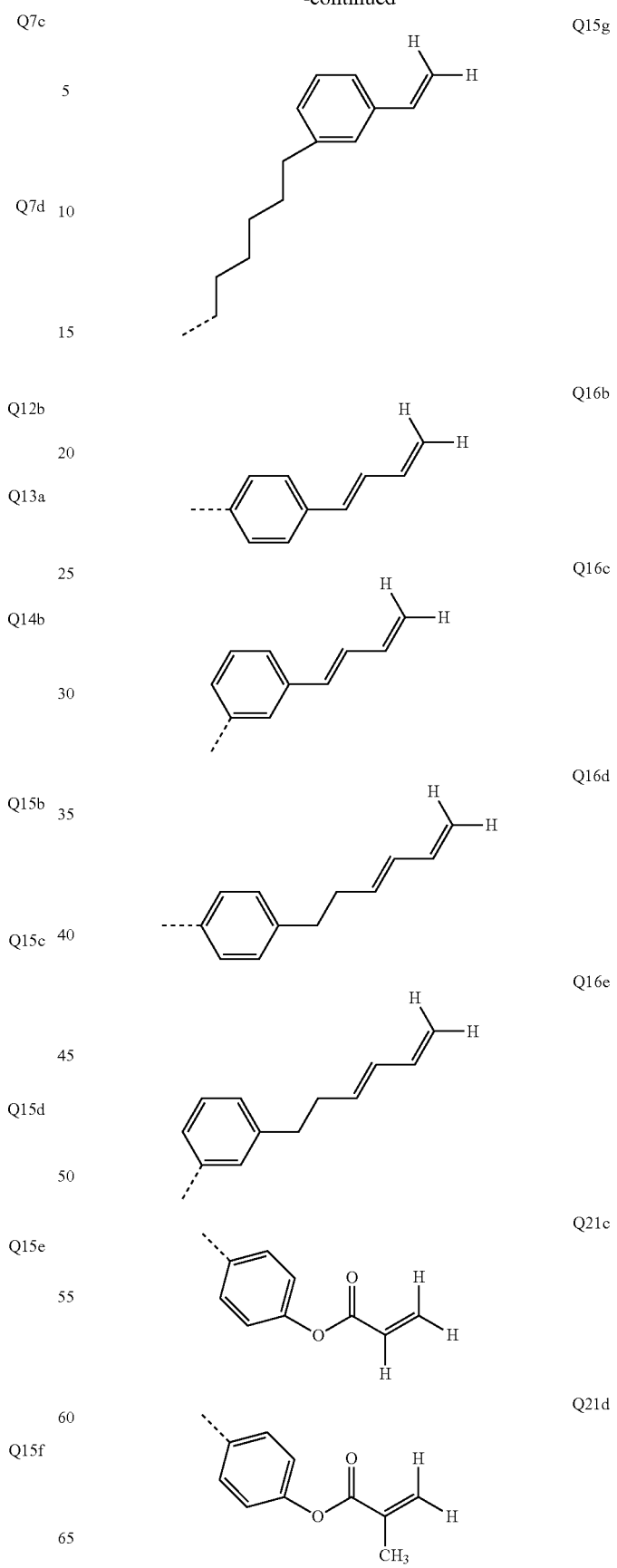

-continued

Q26b

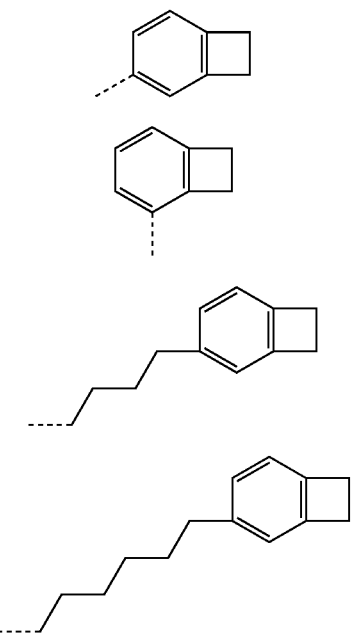

Q26c

Q27b

Q27c

The dotted lines here represent the bonds to the structural unit to which the crosslinkable group in question is bonded.

Preferred structural units that bear a Q group are selected from structural units of the formula (I) defined above. Corresponding structural units are described by the formula (I-Q), where the number of Q groups per structural unit is not limited, but is preferably 1 or 2, more preferably 1, where Q is as defined above, where "formula (I)" represents a unit of the formula (I) as defined above:

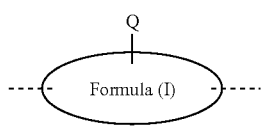

Formula (I-Q)

The Q groups here, and generally with preference hereinafter, are preferably selected from the above-specified preferred embodiments of the Q groups.

Particularly preferred structural units of the formula (I-Q) conform to the formula (I-1-Q), where the number of Q groups per structural unit is not limited, but is preferably 1 or 2, more preferably 1, where Q is as defined above, and where "formula (I-1)" represents a unit of the formula (I-1) as defined above:

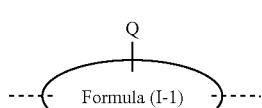

Formula (I-1-Q)

Very particularly preferred embodiments of the formula (I-1-Q) conform to the formula (I-1-A-Q-1) or (I-1-A-Q-2)

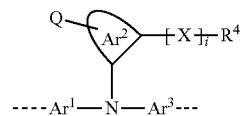

Formula (I-1-A-Q-1)

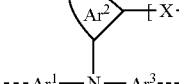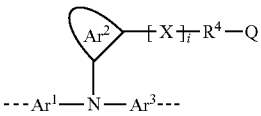

Formula (I-1-A-Q-2)

where the groups that occur are as defined for formula (I-1-A), and where Q is as defined above, and preferably corresponds to the preferred embodiments specified above.

Very particularly preferred embodiments of the formula (I-1-Q) conform to one of the formulae (I-1-B-Q-1), (I-1-B-Q-2), (I-1-B-Q-3) and (I-1-B-Q-4)

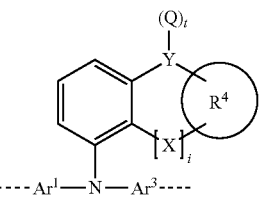

Formula (I-1-B-Q-1)

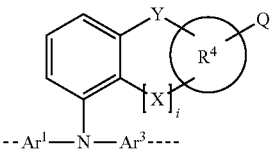

Formula (I-1-B-Q-2)

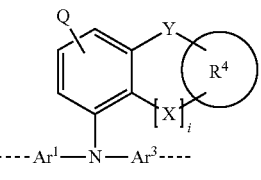

Formula (I-1-B-Q-3)

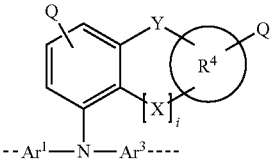

Formula (I-1-B-Q-4)

where the groups that occur are as defined for formula (I-1-B), and where Q is as defined above, and preferably corresponds to the preferred embodiments specified above, and where t, according to the valency of the Y group, is 0, 1 or 2.

Particularly preferred structural units of the formula (I-Q) conform to the formula (I-2-Q) which is defined according to formula (I-Q):

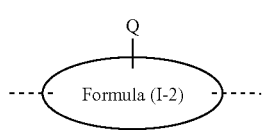

Formula (I-2-Q)

Very particularly preferred embodiments of the formula (I-2-Q) conform to the formula (I-2-A-Q-1) or (I-2-A-Q-1)

Formula (I-2-A-Q-1)

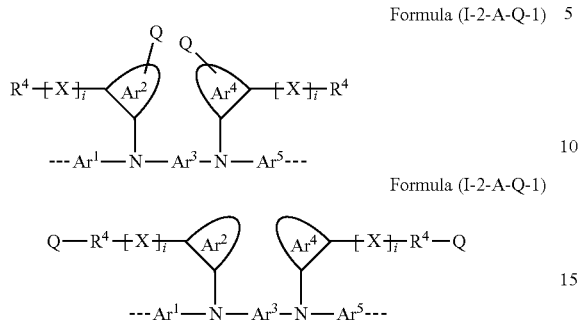

Formula (I-2-A-Q-1)

where the groups that occur are as defined for formula (I-2-A), and where Q is as defined above, and preferably corresponds to the preferred embodiments specified above.

Very particularly preferred embodiments of the formula (I-2-Q) conform to the formula (I-2-B-3-Q-1), (I-2-B-3-Q-2) or (I-2-B-3-Q-3)

Formula (I-2-B-3-Q-1)

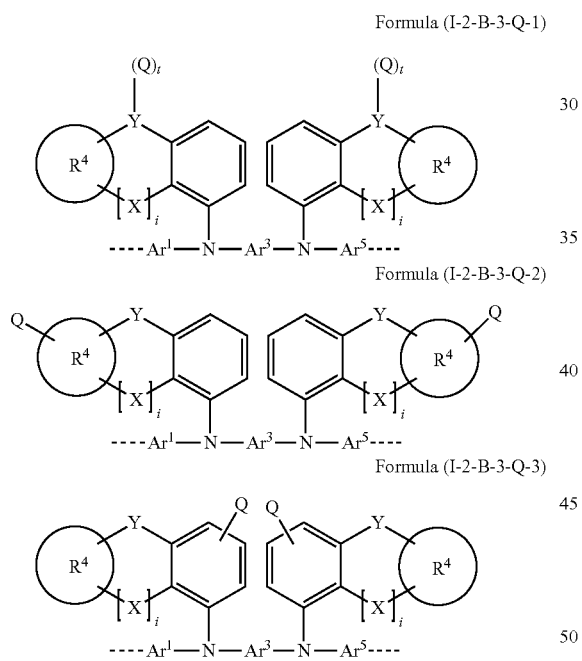

Formula (I-2-B-3-Q-2)

Formula (I-2-B-3-Q-3)

where the groups that occur are as defined for formula (I-2-B-3), and where Q is as defined above, and preferably corresponds to the preferred embodiments specified above, and where t, according to the valency of the Y group, is 0, 1 or 2.

Very particularly preferred structural units of the formula (I-Q) are the structural units (11a) to (11f) and (11g) to (11o) depicted in the tables on pages 30 and 32 of WO 2013/156130, where R is to be replaced by $R^1$ or $R^2$, and k, m, n and p indicate the number of substituents possible in each ring in question.

Preferred structural units that bear a Q group are selected from structural units of the formula (II-A) defined above. Corresponding structural units are described by the formula (II-A-Q), where the number of Q groups per structural unit is not limited, but is preferably 1 or 2, more preferably 1, where Q is as defined above, where "formula (II-A)" represents a unit of the formula (II-A) as defined above:

Formula (II-A-Q)

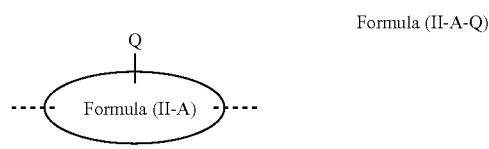

Particularly preferred structural units of the formula (II-A-Q) conform to the formula (II-A-1-Q), where the number of Q groups per structural unit is not limited, but is preferably 1 or 2, more preferably 1, where Q is as defined above, where "formula (II-A-1)" represents a unit of the formula (II-A-1) as defined above:

Formula (II-A-1-Q)

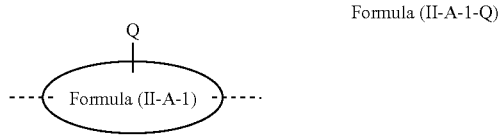

Very particularly preferred embodiments of the formula (II-A-1-Q) conform to one of the formulae (II-A-1-Q-1), (II-A-1-Q-2) and (II-A-1-Q-3)

Formula (II-A-1-Q-1)

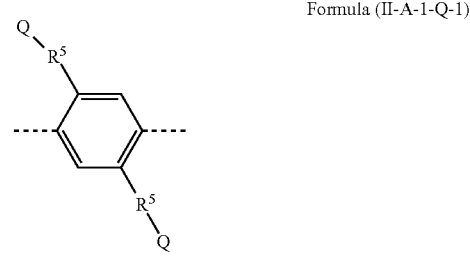

Formula (II-A-1-Q-2)

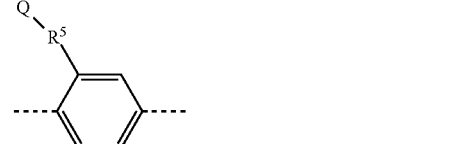

Formula (II-A-1-Q-3)

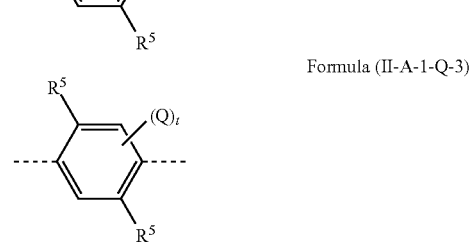

where the groups that occur are as defined for formula (II-A-1), and where Q is as defined above, and preferably corresponds to the preferred embodiments specified above, and where t is 1 or 2.

Preferred structural units that bear a Q group are selected from structural units of the formula (II-B) defined above. Corresponding structural units are described by the formula (II-B-Q), where the number of Q groups per structural unit is not limited, but is preferably 1 or 2, more preferably 1, where Q is as defined above, where "formula (II-B)" represents a unit of the formula II-B) as defined above:

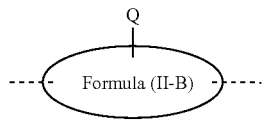
Formula (II-B)

Very particularly preferred embodiments of the formula (II-B-Q) conform to one of the formulae (II-B-Q-1), (II-B-Q-2) and (II-B-Q-3)

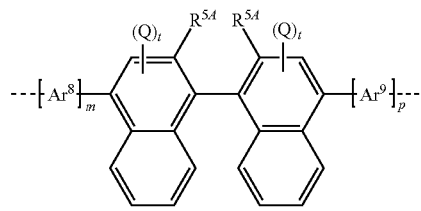
Formula (II-B-Q-1)

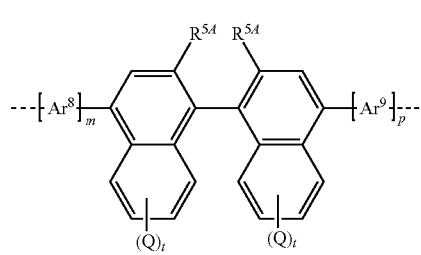
Formula (II-B-Q-2)

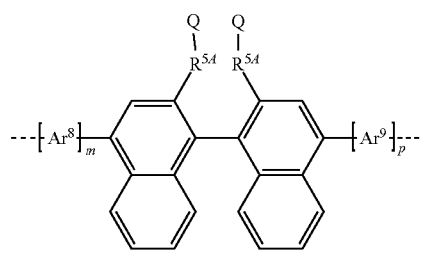
Formula (II-B-Q-3)

where the groups that occur are as defined for formula (II-B), and where Q is as defined above, and preferably corresponds to the preferred embodiments specified above, and where t is 1 up to a maximum of the number of free bonding positions in the ring in question.

Preferred structural units that bear a Q group are selected from structural units of the formula (II-C) defined above. Corresponding structural units are described by the formula (II-C-Q), where the number of Q groups per structural unit is not limited, but is preferably 1 or 2, more preferably 1, where Q is as defined above, where "formula (II-C)" represents a unit of the formula (II-C) as defined above:

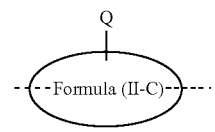
Formula (II-C-Q)

Particularly preferred structural units of the formula (II-C-Q) conform to the formula (II-C-1-Q) which is defined according to formula (II-C-Q):

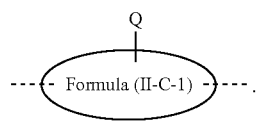
Formula (II-C-1-Q)

Very particularly preferred embodiments of the formula (I-C-1-Q) conform to the formula (II-C-1-Q-1)

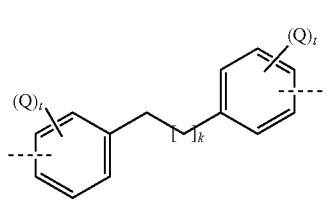
Formula (II-C-1-Q-1)

where the groups that occur are as defined for formula (II-C-1), and where Q is as defined above, and preferably corresponds to the preferred embodiments specified above, and where t is 0 up to a maximum of the number of free bonding positions in the ring in question, where not all t are 0.

Further preferred embodiments of structural units containing a Q group are the structural units of the formulae (Ill-Q-1) and (Ill-Q-2) shown below

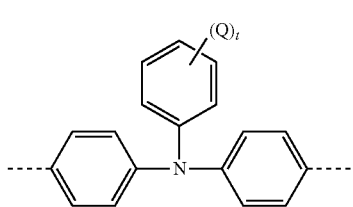
Formula (III-Q-1)

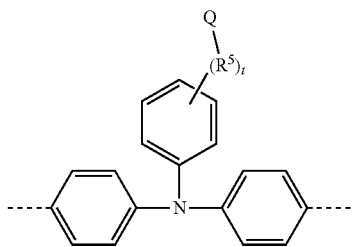
Formula (III-Q-2)

where the benzene rings may each be substituted at the unoccupied positions by an $R^5$ radical, as defined above, and where t has a value of 1 to 5 and is preferably 1 or 2, more preferably 1.

Further preferred embodiments of structural units containing a Q group are the structural units of the formulae (IV-Q-1) to (IV-Q-3) shown below

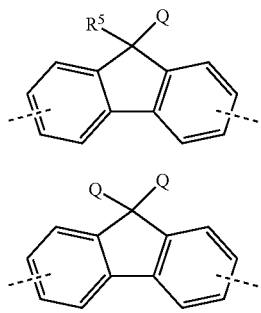

Formula (IV-Q-1)

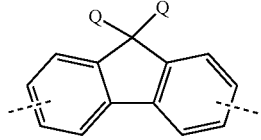

Formula (IV-Q-2)

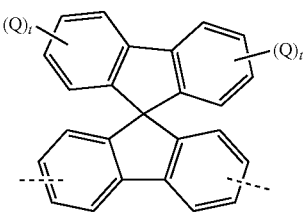

Formula (IV-Q-3)

where the benzene rings may each be substituted at the unoccupied positions by an $R^5$ radical, as defined above, and where t has a value of 1 to 5 and is preferably 1 or 2, more preferably 1.

Preferred specific embodiments of structural units containing one or more Q groups are shown in the following table:

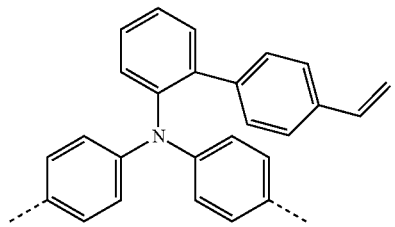

SE-Q-1

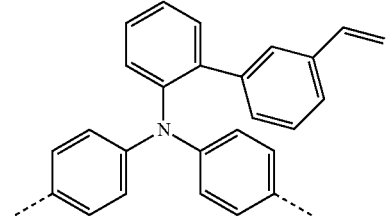

SE-Q-2

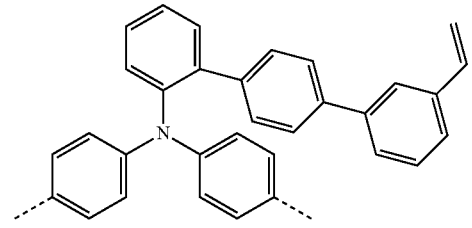

SE-Q-3

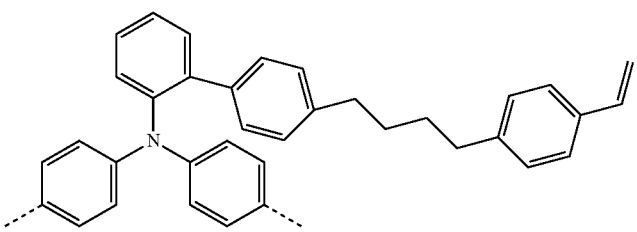

SE-Q-4

-continued
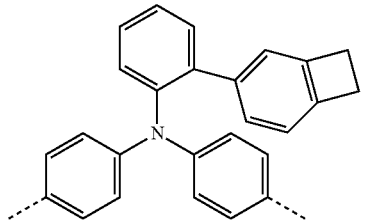
SE-Q-5
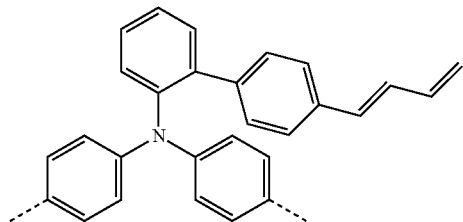
SE-Q-6
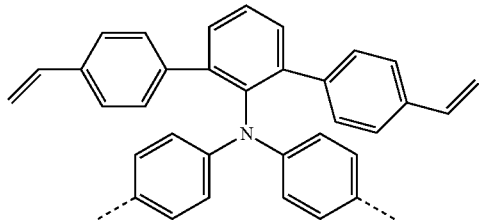
SE-Q-7
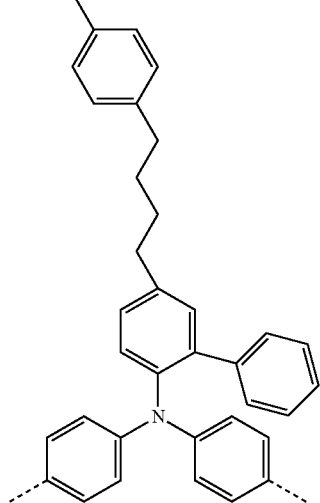
SE-Q-8
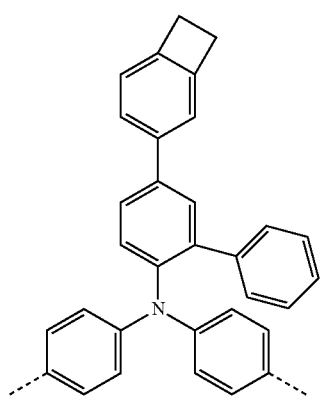
SE-Q-9

-continued
SE-Q-10
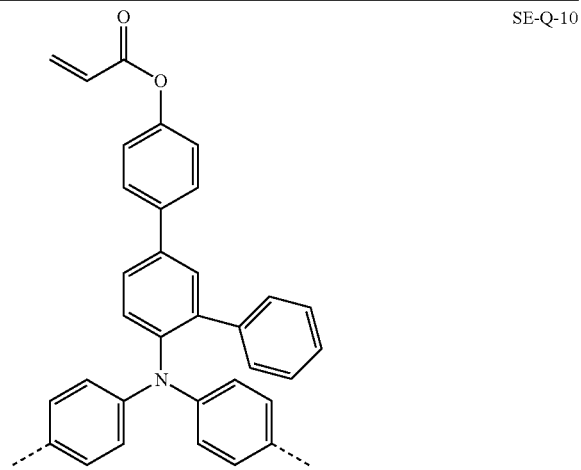
SE-Q-11
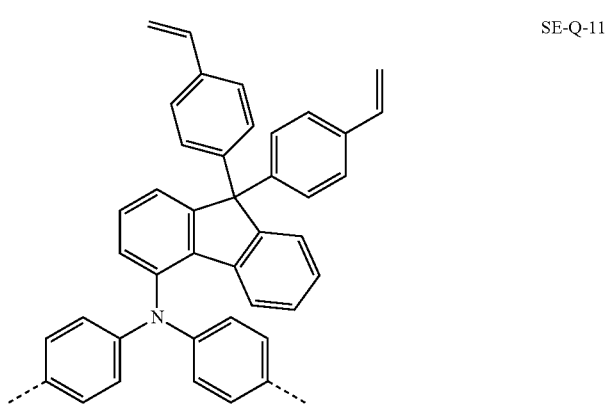
SE-Q-12
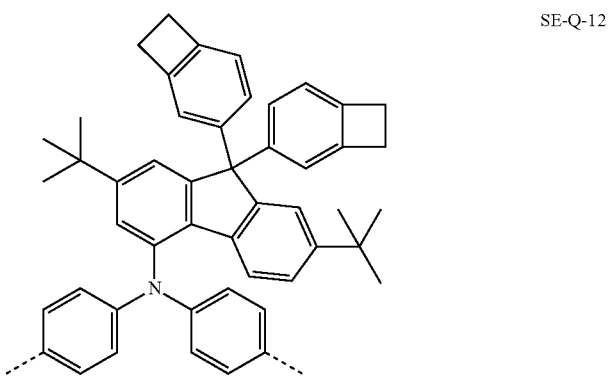
SE-Q-13
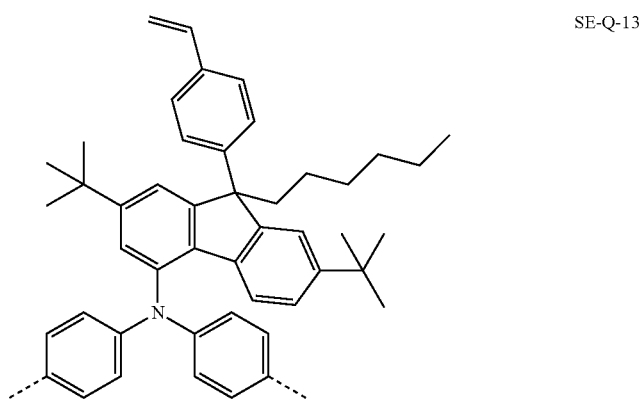

SE-Q-14
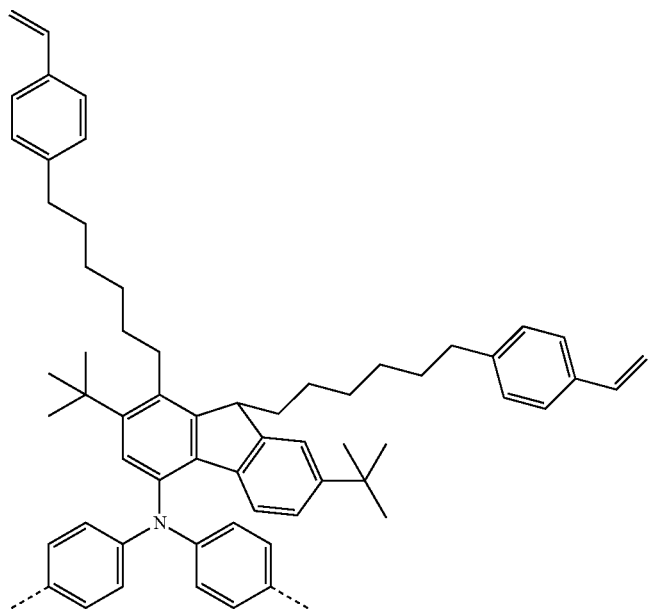
SE-Q-15
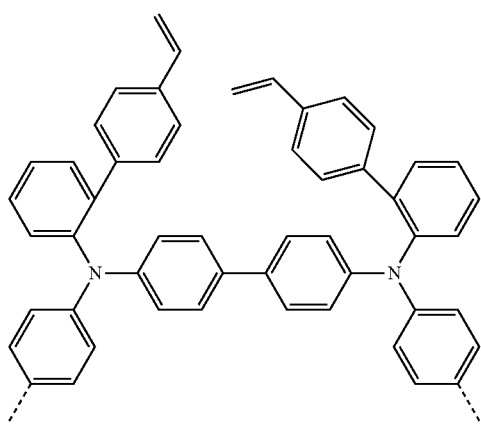
SE-Q-16
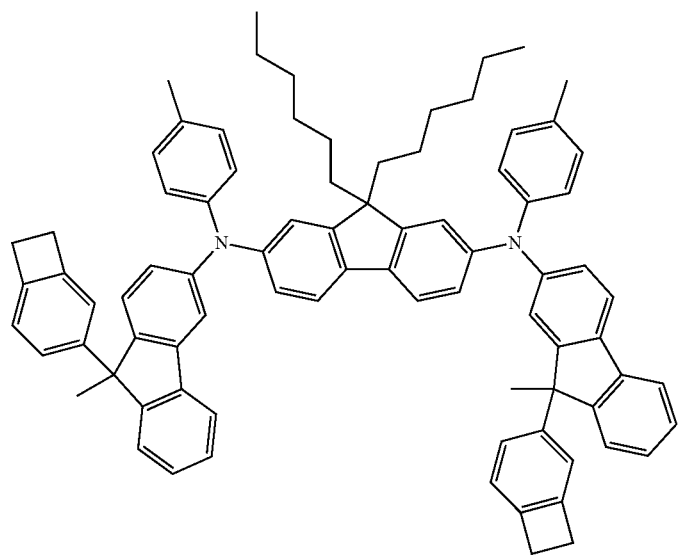 [SMILES: CCCCCCC1(CCCCCC)c2cc(N(c3ccc(C)cc3)c3ccc4c(c3)-c3ccccc3C4(C)c3ccc4c(c3)CC4)ccc2-c2ccc(N(c3ccc(C)cc3)c3ccc4c(c3)C(C)(c3ccc5c(c3)CC5)c3ccccc3-4)cc21]

-continued
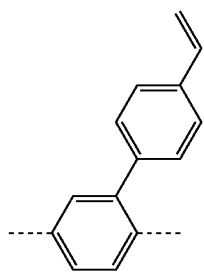
SE-Q-17
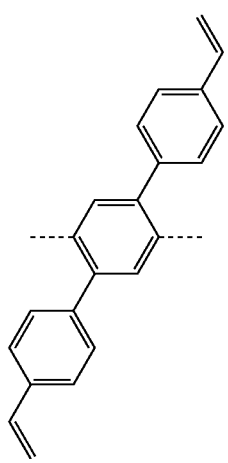
SE-Q-18
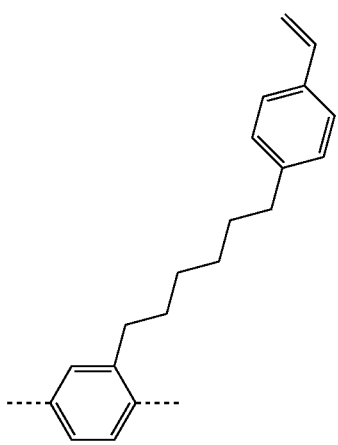
SE-Q-19

-continued
SE-Q-20
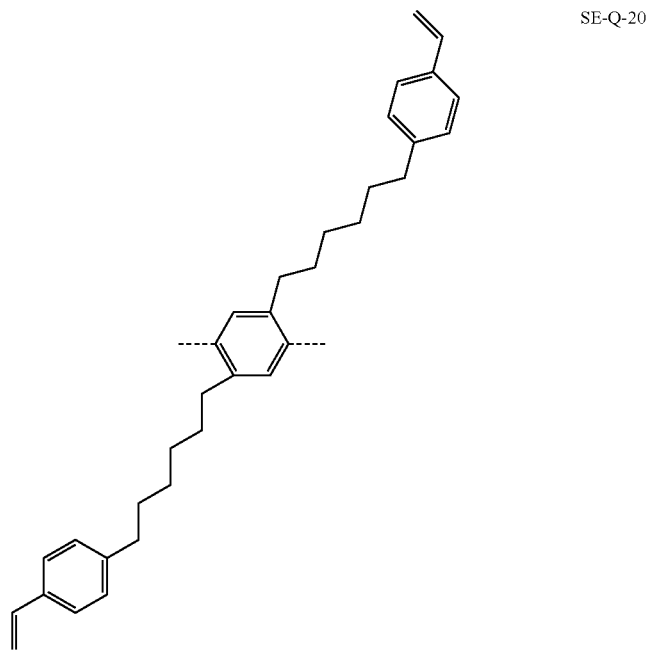
SE-Q-21
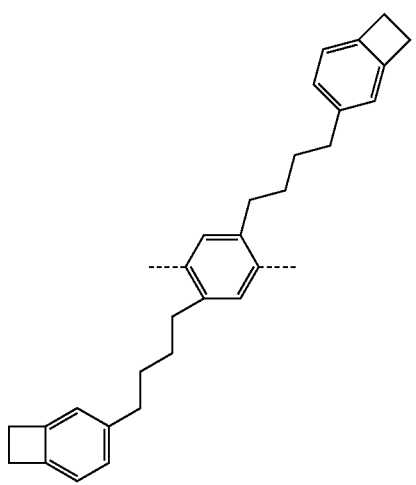
SE-Q-22
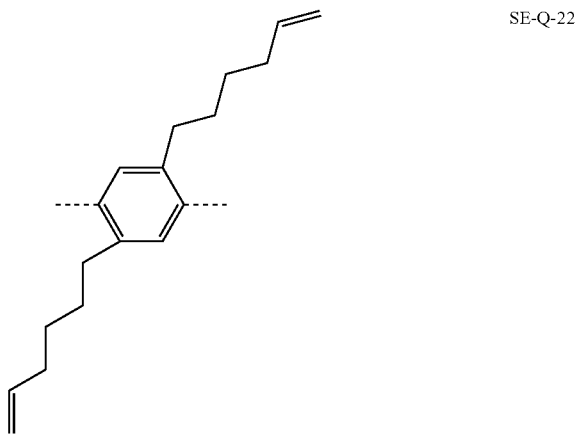

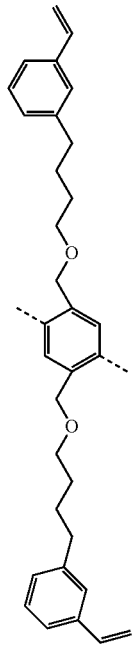
SE-Q-23
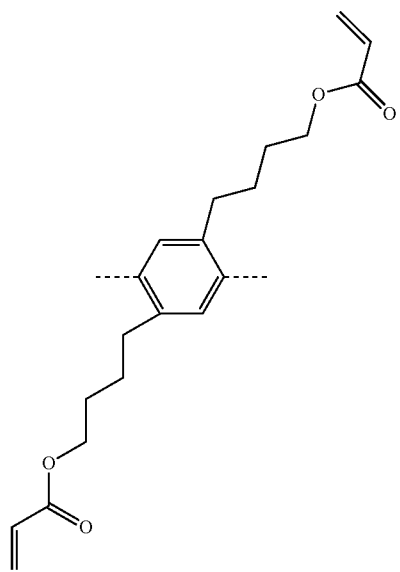
SE-Q-24

SE-Q-25
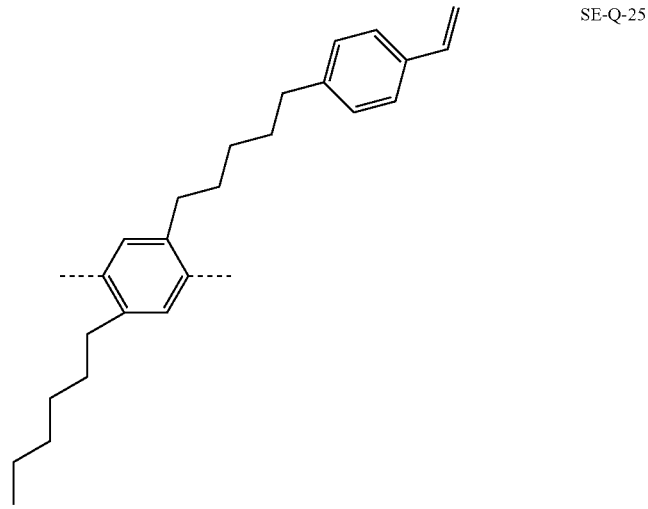
SE-Q-26
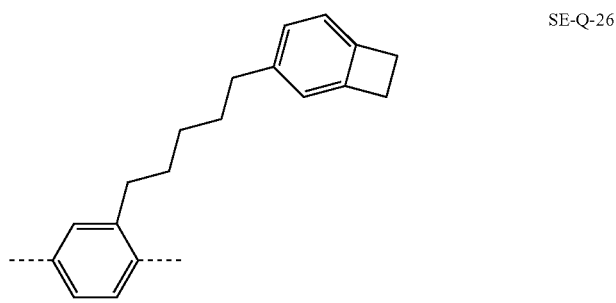
SE-Q-27
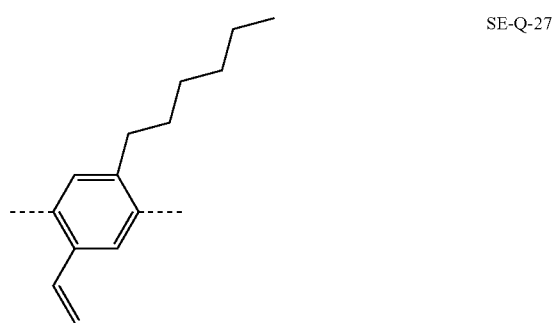
SE-Q-28
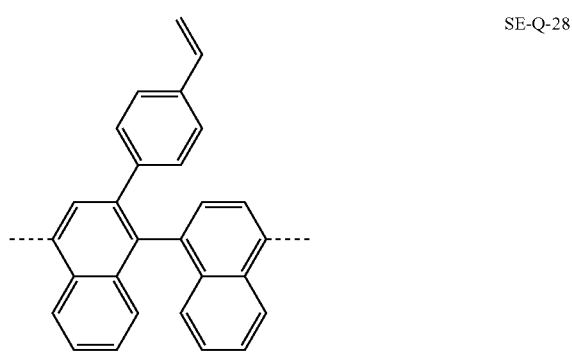

-continued
SE-Q-29
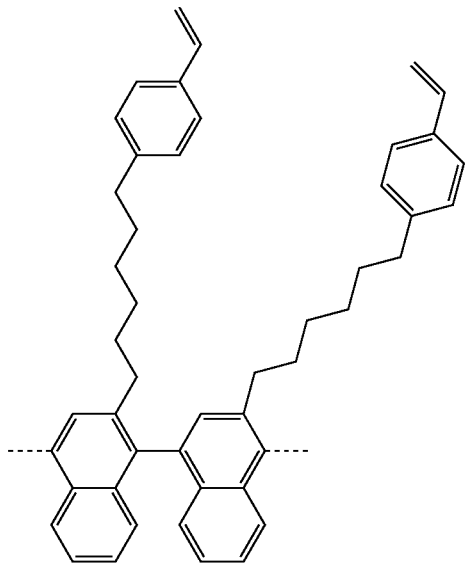
SE-Q-30
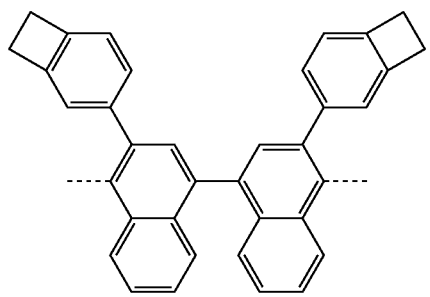
SE-Q-31
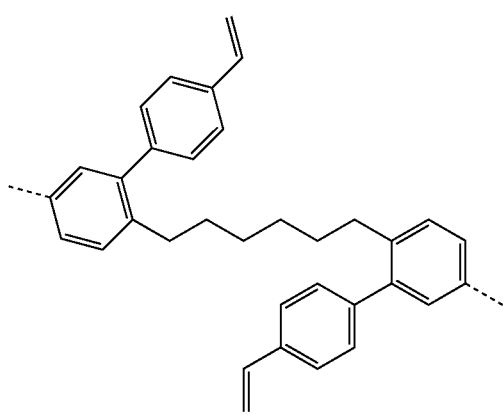

-continued
SE-Q-32
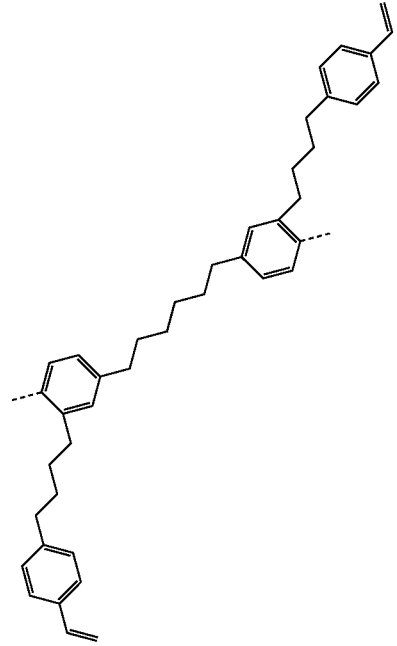
SE-Q-33
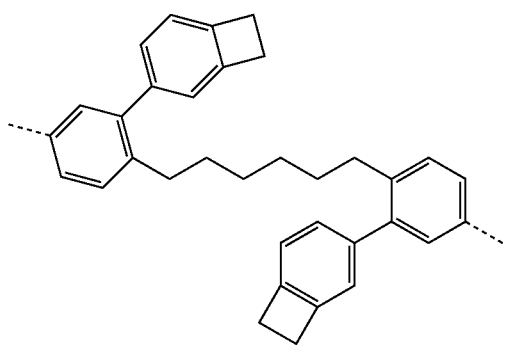
SE-Q-34
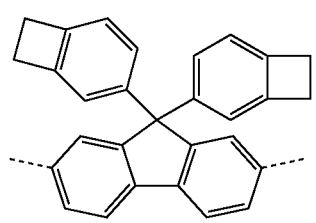
SE-Q-35
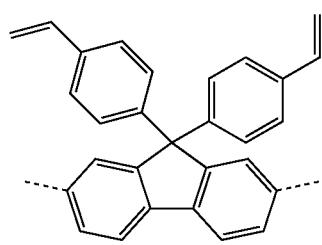

-continued
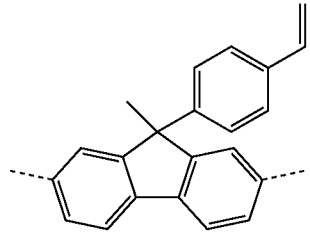
SE-Q-36
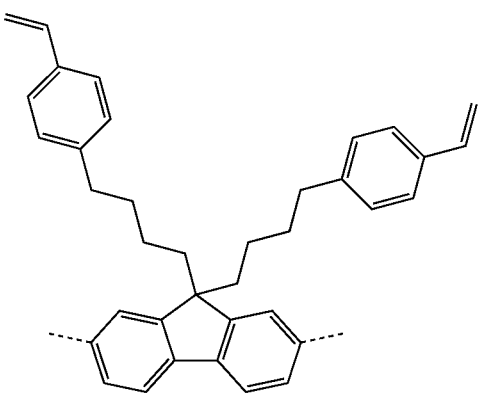
SE-Q-37
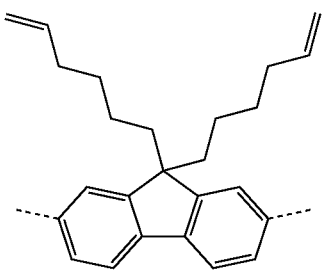
SE-Q-38
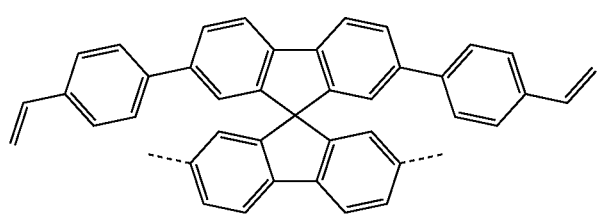
SE-Q-39
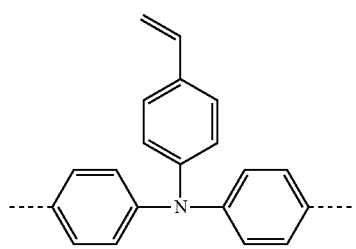
SE-Q-40
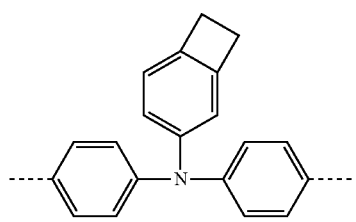
SE-Q-41

-continued

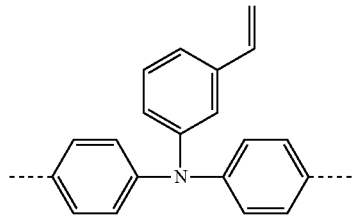
SE-Q-42

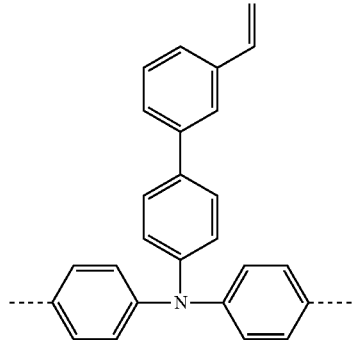
SE-Q-43

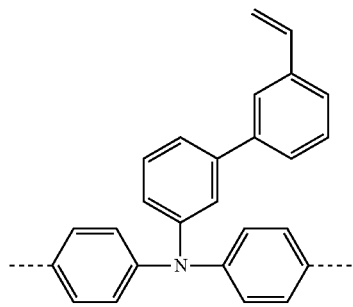
SE-Q-44

The proportion of crosslinkable structural units in the polymer is in the range from 1 to 50 mol %, preferably in the range from 2 to 40 mol %, more preferably in the range from 5 to 30 mol %, based on 100 mol % of all the copolymerized monomers present as structural units in the polymer.

In addition to structural units of the formula (I), structural units A, B and C, and crosslinkable structural units, the polymer may also contain further structural units.

The further structural units may come, for example, from the following classes:
Group 1: units which influence the hole injection and/or hole transport properties of the polymers;
Group 2: units which influence the electron injection and/or electron transport properties of the polymers;
Group 3: units having combinations of individual units of group 1 and group 2;
Group 4: units which are typically used as polymer backbone;
Group 5: units which affect the film morphology and/or the rheological properties of the resulting polymers.

Structural units from group 1 having hole injection and/or hole transport properties are, for example, triarylamine, benzidine, tetraaryl-para-phenylenediamine, triarylphosphine, phenothiazine, phenoxazine, dihydrophenazine, thianthrene, dibenzo-para-dioxin, phenoxathiine, carbazole, azulene, thiophene, pyrrole and furan derivatives and further O-, S- or N-containing heterocycles.

Structural units from group 2 having electron injection and/or electron transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles.

It may be preferable when the polymers of the invention contain units from group 3 in which structures which increase hole mobility and which increase electron mobility (i.e. units from group 1 and 2) are bonded directly to one another, or structures which increase both hole mobility and electron mobility are present. Some of these units may serve as emitters and shift the emission colour into the green, yellow or red. The use thereof is thus suitable, for example, for the creation of other emission colours from originally blue-emitting polymers.

Structural units of group 4 are units including aromatic structures having 6 to 40 carbon atoms, which are typically used as the polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzooxepine derivatives and cis- and trans-indenofluorene derivatives, but also 1,2-, 1,3- or 1,4-phenylene, 1,2-, 1,3- or 1,4-naphthylene, 2,2'-, 3,3'- or 4,4'-biphenylylene, 2,2"-, 3,3"- or 4,4"-terphenylylene, 2,2'-, 3,3'- or 4,4'-bi-1,1'-naphthylylene or 2,2'''-, 3,3'''- or 4,4'''-quaterphenylylene derivatives.

Structural units of group 5 are those which affect the film morphology and/or the rheological properties of the polymers, for example siloxanes, alkyl chains or fluorinated groups, but also particularly stiff or flexible units, liquid crystal-forming units or crosslinkable groups.

In the present application, the term "polymer" is understood to mean polymeric compounds, oligomeric compounds and dendrimers. The polymeric compounds according to the invention have preferably 10 to 10 000, more preferably 10 to 5000 and most preferably 10 to 2000 structural units. The inventive oligomeric compounds preferably have 3 to 9 structural units. The branching factor of the polymers is between 0 (linear polymer, no branching sites) and 1 (fully branched dendrimer).

The polymers of the invention preferably have a molecular weight $M_w$ in the range from 1000 to 2 000 000 g/mol, more preferably a molecular weight $M_w$ in the range from 10 000 to 1 500 000 g/mol and most preferably a molecular weight $M_w$ in the range from 20 000 to 250 000 g/mol. The molecular weight $M_w$ is determined by means of GPC (=gel permeation chromatography) against an internal polystyrene standard.

The polymers of the invention preferably have a polydispersity of 1 to 15, more preferably of 2 to 8. The polydispersity is measured here by means of gel permeation chromatography against an internal polystyrene standard.

The polymers of the invention may be linear or branched; they are preferably linear. The polymers of the invention may have random, alternating or block structures, or else have two or more of these structures in alternation. More preferably, the polymers of the invention have random or alternating structures. More preferably, the polymers are random or alternating polymers. The way in which polymers having block structures are obtainable and which further structural elements are particularly preferred for the purpose is described in detail, for example, in WO 2005/014688 A2. This is incorporated into the present application by reference. It should likewise be emphasized once again at this point that the polymer may also have dendritic structures.

The polymers of the invention containing structural units of the abovementioned formulae are generally prepared by polymerization of corresponding monomers. In each case, a particular monomer leads to a particular structural unit. Suitable polymerization reactions are known to those skilled in the art and are described in the literature. Particularly suitable and preferred polymerization reactions which lead to C—C and C—N couplings are as follows:
(A) SUZUKI polymerization;
(B) YAMAMOTO polymerization;
(C) STILLE polymerization;
(D) HECK polymerization;
(E) NEGISHI polymerization;
(F) SONOGASHIRA polymerization;
(G) HIYAMA polymerization; and
(H) HARTWIG-BUCHWALD polymerization.

How the polymerization can be conducted by these methods and how the polymers can then be separated from the reaction medium and purified is known to those skilled in the art and is described in detail in the literature, for example in WO 03/048225 A2, WO 2004/037887 A2 and WO 2004/037887 A2.

The C—C couplings are preferably selected from the groups of SUZUKI coupling, YAMAMOTO coupling and STILLE coupling, more preferably the SUZUKI coupling; the C—N coupling is preferably a HARTWIG-BUCHWALD coupling.

The present invention thus also provides a process for preparing the polymers of the invention, which is characterized in that they are prepared by SUZUKI polymerization, YAMAMOTO polymerization, STILLE polymerization or HARTWIG-BUCHWALD polymerization, preferably by SUZUKI polymerization.

Synthesis of the polymers of the invention requires monomers selected from monomers of the formulae (M-I), (M-II-A), (M-II-B) and (M-II-C)

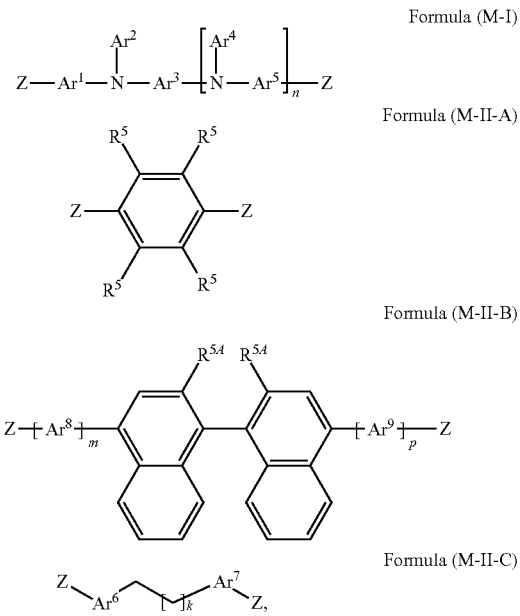

where the variables that occur are as defined above, and where Z is the same or different at each instance and is a leaving group suitable for a polymerization reaction. Preferably, Z is the same or different at each instance and is selected from halogens, preferably chlorine, bromine or iodine, O-tosylates, O-triflates, O-sulfonates, boronic acid, boronic esters, partly fluorinated silyl groups, diazonium groups and organotin compounds. More preferably, Z is the same or different at each instance and is selected from halogens, preferably chlorine, bromine or iodine, boronic acid and boronic esters.

Preparation of the polymer of the invention in each case requires at least one monomer of formula (M-I) and at least one further monomer selected from monomers of the formulae (M-II-A), (M-II-B) and (M-II-C).

The present invention therefore likewise provides a mixture comprising at least one monomer of formula (M-I) and at least one further monomer selected from monomers of the formulae (M-II-A), (M-II-B) and (M-II-C).

The polymers of the invention can be used as a neat substance, or else as a mixture together with any further polymeric, oligomeric, dendritic or low molecular weight substances. A low molecular weight substance is understood in the present invention to mean compounds having a molecular weight in the range from 100 to 3000 g/mol, preferably 200 to 2000 g/mol. These further substances can, for example, improve the electronic properties or emit themselves. A mixture refers above and below to a mixture comprising at least one polymeric component. In this way, it is possible to produce one or more polymer layers consisting of a mixture (blend) of one or more polymers of the invention and optionally one or more further polymers with one or more low molecular weight substances.

The present invention thus further provides a mixture comprising one or more polymers of the invention, and one or more further polymeric, oligomeric, dendritic and/or low molecular weight substances.

In a preferred embodiment of the invention, the polymer is used in a layer mixed with a p-doping salt. This layer can be applied using, for example, a solution in toluene in which the polymer and the p-doping salt are dissolved. Corresponding p-doping salts are described in WO 2016/107668, WO 2013/081052 and EP2325190.

The invention further provides solutions and formulations comprising one or more polymers of the invention and one or more solvents. The way in which such solutions can be prepared is known to those skilled in the art and is described, for example, in WO 2002/072714 A1, WO 2003/019694 A2 and the literature cited therein.

These solutions can be used in order to produce thin polymer layers, for example by surface coating methods (e.g. spin-coating) or by printing methods (e.g. inkjet printing).

Polymers containing structural units having a crosslinkable Q group are particularly suitable for producing films or coatings, especially for producing structured coatings, for example by thermal or light-induced in situ polymerization and in situ crosslinking, for example in situ UV photopolymerization or photopatterning. It is possible here to use either corresponding polymers in pure form or else formulations or mixtures of these polymers as described above. These can be used with or without addition of solvents and/or binders. Suitable materials, processes and apparatuses for the above-described methods are described, for example, in WO 2005/083812 A2. Possible binders are, for example, polystyrene, polycarbonate, poly(meth)acrylates, polyacrylates, polyvinyl butyral and similar optoelectronically neutral polymers.

Suitable and preferred solvents are, for example, toluene, anisole, o-, m- or p-xylene, methyl benzoate, mesitylene, tetralin, veratrole, THF, methyl-THF, THP, chlorobenzene, dioxane, phenoxytoluene, especially 3-phenoxytoluene, (−)-fenchone, 1,2,3,5-tetramethylbenzene, 1,2,4,5-tetramethylbenzene, 1-methylnaphthalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents.

The present invention further provides for the use of a polymer containing structural units having a crosslinkable Q group for preparation of a crosslinked polymer. The crosslinkable group, which is more preferably a vinyl group or alkenyl group, is preferably incorporated into the polymer by the WITTIG reaction or a WITTIG-like reaction. If the crosslinkable group is a vinyl group or alkenyl group, the crosslinking can take place via free-radical or ionic polymerization, which can be induced thermally or by radiation. Preference is given to free-radical polymerization which is induced thermally, preferably at temperatures of less than 250° C., more preferably at temperatures of less than 200° C.

Optionally, during the crosslinking process, an additional styrene monomer is added in order to achieve a higher degree of crosslinking. Preferably, the proportion of the added styrene monomer is in the range from 0.01 to 50 mol %, more preferably 0.1 to 30 mol %, based on 100 mol % of all the copolymerized monomers present as structural units in the polymer.

A process for preparing a crosslinked polymer preferably comprises the following steps:
(a) providing polymers containing structural units having one or more crosslinkable Q groups; and
(b) free-radical or ionic crosslinking, preferably free-radical crosslinking, which can be induced either thermally or by radiation, preferably thermally.

The crosslinked polymers prepared by the process of the invention are insoluble in all standard solvents. In this way, it is possible to produce defined layer thicknesses which are not dissolved or partly dissolved again even by the application of subsequent layers.

The present invention thus also relates to a crosslinked polymer obtainable by the aforementioned process. The crosslinked polymer is—as described above—preferably produced in the form of a crosslinked polymer layer. Because of the insolubility of the crosslinked polymer in all solvents, a further layer can be applied from a solvent to the surface of such a crosslinked polymer layer by the above-described techniques.

The polymers of the invention can be used in electronic or optoelectronic devices or for production thereof.

The present invention thus further provides for the use of the polymers of the invention in electronic or optoelectronic devices, preferably in organic electroluminescent devices (OLEDs), organic field-effect transistors (OFETs), organic integrated circuits (O-ICs), organic thin-film transistors (TFTs), organic solar cells (O-SCs), organic laser diodes (O-laser), organic photovoltaic (OPV) elements or devices or organic photoreceptors (OPCs), more preferably in organic electroluminescent devices (OLEDs), and the abovementioned devices comprising at least one polymer of the invention.

Particular preference is given to the use of the polymers of the invention in an organic electroluminescent device (OLED) comprising anode, cathode and at least one emitting layer, characterized in that at least one organic layer which may be an emitting layer, a hole-transporting layer or another layer comprises at least one polymer of the invention. Preferably, the polymer here is present in a hole-transporting layer.

Apart from cathode, anode, emitting layer and hole-transporting layer, the organic electroluminescent device may also comprise further layers. These are selected, for example, from in each case one or more hole injection layers, hole transport layers, hole blocker layers, electron transport layers, electron injection layers, electron blocker layers, exciton blocker layers, interlayers, charge generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*) and/or organic or inorganic p/n junctions.

The sequence of the layers in the organic electroluminescent device comprising the polymer of the invention is preferably as follows: anode-hole injection layer-hole transport layer-optionally further hole transport layer(s)-emitting layer-optionally hole blocker layer-electron transport layer-cathode. It is additionally possible for further layers to be present in the OLED.

Preferred embodiments of OLEDs comprising the polymer of the invention are hybrid devices in which one or more layers which are processed from solution and one or more layers which are produced by vapour deposition of low molecular weight substances are present. These are also referred to as combined PLED/SMOLED (polymeric light emitting diode/small molecule organic light-emitting diode) systems. Preferably, in the device of the invention, the layers between the anode and emitting layer and the emitting layer are applied from solution, and the layers between the emitting layer and cathode are preferably applied by a sublimation method.

The way in which OLEDs can be produced is known to those skilled in the art and is described in detail, for example, as a general process in WO 2004/070772 A2, which has to be adapted appropriately to the individual case.

The polymers of the invention are especially suitable for use in a hole-transporting layer of an OLED. A hole-transporting layer is especially understood here to mean a layer that adjoins the emitting layer on the anode side. Particular preference is given to the use of the polymers of the invention in a hole-transporting layer of an OLED containing a blue-emitting layer which has been applied from solution. This affords OLEDs having a high efficiency and lifetime.

However, the polymers of the invention can also be used in a hole injection layer (HIL), in an electron blocker layer (EBL) and in an emitting layer. When the polymers are used in an emitting layer, they preferably function as a matrix material and especially function as a hole-transporting and/or as a wide-bandgap matrix material. A hole injection layer is especially understood to mean a layer which directly adjoins the anode and is arranged between the anode and a hole transport layer. An electron blocker layer is especially understood to mean a layer which directly adjoins the emitting layer on the anode side and is arranged between the emitting layer and a hole transport layer.

Preferred embodiments of the different functional materials in the electronic device are listed hereinafter.

Preferred fluorescent emitting compounds are selected from the class of the arylamines. An arylamine or an aromatic amine in the context of this invention is understood to mean a compound containing three substituted or unsubstituted aromatic or heteroaromatic ring systems bonded directly to the nitrogen. Preferably, at least one of these aromatic or heteroaromatic ring systems is a fused ring system, more preferably having at least 14 aromatic ring atoms. Preferred examples of these are aromatic anthraceneamines, aromatic anthracenediamines, aromatic pyreneamines, aromatic pyrenediamines, aromatic chryseneamines or aromatic chrysenediamines. An aromatic anthraceneamine is understood to mean a compound in which a diarylamino group is bonded directly to an anthracene group, preferably in the 9 position. An aromatic anthracenediamine is understood to mean a compound in which two diarylamino groups are bonded directly to an anthracene group, preferably in the 9,10 positions. Aromatic pyreneamines, pyrenediamines, chryseneamines and chrysenediamines are defined analogously, where the diarylamino groups are bonded to the pyrene preferably in the 1 position or 1,6 positions. Further preferred emitting compounds are indenofluoreneamines or -diamines, for example according to WO 2006/108497 or WO 2006/122630, benzoindenofluoreneamines or -diamines, for example according to WO 2008/006449, and dibenzoindenofluoreneamines or -diamines, for example according to WO 2007/140847, and the indenofluorene derivatives having fused aryl groups disclosed in WO 2010/012328. Likewise preferred are the pyrenearylamines disclosed in WO 2012/048780 and in WO 2013/185871. Likewise preferred are the benzoindenofluoreneamines disclosed in WO 2014/037077, the benzofluoreneamines disclosed in WO 2014/106522, the extended benzoindenofluorenes disclosed in WO 2014/111269 and in WO 2017/036574, the phenoxazines disclosed in WO 2017/028940 and WO 2017/028941, and the fluorene derivatives bonded to furan units or to thiophene units that are disclosed in WO 2016/150544.

Particular preference is given to the extended benzoindenofluorenes disclosed in WO 2014/111269 for use as fluorescent emitters in the emitting layer.

Preferred fluorescent emitters for use in the emitting layer of devices comprising the polymers of the invention are shown below:

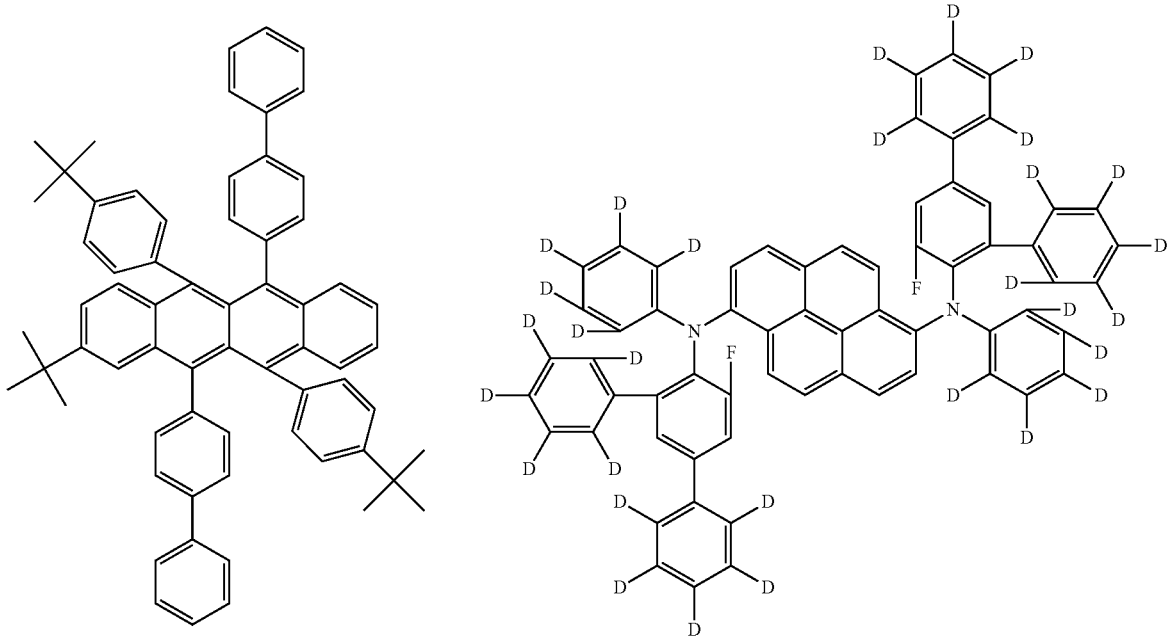

-continued
77
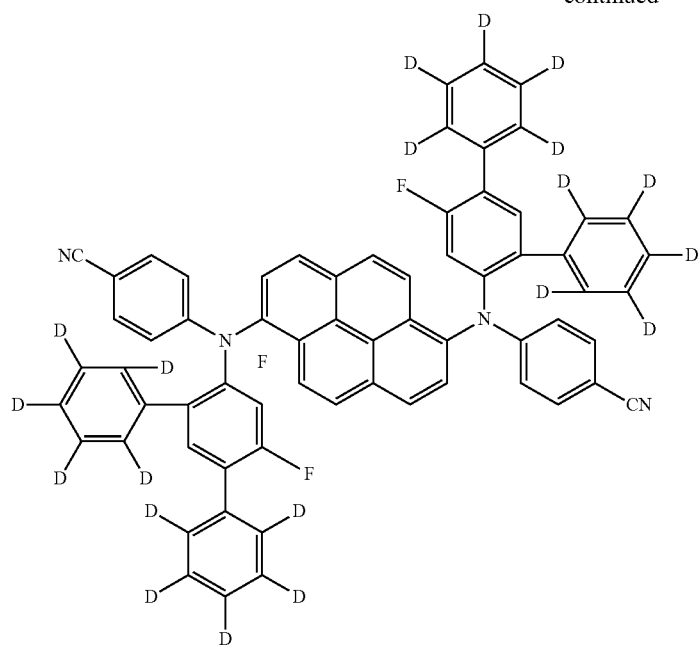
78
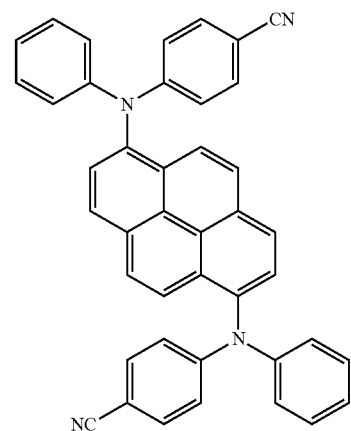
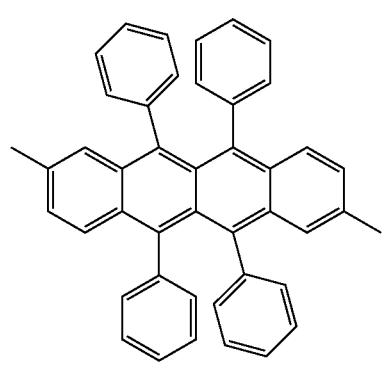
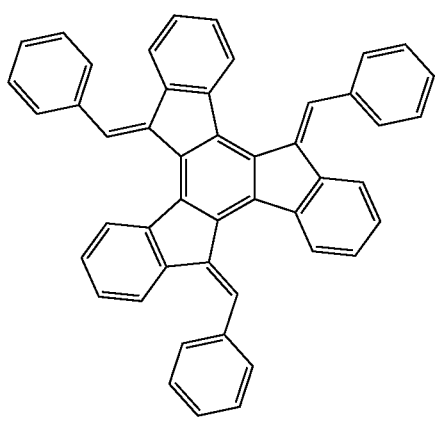
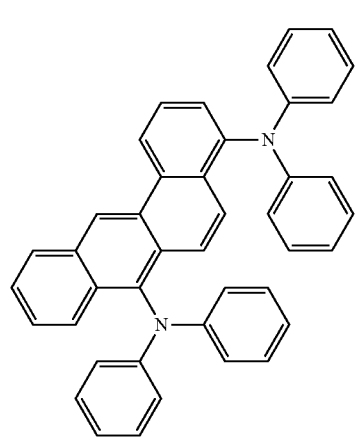
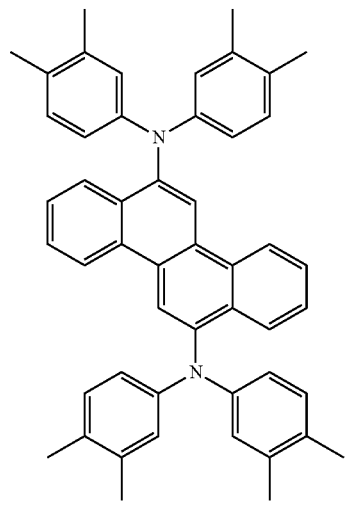

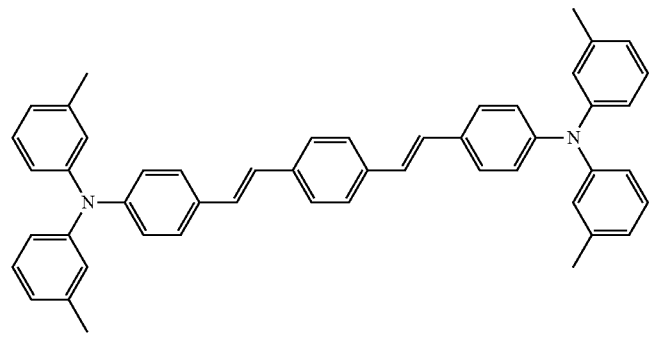
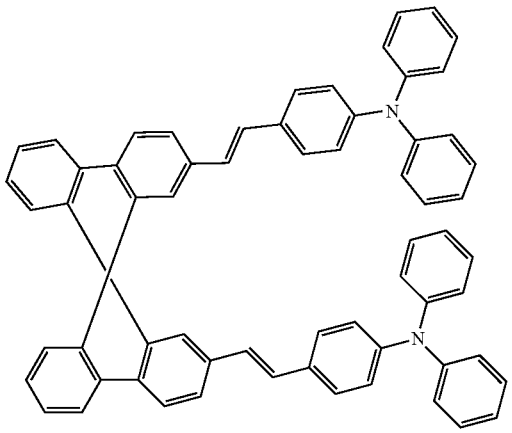
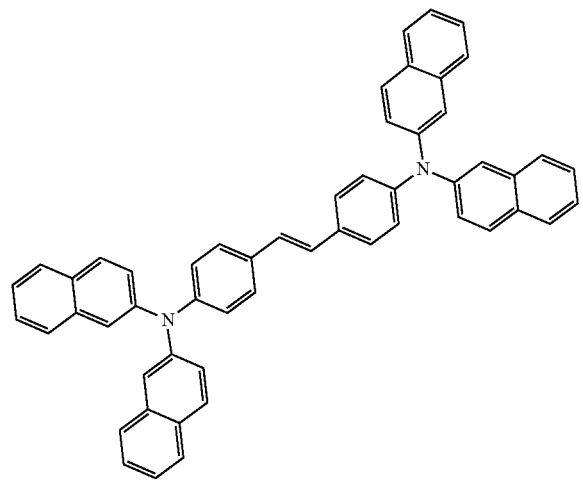
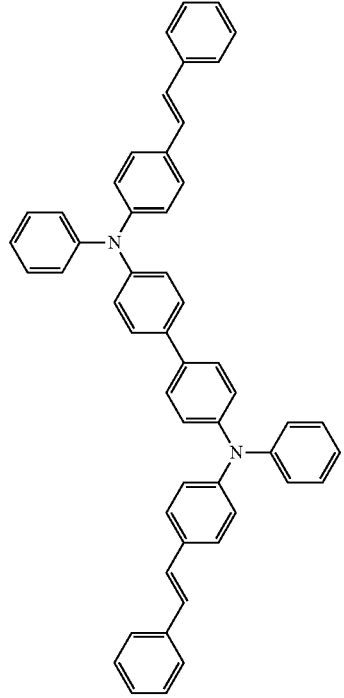
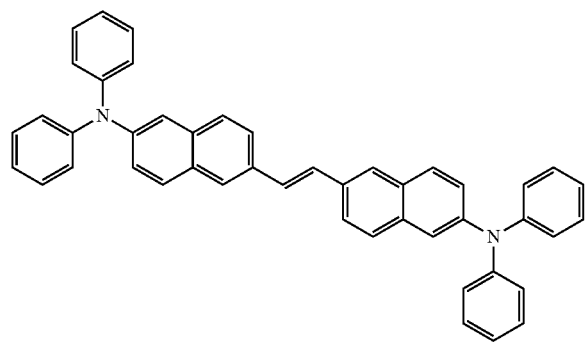
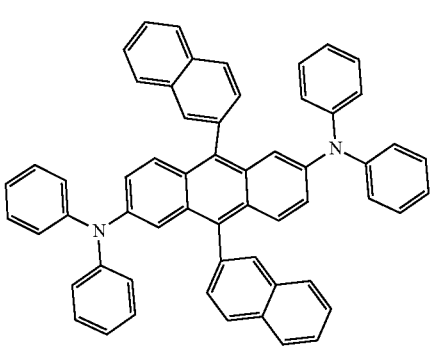

-continued
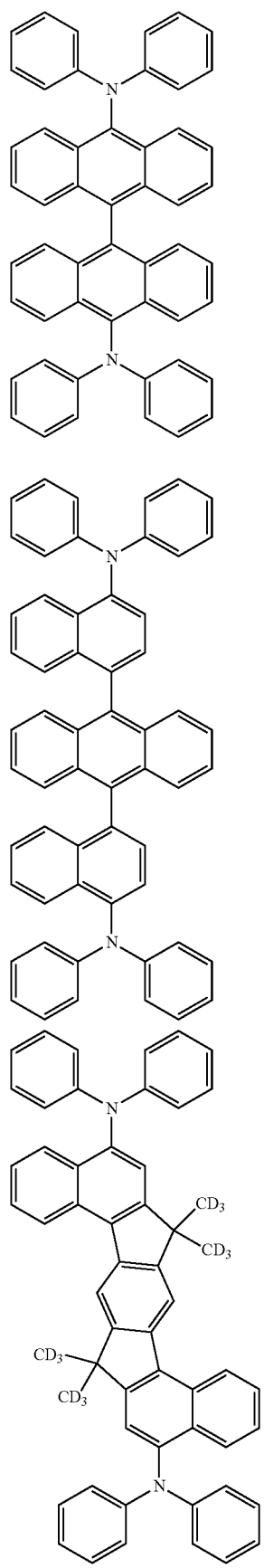
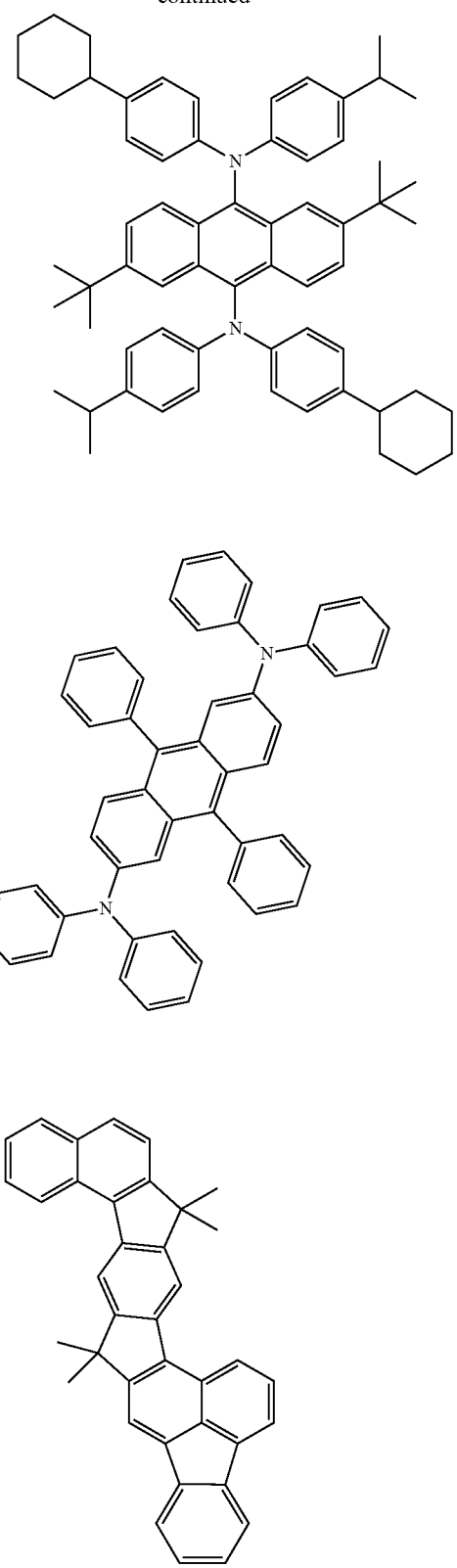

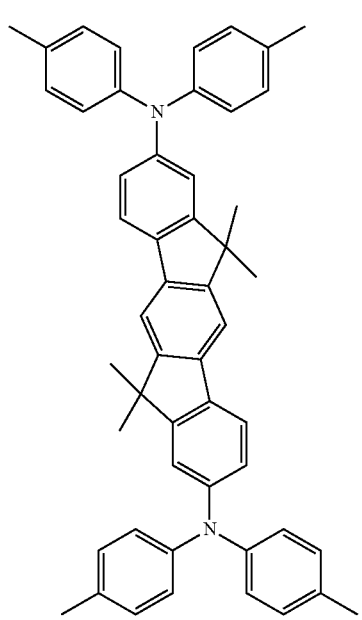
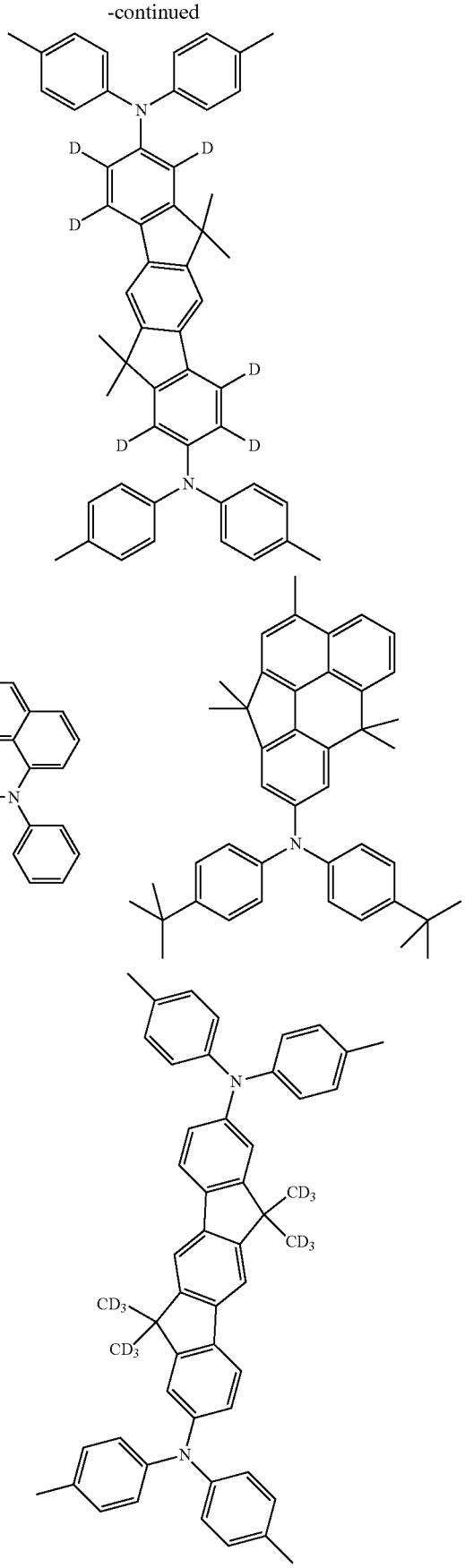

-continued
85
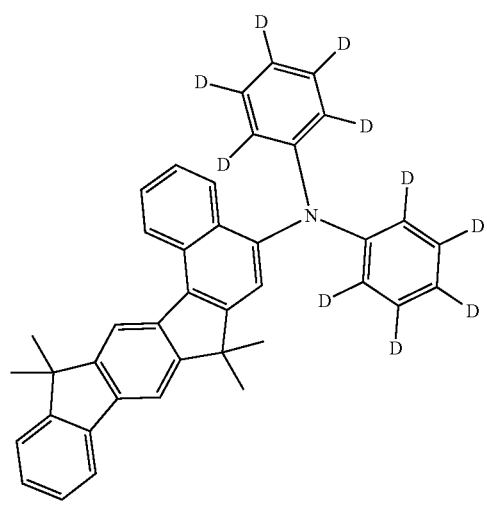
86
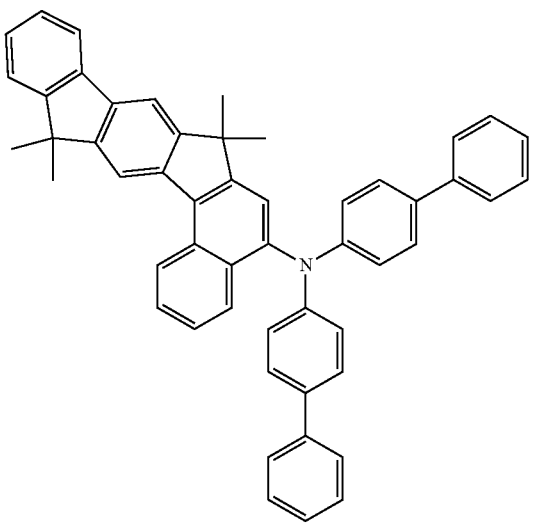
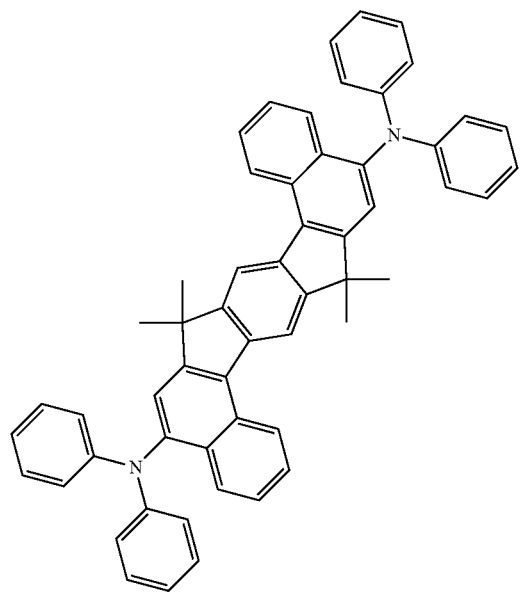
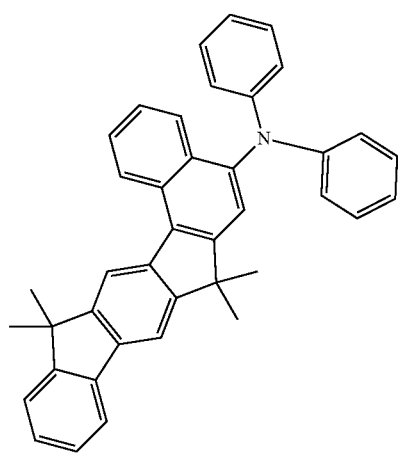
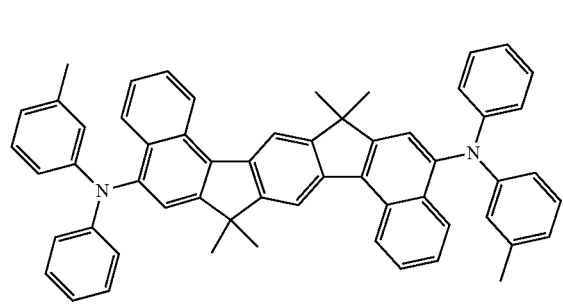
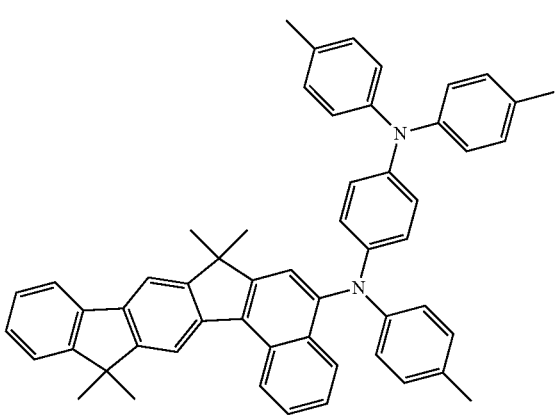

87 88
-continued
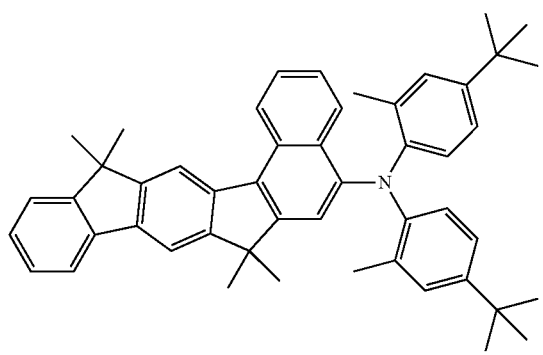 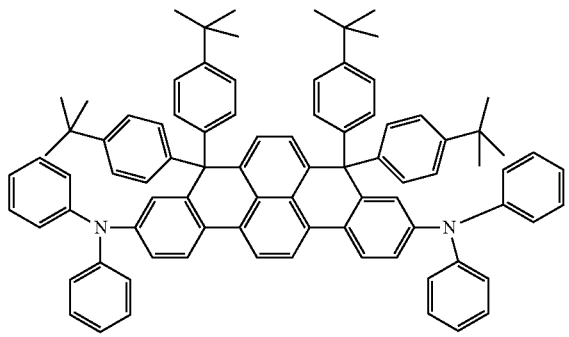
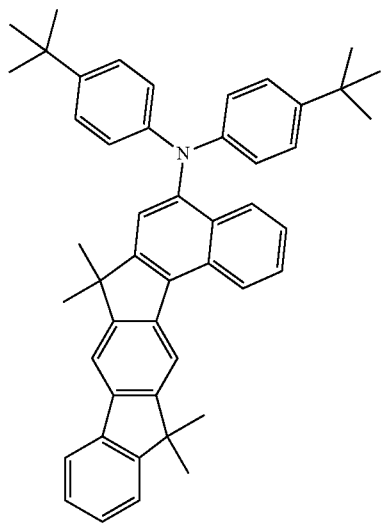 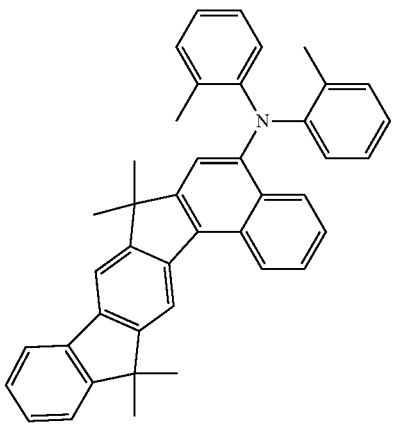
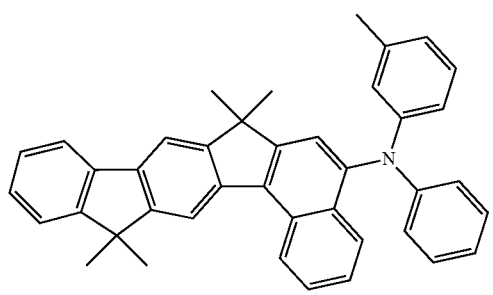 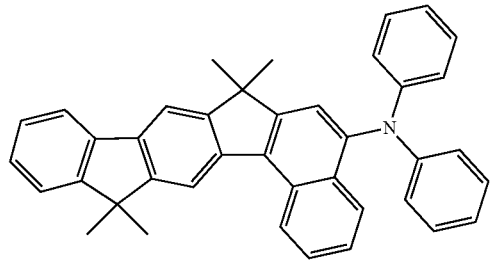
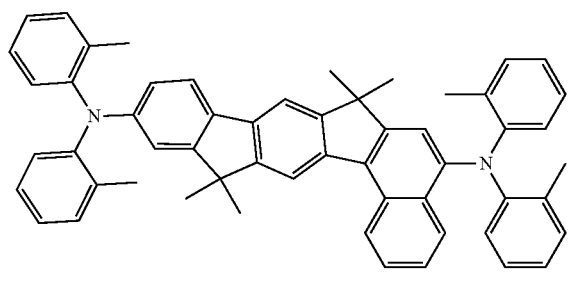 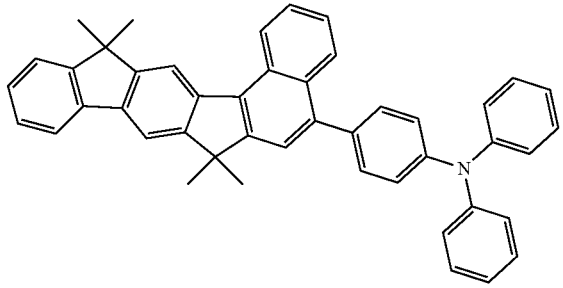

-continued
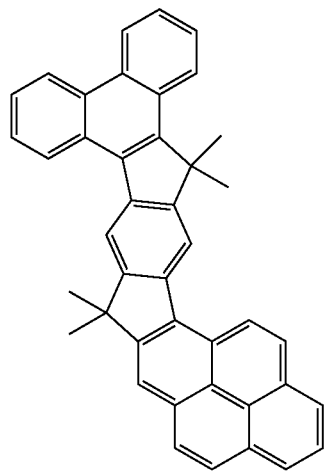 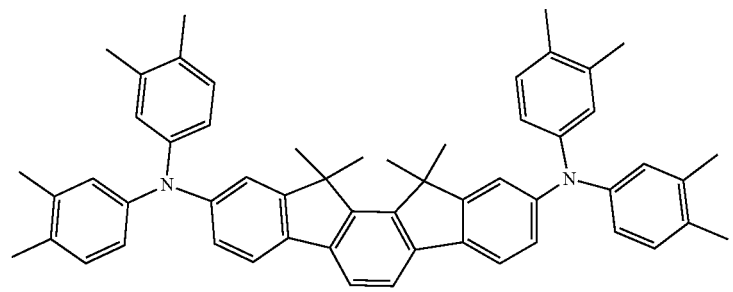
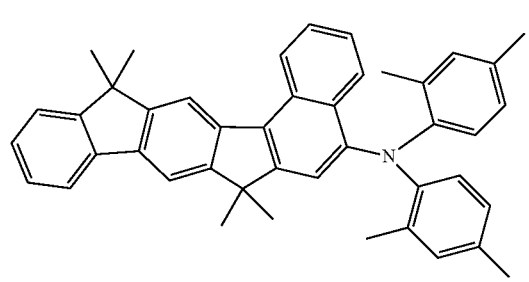 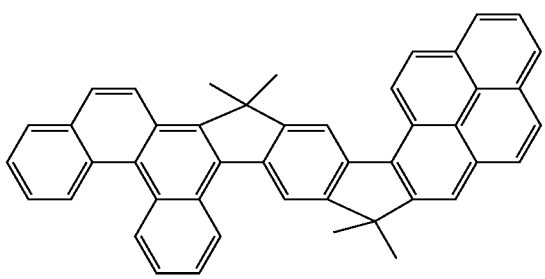
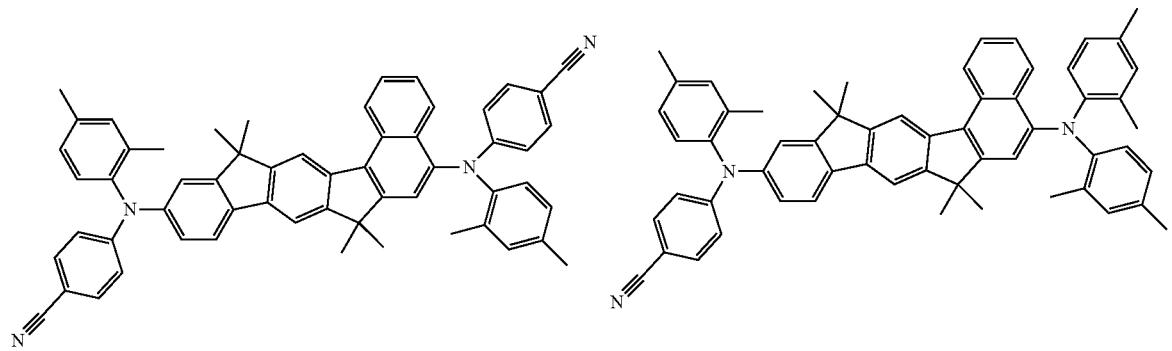
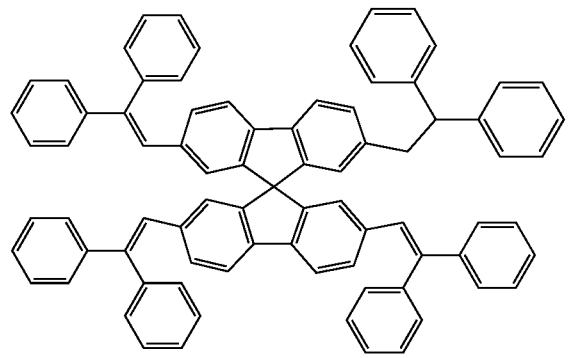

91
-continued
92
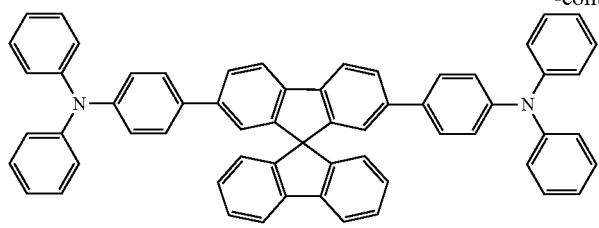
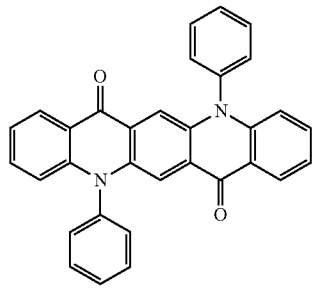
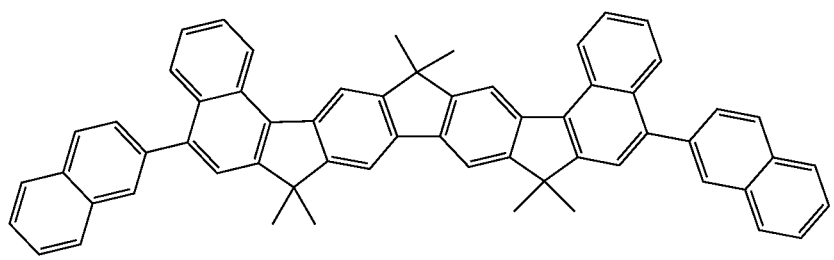
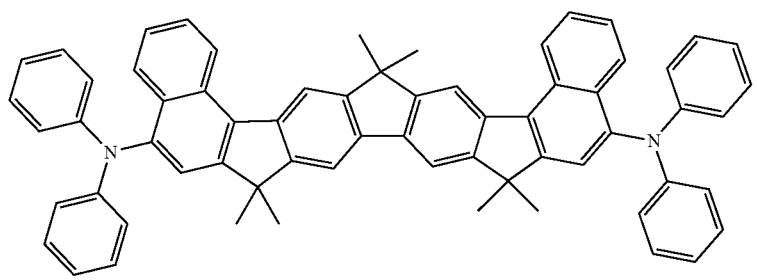
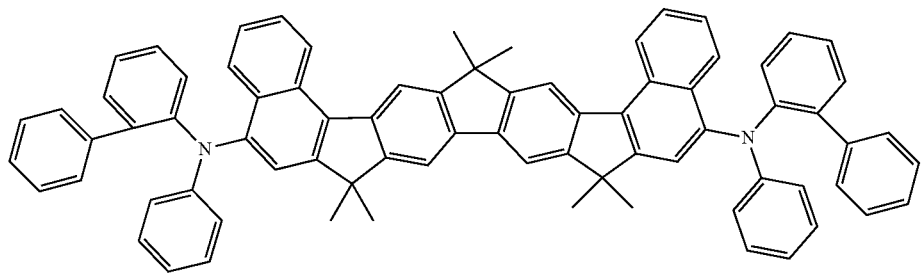
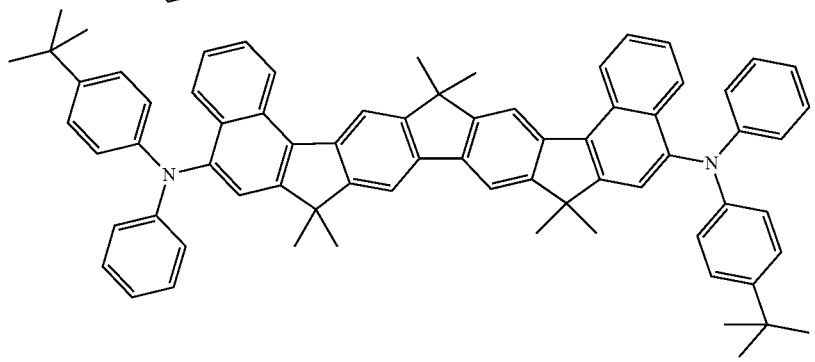

-continued
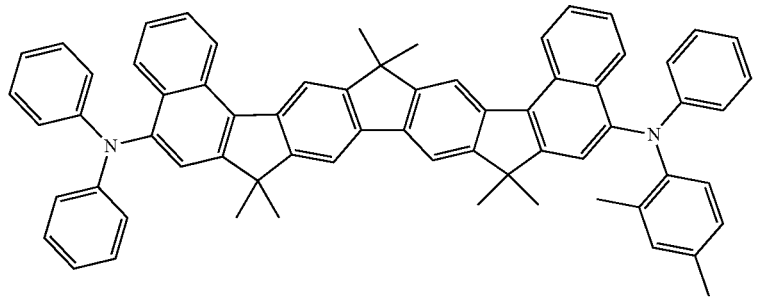
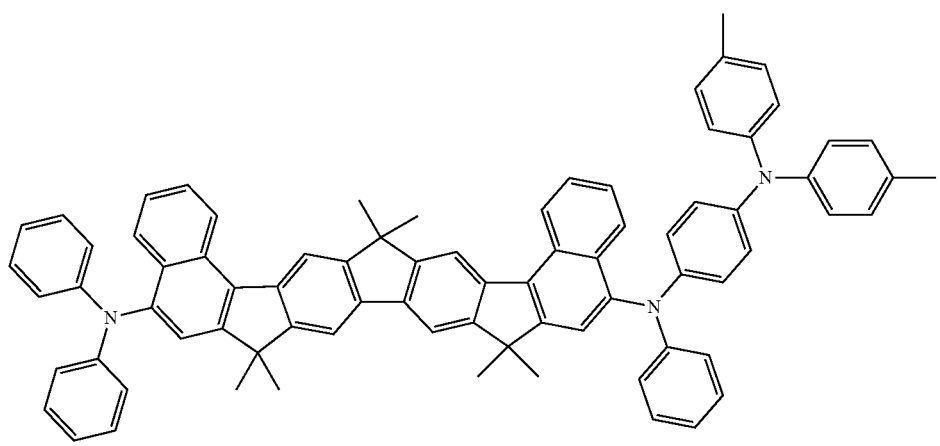
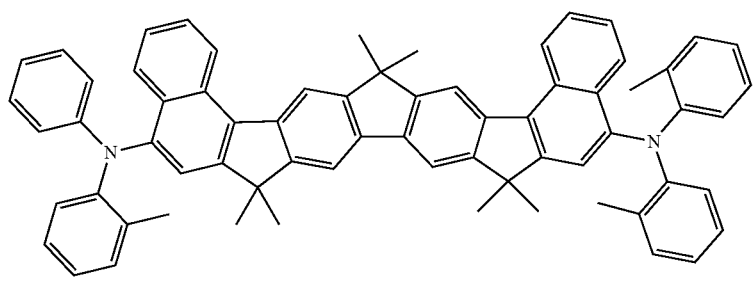
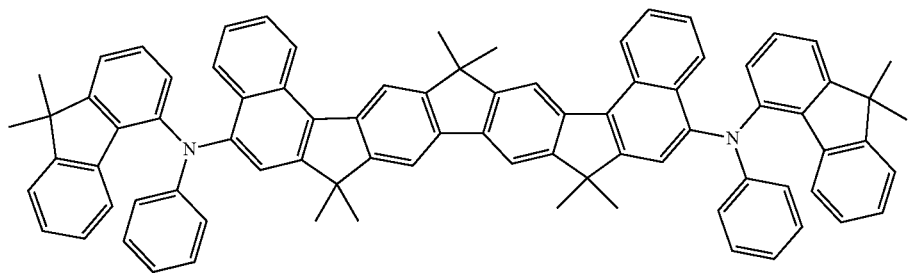
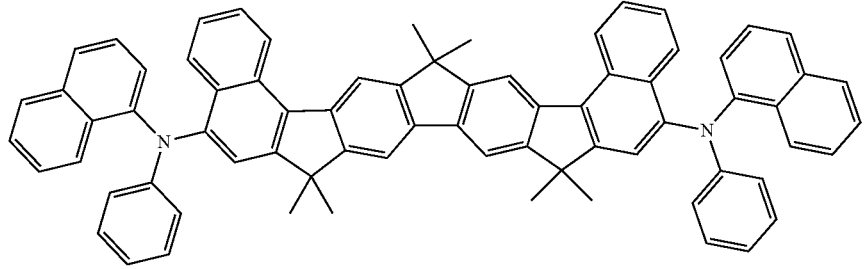

-continued
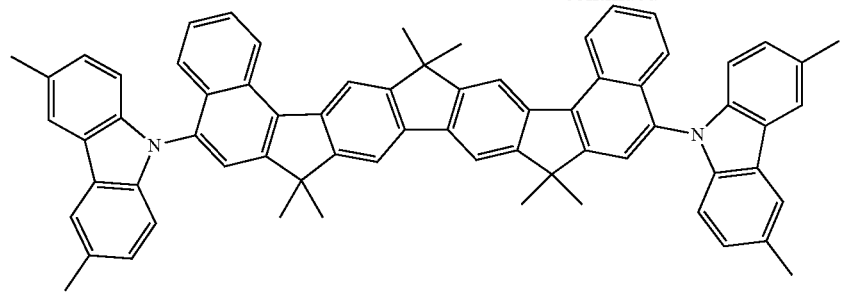
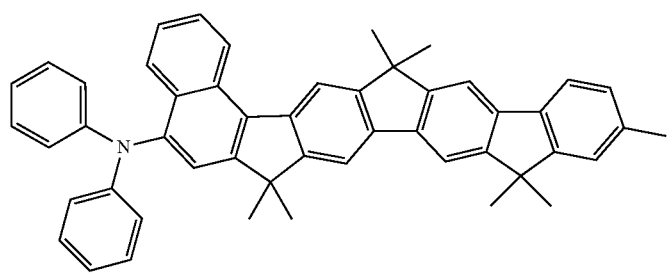
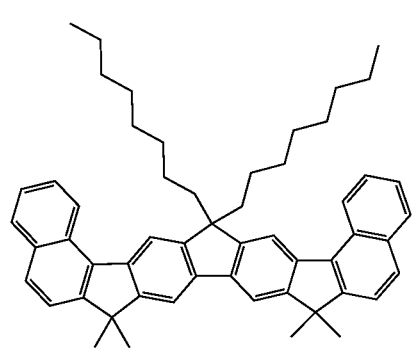
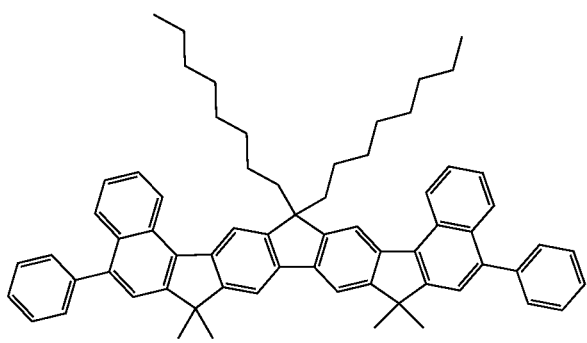
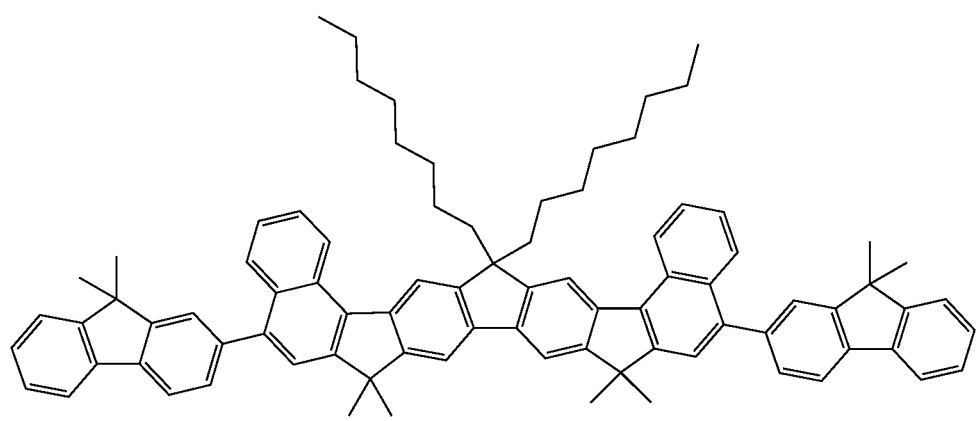
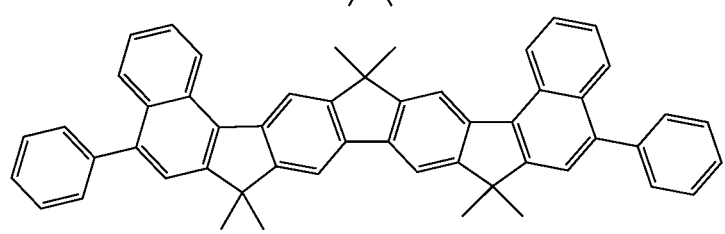

-continued
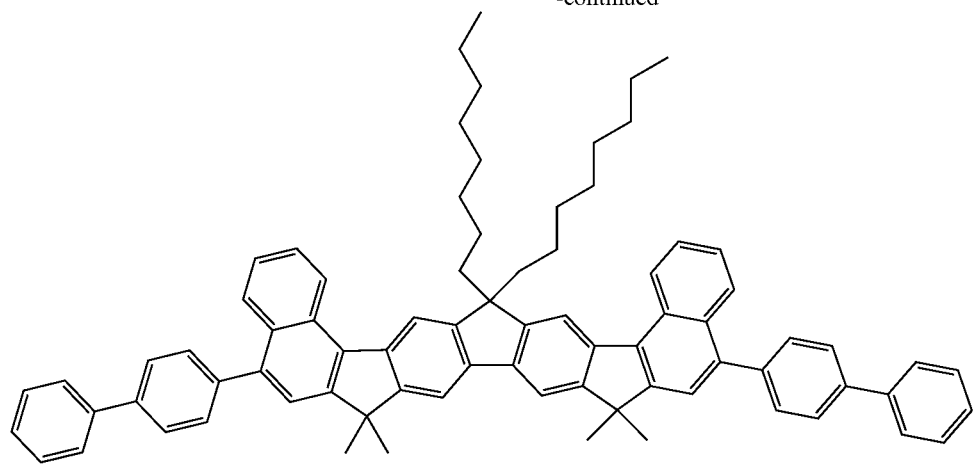
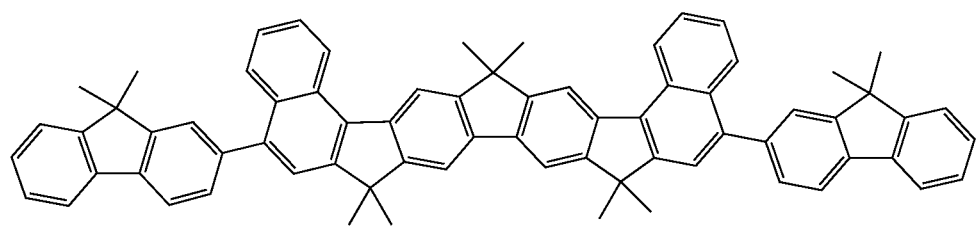
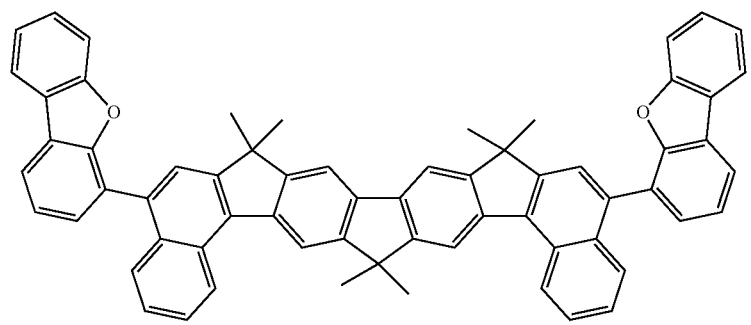
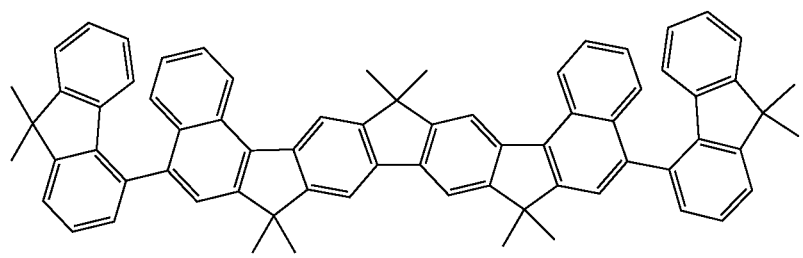
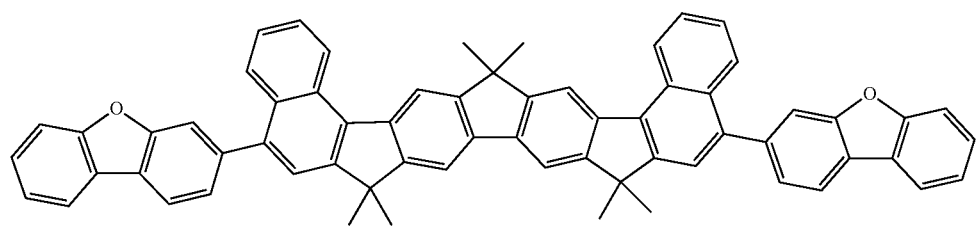

-continued

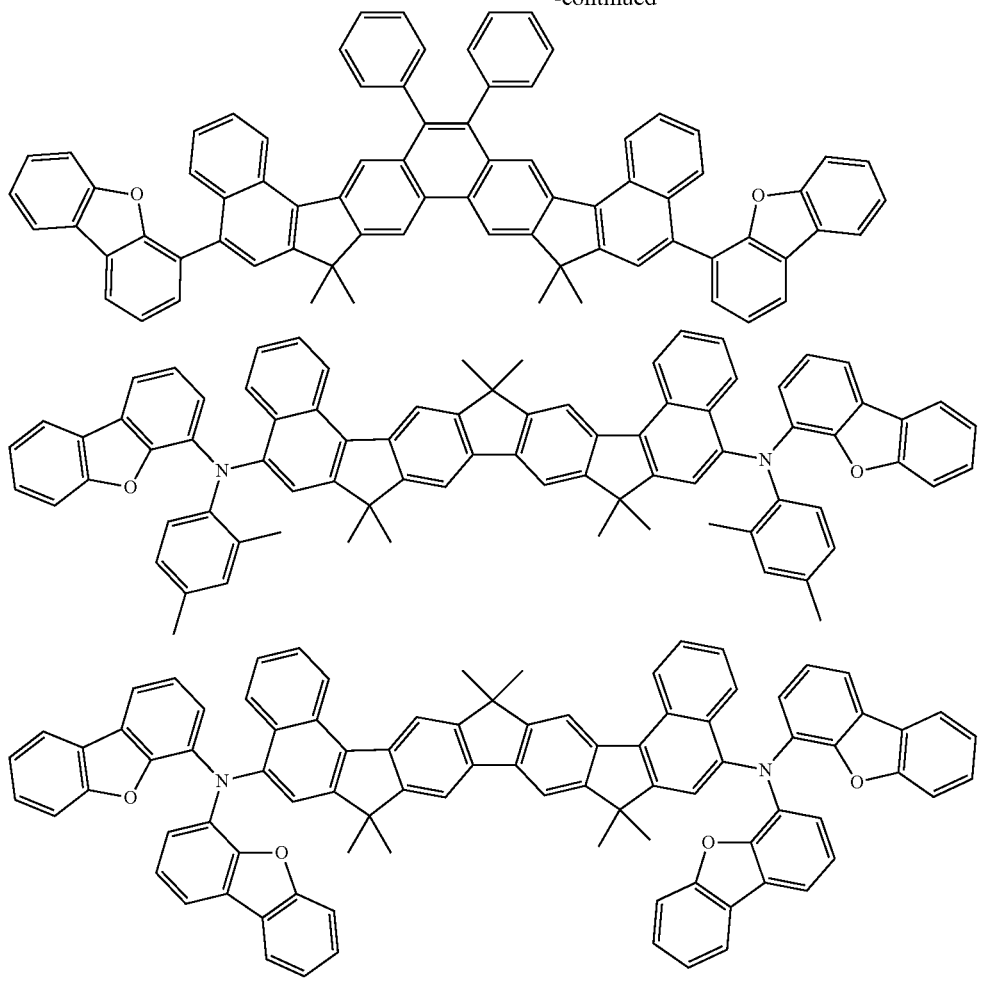

Useful matrix materials, preferably for fluorescent emitting compounds, include materials of various substance classes. Preferred matrix materials are selected from the classes of the oligoarylenes (e.g. 2,2',7,7'-tetraphenylspirobifluorene according to EP 676461 or dinaphthylanthracene), especially of the oligoarylenes containing fused aromatic groups, the oligoarylenevinylenes (e.g. DPVBi or spiro-DPVBi according to EP 676461), the polypodal metal complexes (for example according to WO 2004/081017), the hole-conducting compounds (for example according to WO 2004/058911), the electron-conducting compounds, especially ketones, phosphine oxides, sulfoxides, etc. (for example according to WO 2005/084081 and WO 2005/084082), the atropisomers (for example according to WO 2006/048268), the boronic acid derivatives (for example according to WO 2006/117052) or the benzanthracenes (for example according to WO 2008/145239). Particularly preferred matrix materials are selected from the classes of the oligoarylenes comprising naphthalene, anthracene, benzanthracene and/or pyrene or atropisomers of these compounds, the oligoarylenevinylenes, the ketones, the phosphine oxides and the sulfoxides. Very particularly preferred matrix materials are selected from the classes of the oligoarylenes comprising anthracene, benzanthracene, benzophenanthrene and/or pyrene or atropisomers of these compounds. An oligoarylene in the context of this invention shall be understood to mean a compound in which at least three aryl or arylene groups are bonded to one another. Preference is further given to the anthracene derivatives disclosed in WO 2006/097208, WO 2006/131192, WO 2007/065550, WO 2007/110129, WO 2007/065678, WO 2008/145239, WO 2009/100925, WO 2011/054442 and EP 1553154, the pyrene compounds disclosed in EP 1749809, EP 1905754 and US 2012/0187826, the benzanthracenylanthracene compounds disclosed in WO 2015/158409, the indenobenzofurans disclosed in WO 2017/025165, and the phenanthrylanthracenes disclosed in WO 2017/036573.

Preferred matrix materials for fluorescent emitters for use in the emitting layer of devices comprising the polymers of the invention are shown below:

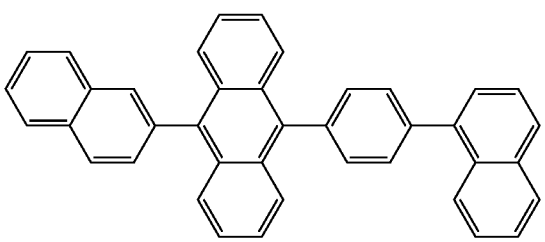

101
-continued
102
-continued
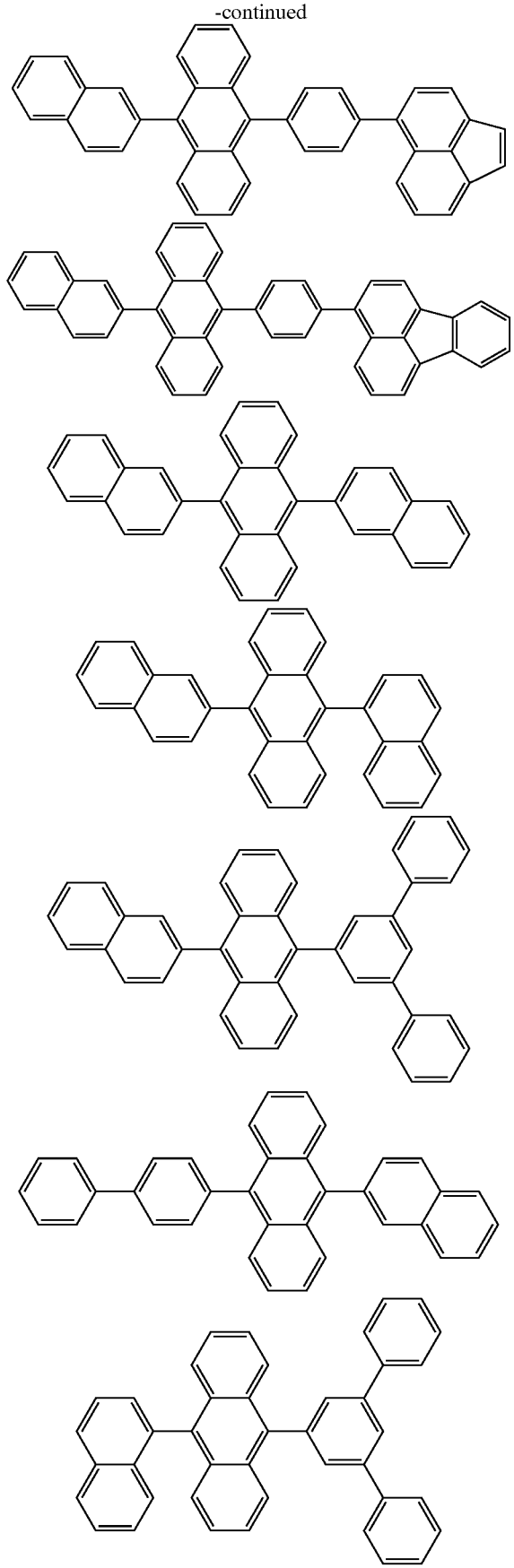
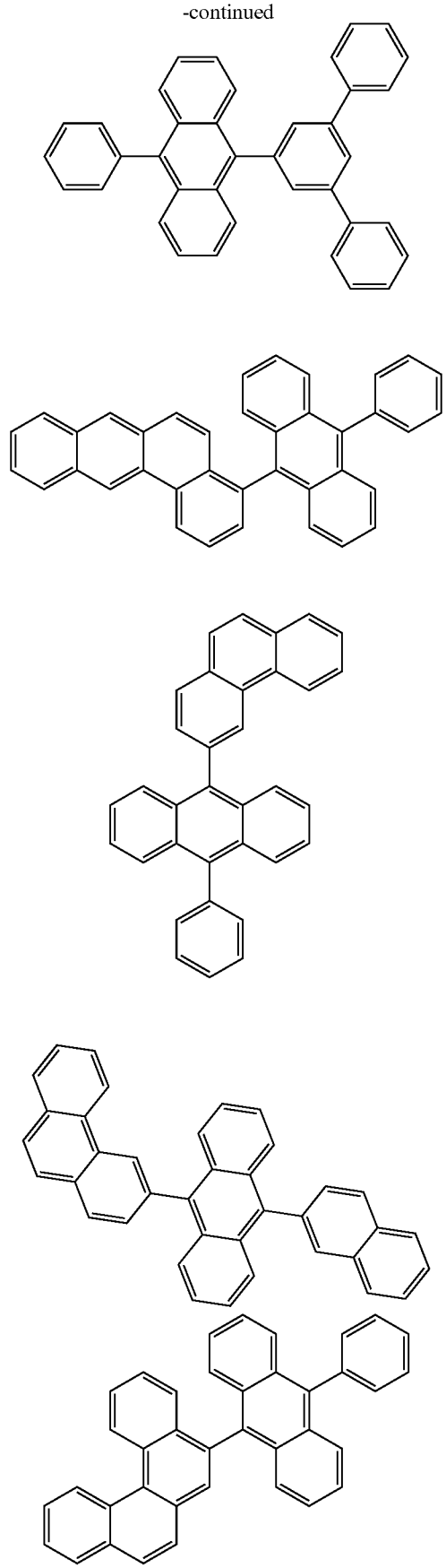

103
-continued
104
-continued
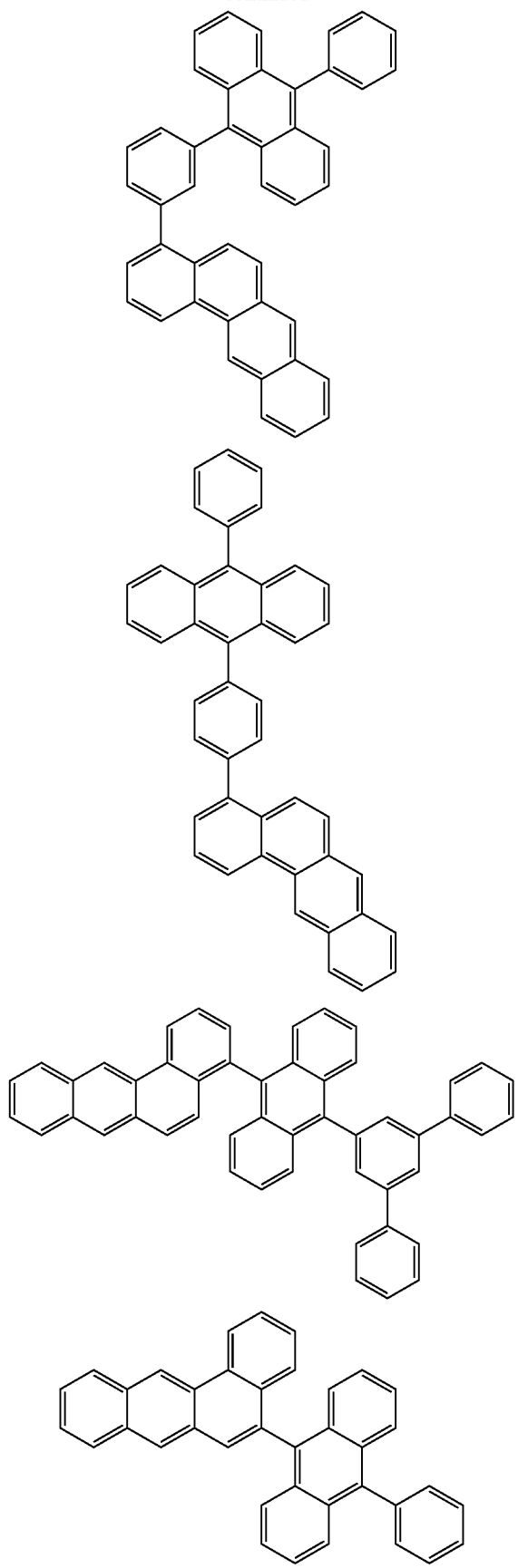

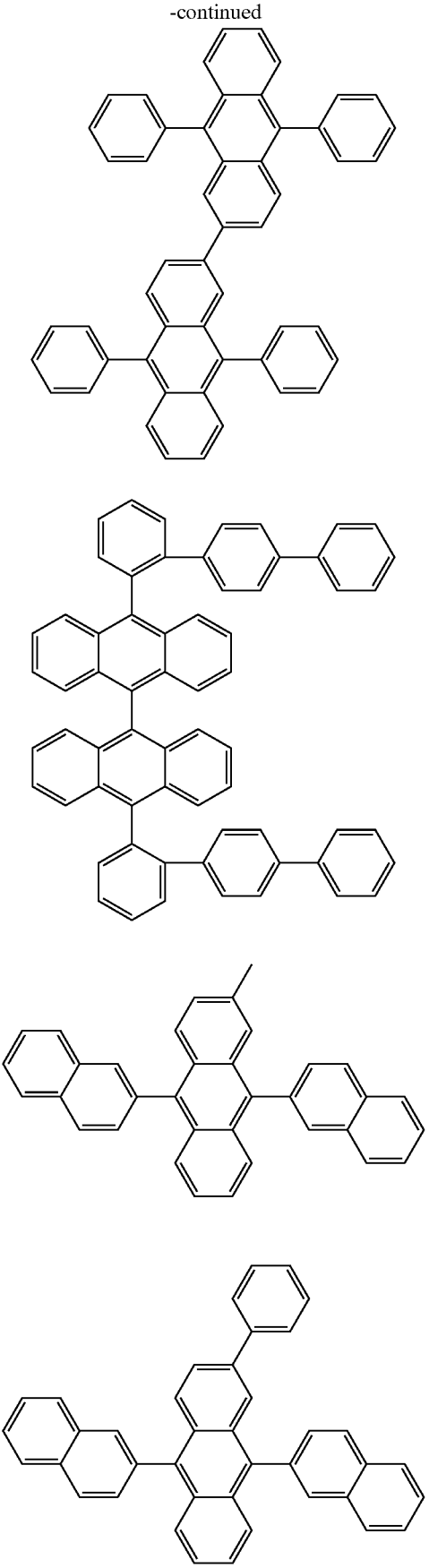

107
-continued
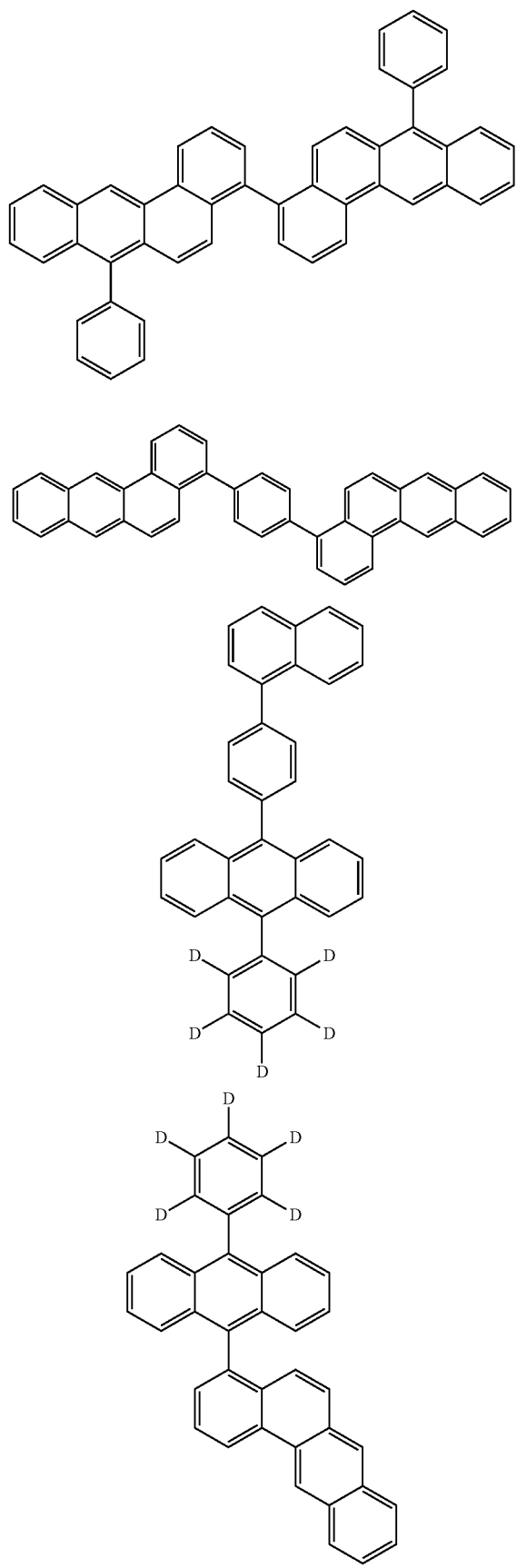
108
-continued
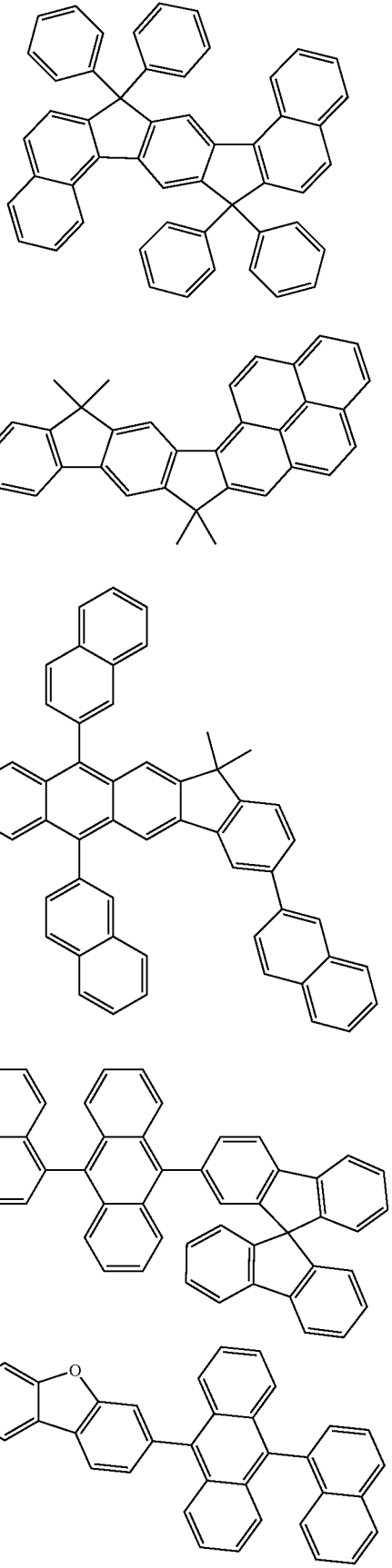

-continued
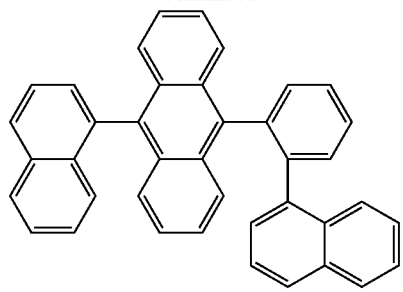
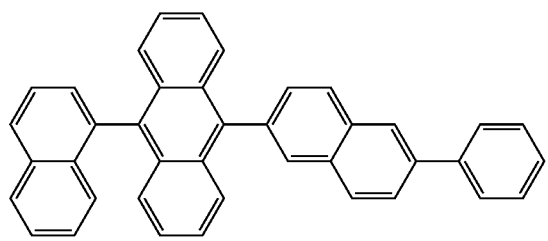
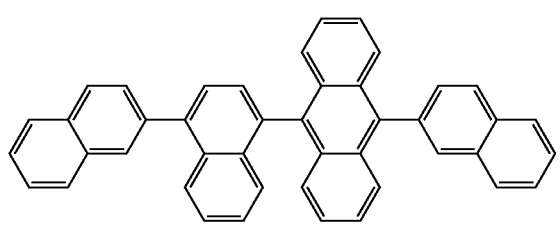
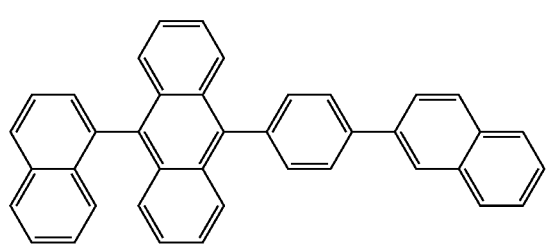
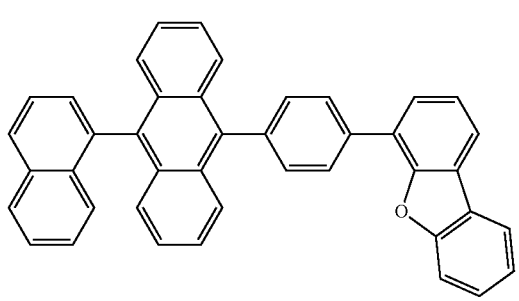
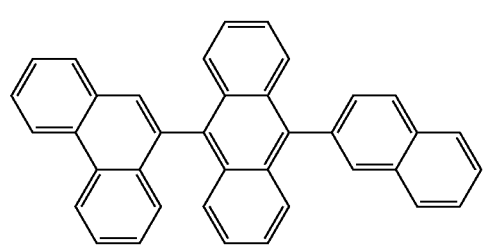
-continued
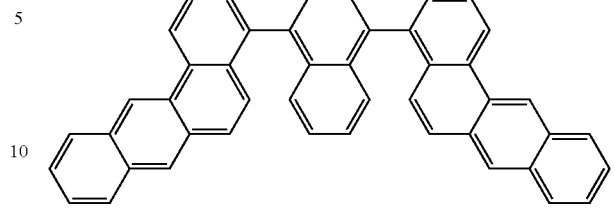
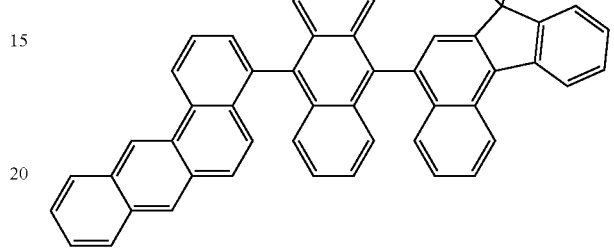
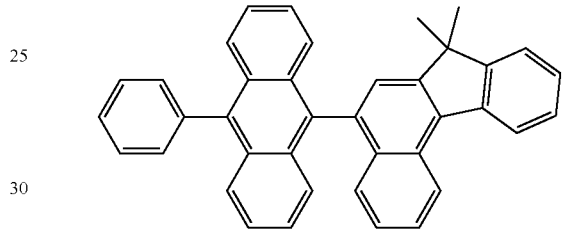
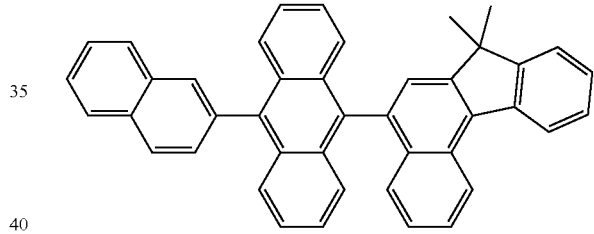
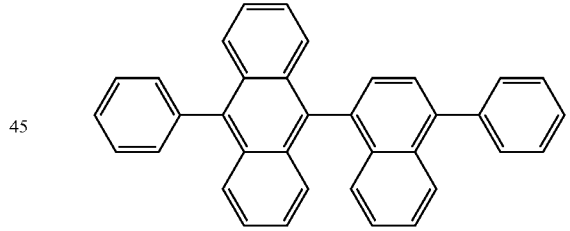
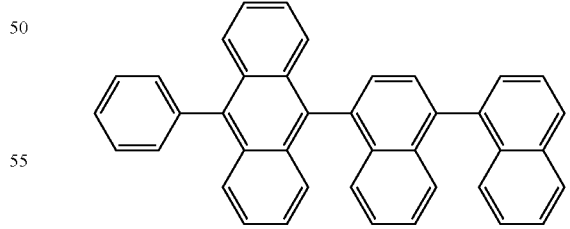
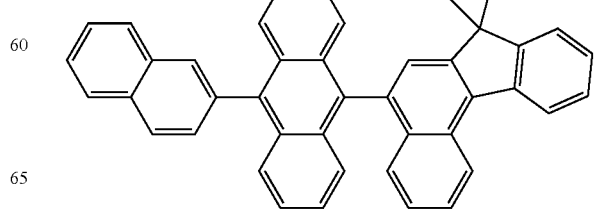

-continued

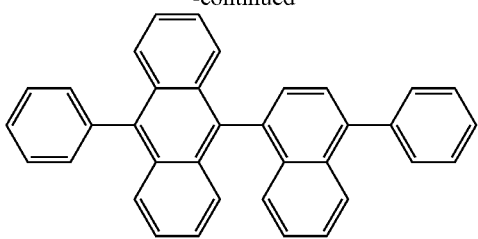

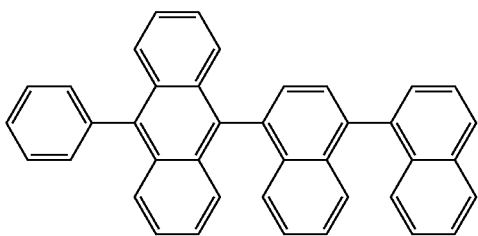

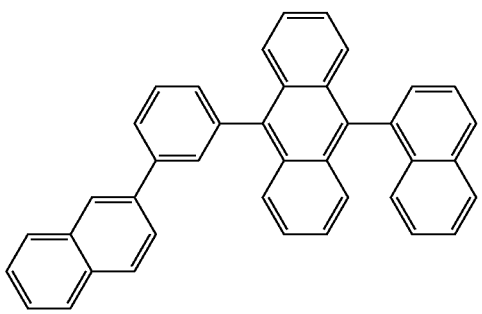

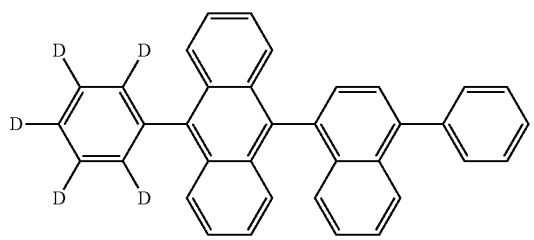

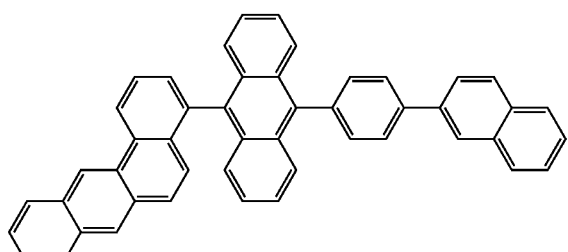

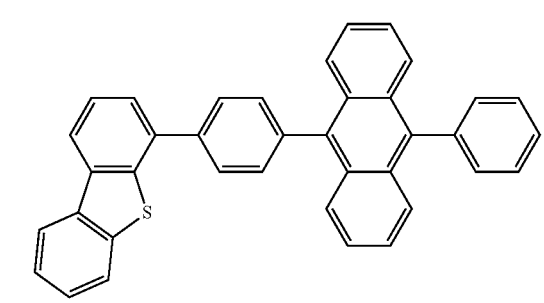

-continued

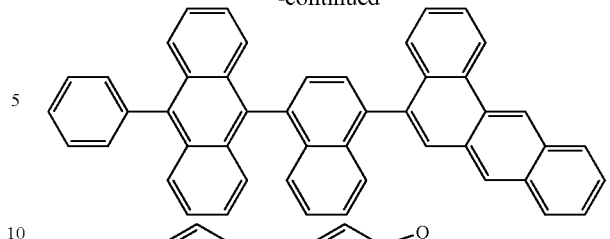

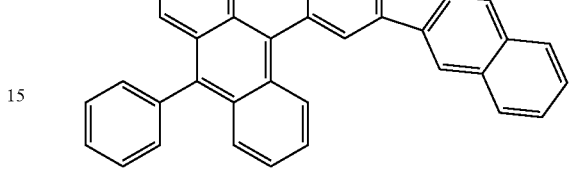

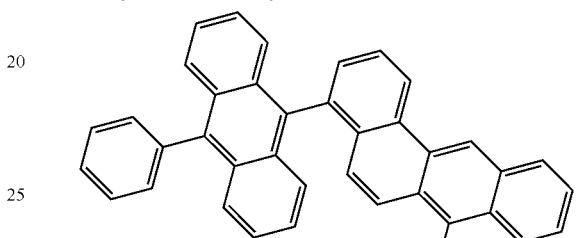

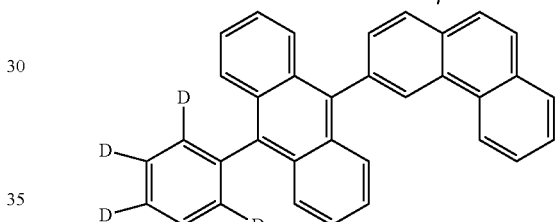

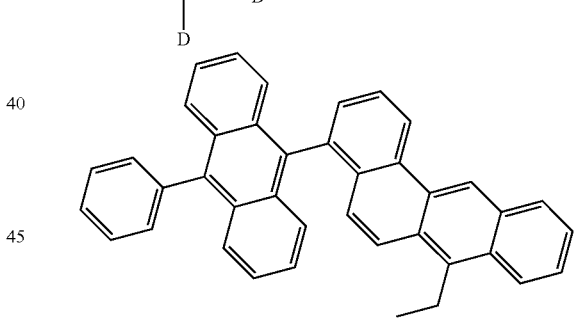

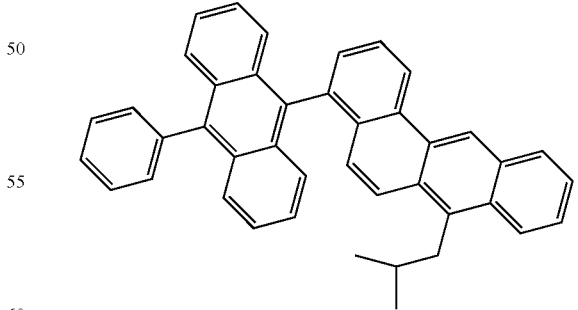

Suitable phosphorescent emitting compounds (=triplet emitters) are especially compounds which, when suitably excited, emit light, preferably in the visible region, and also contain at least one atom of atomic number greater than 20, preferably greater than 38, and less than 84, more preferably greater than 56 and less than 80. Preference is given to using, as phosphorescent emitting compounds, compounds containing copper, molybdenum, tungsten, rhenium, ruthenium, osmium, rhodium, iridium, palladium, platinum, silver, gold or europium, especially compounds containing iridium, platinum or copper. In the context of the present invention, all luminescent iridium, platinum or copper complexes are considered to be phosphorescent emitting compounds.

Examples of the above-described emitting compounds can be found in applications WO 00/70655, WO 01/41512, WO 02/02714, WO 02/15645, EP 1191613, EP 1191612, EP 1191614, WO 05/033244, WO 05/019373 and US 2005/0258742. In general, all phosphorescent complexes as used for phosphorescent OLEDs according to the prior art and as known to those skilled in the art in the field of organic electroluminescent devices are suitable.

Preferred matrix materials for phosphorescent emitting compounds are aromatic ketones, aromatic phosphine oxides or aromatic sulfoxides and sulfones, for example according to WO 2004/013080, WO 2004/093207, WO 2006/005627 or WO 2010/006680, triarylamines, carbazole derivatives, e.g. CBP (N,N-biscarbazolylbiphenyl) or the carbazole derivatives disclosed in WO 2005/039246, US 2005/0069729, JP 2004/288381, EP 1205527 or WO 2008/086851, indolocarbazole derivatives, for example according to WO 2007/063754 or WO 2008/056746, indenocarbazole derivatives, for example according to WO 2010/136109, WO 2011/000455 or WO 2013/041176, azacarbazole derivatives, for example according to EP 1617710, EP 1617711, EP 1731584, JP 2005/347160, bipolar matrix materials, for example according to WO 2007/137725, silanes, for example according to WO 2005/111172, azaboroles or boronic esters, for example according to WO 2006/117052, triazine derivatives, for example according to WO 2010/015306, WO 2007/063754 or WO 2008/056746, zinc complexes, for example according to EP 652273 or WO 2009/062578, diazasilole or tetraazasilole derivatives, for example according to WO 2010/054729, diazaphosphole derivatives, for example according to WO 2010/054730, bridged carbazole derivatives, for example according to US 2009/0136779, WO 2010/050778, WO 2011/042107, WO 2011/088877 or WO 2012/143080, triphenylene derivatives, for example according to WO 2012/048781, or lactams, for example according to WO 2011/116865 or WO 2011/137951.

Suitable charge transport materials as usable in the hole injection or hole transport layer or electron blocker layer or in the electron transport layer of the electronic device of the invention are, as well as the polymers of the invention, for example, the compounds disclosed in Y. Shirota et al., Chem. Rev. 2007, 107(4), 953-1010, or other materials as used in these layers according to the prior art.

Materials used for the electron transport layer may, as well as the compounds of the invention, be any materials as used according to the prior art as electron transport materials in the electron transport layer. Especially suitable are aluminium complexes, for example Alq3, zirconium complexes, for example Zrq4, lithium complexes, for example Liq, benzimidazole derivatives, triazine derivatives, pyrimidine derivatives, pyridine derivatives, pyrazine derivatives, quinoxaline derivatives, quinoline derivatives, oxadiazole derivatives, aromatic ketones, lactams, boranes, diazaphosphole derivatives and phosphine oxide derivatives. Further suitable materials are derivatives of the abovementioned compounds as disclosed in JP 2000/053957, WO 2003/060956, WO 2004/028217, WO 2004/080975 and WO 2010/072300.

Preferred cathodes of the electronic device are metals having a low work function, metal alloys or multilayer structures composed of various metals, for example alkaline earth metals, alkali metals, main group metals or lanthanoids (e.g. Ca, Ba, Mg, Al, In, Mg, Yb, Sm, etc.). Additionally suitable are alloys composed of an alkali metal or alkaline earth metal and silver, for example an alloy composed of magnesium and silver. In the case of multilayer structures, in addition to the metals mentioned, it is also possible to use further metals having a relatively high work function, for example Ag or Al, in which case combinations of the metals such as Ca/Ag, Mg/Ag or Ba/Ag, for example, are generally used. It may also be preferable to introduce a thin interlayer of a material having a high dielectric constant between a metallic cathode and the organic semiconductor. Examples of useful materials for this purpose are alkali metal or alkaline earth metal fluorides, but also the corresponding oxides or carbonates (e.g. LiF, $Li_2O$, $BaF_2$, MgO, NaF, CsF, $Cs_2CO_3$, etc.). It is also possible to use lithium quinolinate (LiQ) for this purpose. The layer thickness of this layer is preferably between 0.5 and 5 nm.

Preferred anodes are materials having a high work function. Preferably, the anode has a work function of greater than 4.5 eV versus vacuum. Firstly, metals having a high redox potential are suitable for this purpose, for example Ag, Pt or Au. Secondly, metal/metal oxide electrodes (e.g. Al/Ni/$NiO_x$, Al/$PtO_x$) may also be preferred. For some applications, at least one of the electrodes has to be transparent or partly transparent in order to enable the irradiation of the organic material (organic solar cell) or the emission of light (OLED, O-laser). Preferred anode materials here are conductive mixed metal oxides. Particular preference is given to indium tin oxide (ITO) or indium zinc oxide (IZO). Preference is further given to conductive doped organic materials, especially conductive doped polymers. In addition, the anode may also consist of two or more layers, for example of an inner layer of ITO and an outer layer of a metal oxide, preferably tungsten oxide, molybdenum oxide or vanadium oxide.

The device is structured appropriately (according to the application), contact-connected and finally sealed, in order to rule out damaging effects by water and air.

In a preferred embodiment, the electronic device is characterized in that one or more layers are coated by a sublimation process. In this case, the materials are applied by vapour deposition in vacuum sublimation systems at an initial pressure of less than $10^{-5}$ mbar, preferably less than $10^{-6}$ mbar. In this case, however, it is also possible that the initial pressure is even lower, for example less than $10^{-7}$ mbar.

Preference is likewise given to an electronic device, characterized in that one or more layers are coated by the OVPD (organic vapour phase deposition) method or with the aid of a carrier gas sublimation. In this case, the materials are applied at a pressure between $10^{-5}$ mbar and 1 bar. A special case of this method is the OVJP (organic vapour jet printing) method, in which the materials are applied directly by a nozzle and thus structured (for example M. S. Arnold et al., Appl. Phys. Lett. 2008, 92, 053301).

Preference is additionally given to an electronic device, characterized in that one or more layers are produced from solution, for example by spin-coating, or by any printing method, for example screen printing, flexographic printing, nozzle printing or offset printing, but more preferably LITI (light-induced thermal imaging, thermal transfer printing) or inkjet printing.

According to the invention, the electronic devices comprising one or more polymers of the invention can be used in displays, as light sources in lighting applications and as light sources in medical and/or cosmetic applications (e.g. light therapy).

EXAMPLES
A) Synthesis Examples
Monomers Used:
| Monomer | Structure | Synthesis by published specification/CAS number |
|---|---|---|
| | Ortho-substituted amines | |
| MON-1-Br | 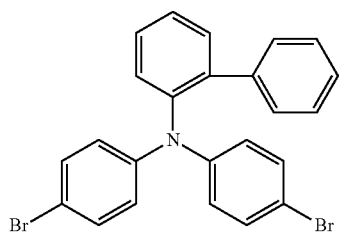 [SMILES: Brc1ccc(N(c2ccc(Br)cc2)c2ccccc2-c2ccccc2)cc1] | WO 2013/156130 |
| MON-1-BE | 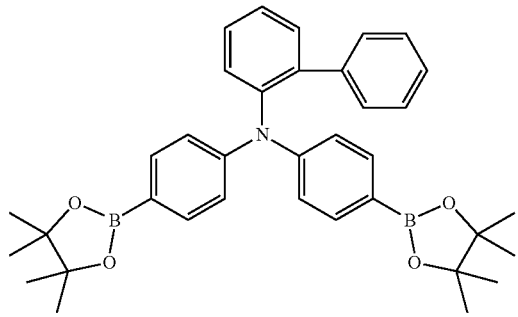 | WO 2013/156130 |
| MON-2-Br | 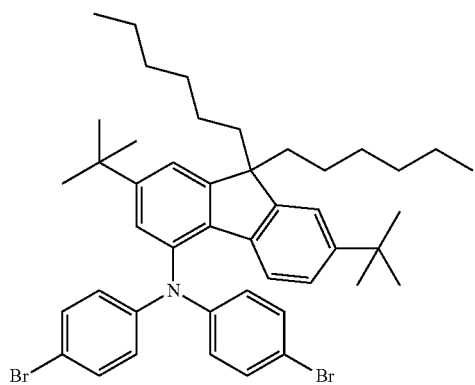 [SMILES: CCCCCCC1(CCCCCC)c2cc(C(C)(C)C)ccc2-c2c(N(c3ccc(Br)cc3)c3ccc(Br)cc3)cc(C(C)(C)C)cc21] | WO 2013/156130 |

-continued
| Monomer | Structure | Synthesis by published specification/CAS number |
|---|---|---|
| MON-2-BE | 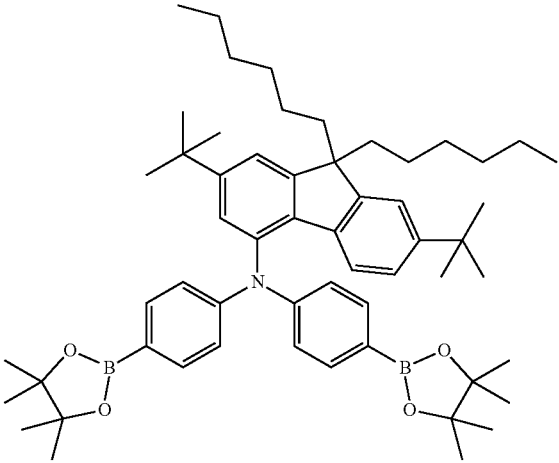 [SMILES: CCCCCCC1(CCCCCC)c2cc(C(C)(C)C)ccc2-c2c(N(c3ccc(B4OC(C)(C)C(C)(C)O4)cc3)c3ccc(B4OC(C)(C)C(C)(C)O4)cc3)cc(C(C)(C)C)cc21] | Borylation analogously to WO 2013/156130 method |
| MON-3-Br | 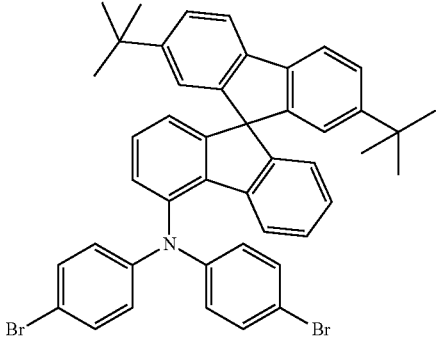 [SMILES: CC(C)(C)c1ccc2c(c1)C1(c3cc(C(C)(C)C)ccc3-2)c2ccccc2-c2c(N(c3ccc(Br)cc3)c3ccc(Br)cc3)cccc21] | WO 2013/156130 |
| MON-4-Br | 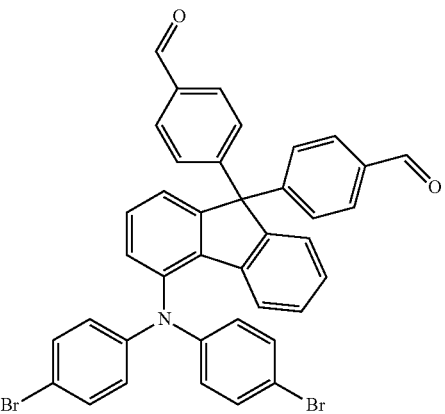 [SMILES: O=Cc1ccc(C2(c3ccc(C=O)cc3)c3ccccc3-c3c(N(c4ccc(Br)cc4)c4ccc(Br)cc4)cccc32)cc1] | WO 2013/156130 |

| Monomer | Structure | Synthesis by published specification/CAS number |
|---|---|---|
| MON-5-Br | | WO 2013/156129 |
| MON-6-BE | | WO 2013/156129 |
| MON-7-Br | | CAS 2043618-74-0 |
| MON-8-Br | | Synthesis according to EP17177211.4 |

-continued
| Monomer | Structure | Synthesis by published specification/CAS number |
|---|---|---|
| MON-8-BE | 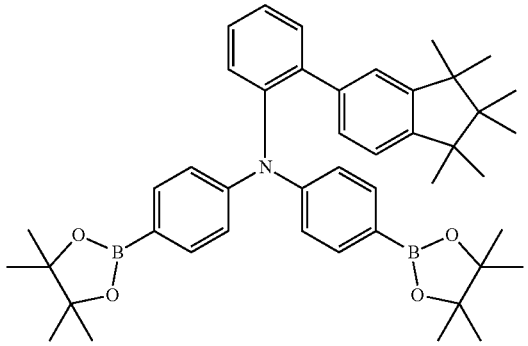 | Synthesis according to EP17177211.4 |
Conjugation interruptors
| MON-20-Br | 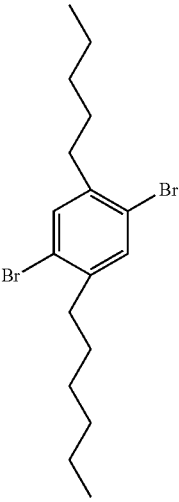 | CAS 117635-21-9 |
| MON-20-BE | 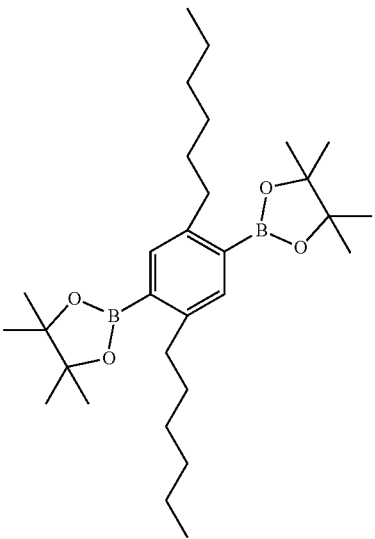 | CAS 374934-77-7 |

-continued

| Monomer | Structure | Synthesis by published specification/CAS number |
|---|---|---|
| MON-21-Br | | CAS 255710-07-7 |
| MON-22-BE | | CAS 897404-05-6 |
| MON-23-Br | | CAS 49610-35-7 |

-continued

| Monomer | Structure | Synthesis by published specification/CAS number |
|---|---|---|
| MON-24-BE | | WO 2006/063852 |
| MON-25-Br | | 101783-96-4 |
| MON-26-Br | | CAS 615-59-8 |
| Crosslinkers | | |
| MON-30-Br | | WO 2010/097155 |
| MON-30-BE | | WO 2010/097155 |

-continued

| Monomer | Structure | Synthesis by published specification/CAS number |
|---|---|---|
| MON-31-Br | | WO 2013/156130 |
| MON-31-BE | | WO 2013/156130 |
| MON-32-Br | | WO 2009/102027 |
| MON-32-BE | | WO 2009/102027 |

-continued
| Monomer | Structure | Synthesis by published specification/CAS number |
|---|---|---|
| MON-33-Br | 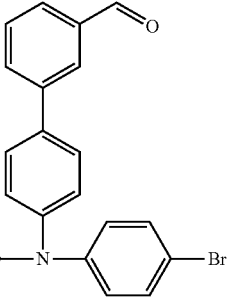 | For synthesis see below |
| MON-33-BE | 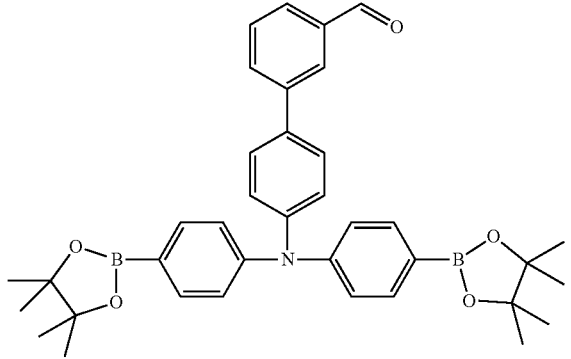 | Borylation analogously to WO 2013/156130 method |
| MON-34-Br | 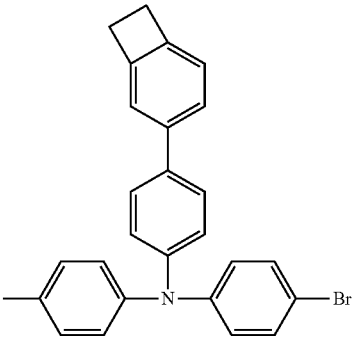 | For synthesis see below |
| MON-34-BE | 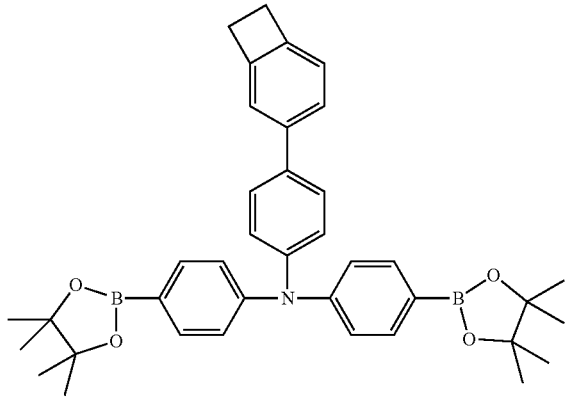 | Borylation analogously to WO 2013/156130 method |

| Monomer | Structure | Synthesis by published specification/CAS number |
|---|---|---|
| MON-35-Br | | For synthesis see below |
| MON-35-BE | | Borylation analogously to WO 2013/156130 method |
| MON-36-BE | | For synthesis see below |

| Monomer | Structure | Synthesis by published specification/CAS number |
|---|---|---|
| Further monomers, for preparation of the comparative polymers | | |
| Mon-101-BE | | WO 99/048160 A1 |
| Mon-102-Br | | Macromolecules 2000, 33, 2016-2020 |
| Mon-103-Br | | CAS 16400-51-4 |
Synthesis of the Monomers
Synthesis MON-33-Br (and Analogously MON-034-Br)
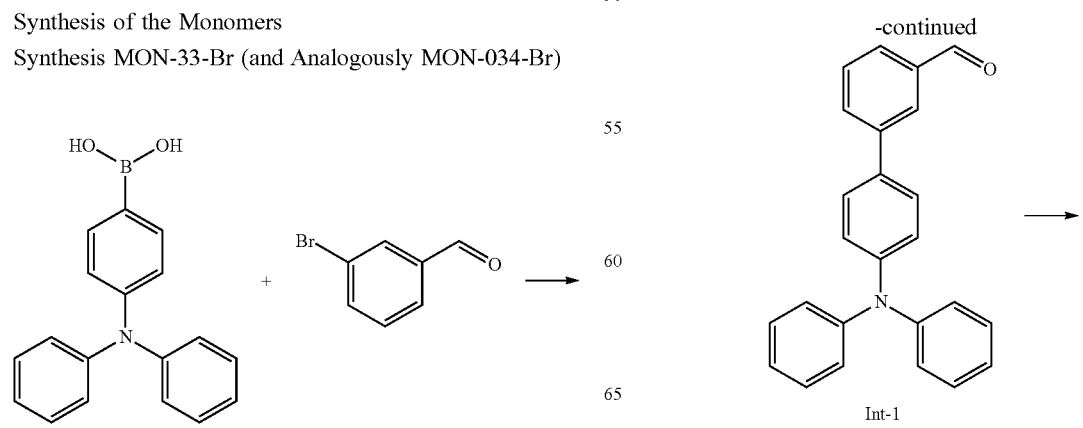
Int-1

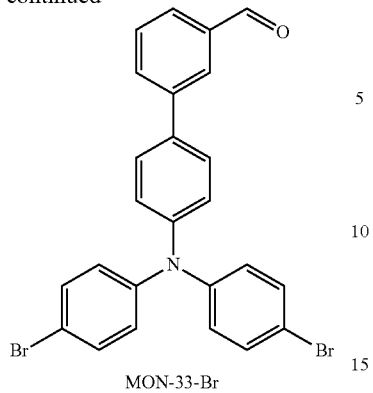

MON-33-Br

3-Bromobenzaldehyde (75 g, 405 mmol), 4-(diphenylamino)phenylboronic acid (141 g, 486 mmol) and caesium carbonate (291 g, 892 mmol) are initially charged in 540 ml of ethylene glycol dimethyl ether, 430 ml of toluene and 540 ml of water. After degassing for 30 minutes, tetrakis(triphenylphosphine)palladium (11.7 g, 10.1 mmol) is added. The reaction is heated to reflux overnight. After the reaction has ended, the mixture is cooled to room temperature and quenched with N-acetylcysteine solution. This is followed by filtering through silica gel, removal of the organic phase and extraction of the aqueous phase with toluene. The collected organic phases are combined and dried, and the solvent is removed under reduced pressure. The resultant oil is purified by means of zone sublimation. Yield: 57% (80.2 g, 229 mmol).

Int-1 is subsequently dissolved in 1000 ml of THF and cooled to 0° C., and N-bromosuccinimide (81.7 g, 178 mmol) is added in portions. The reaction is then gradually warmed to room temperature. THF is removed under reduced pressure, and the residue is taken up with toluene and washed three times with water. The organic phase is dried and the solvent is again removed under reduced pressure. This is followed by repeated recrystallization from heptane. MON-33-Br is obtained with a yield of 86% (100 g, 200 mmol).

MON-034-Br is prepared analogously by using 3-bromobicyclo[4.2.0]octa-1(6), 2,4-triene rather than 3-bromobenzaldehyde. MON-34-Br is prepared with a yield of 55%.

Synthesis of MON-35-Br

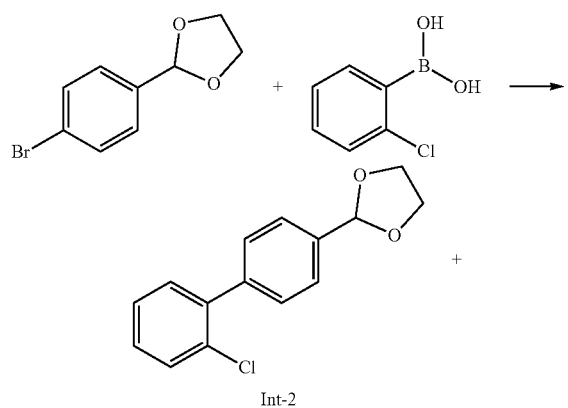

Int-2

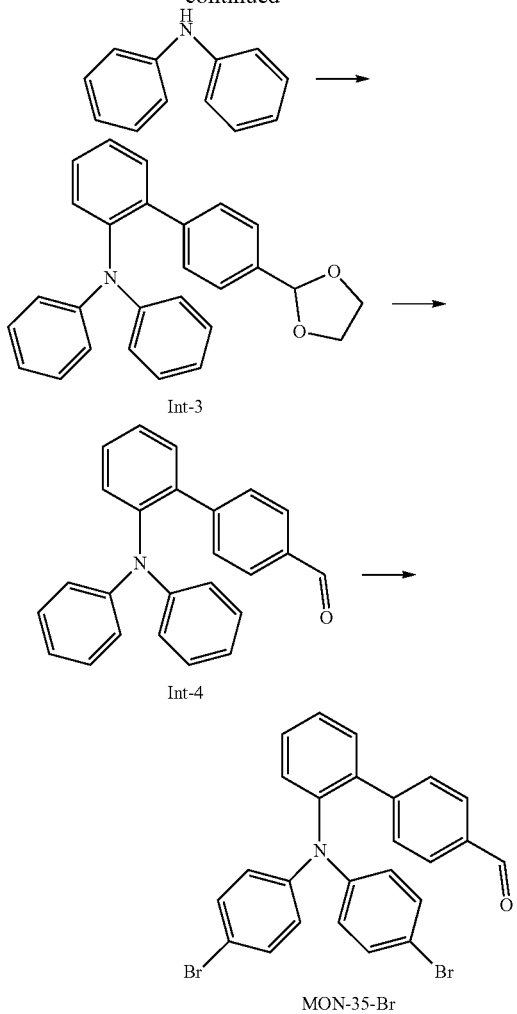

Int-3

Int-4

MON-35-Br

The bromo-phenyl derivative (23 g, 100 mmol), 2-chlorophenylboronic acid (16.5 g, 105 mmol) and potassium carbonate (41.6 g, 301 mmol) are initially charged in 140 ml of THF and 50 ml of water. The reaction mixture is degassed and then tetrakis(triphenylphosphine)palladium (1.16 g, 1 mmol) is added. The reaction is stirred at reflux overnight. Thereafter, the mixture is cooled to room temperature, toluene and water are added, the phases are separated and the organic phase is washed with water. After the solvent has been removed under reduced pressure, the solid formed is purified by means of hot extraction (heptane, alumina). Int-2 is obtained with a yield of 80% (20.7 g, 79 mmol).

Int-2 (19.7 g, 76 mmol) and diphenylamine (12.9 g, 76 mmol) are dissolved in 800 ml of toluene, and sodium t-butoxide (10.9 g, 113 mmol) is added. This is followed by degassing with argon for 30 min and addition of tris(dibenzylideneacetone)dipalladium (690 mg, 0.76 mmol). The reaction mixture is heated at reflux overnight, then cooled, and water and toluene are added. The phases are separated, and the organic phase is washed with water and then dried. The solvent is removed under reduced pressure and the resulting crude product is purified using alumina. Int-3 is obtained with a yield of 71% (21.1 g, 53 mmol).

Int-3 (20 g, 50 mmol) is dissolved in 400 ml of acetonitrile, and 75 ml of hydrochloric acid are added. A solid precipitates out, and is filtered off. Int-4: Yield 68% (12.1 g, 35 mmol).

Int-4 (12 g, 35 mmol) is dissolved in 470 ml of THF and cooled to 0° C., and N-bromosuccinimide (12.2 g, 68 mmol) is added in portions. The reaction mixture is warmed to room temperature overnight. The solvent is removed under reduced pressure, taken up again with toluene, and washed with aqueous Na$_2$SO$_3$ solution and then with water. The solvent is removed again and the solid residue is repeatedly recrystallized from a toluene/heptane mixture. MON-35-Br is obtained with a yield of 67% (11.7 g, 23 mmol).

Synthesis of MON-36-BE

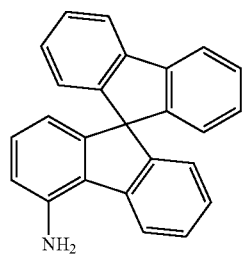

+

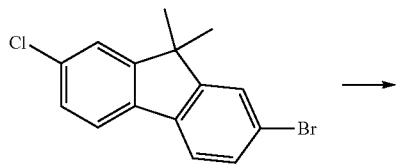

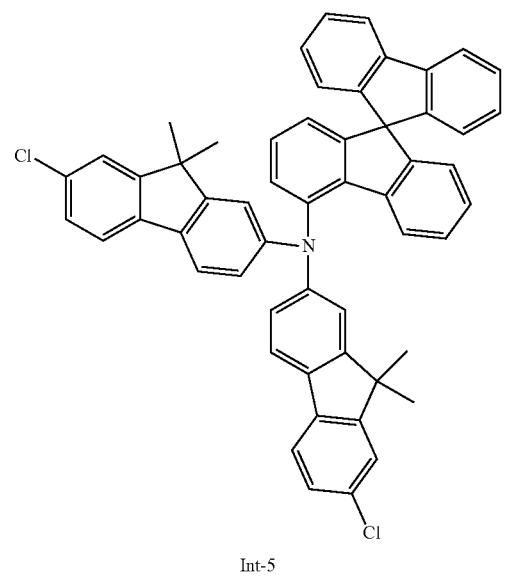

Int-5

→

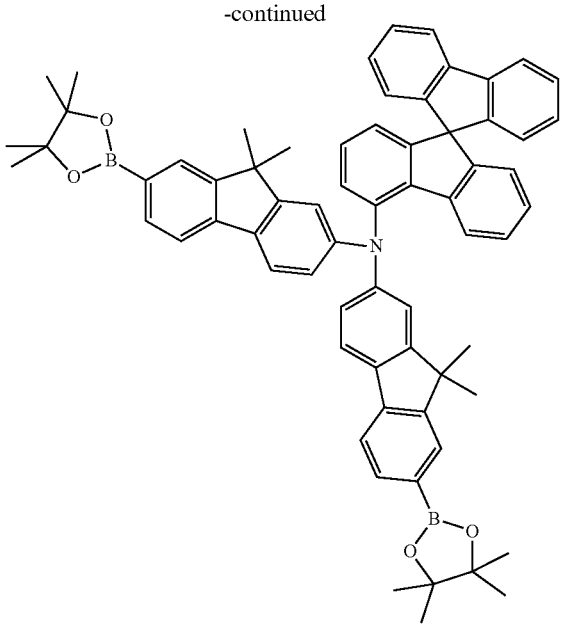

MON-36-BE 9,9'-Spirobifluorene-4'-amine (25 g, 75 mmol) and 2-bromo-7-chloro-9,9-dimethylfluorene (48.7 g, 160 mmol) are dissolved in 400 ml of toluene, and then sodium t-butoxide (21.7 g, 226 mmol) is added. The mixture is saturated with protective gas and, after adding [1,1'-bis(diphenylphosphino)ferrocene]dichloropalladium (1.85 g, 0.2 mmol), heated to reflux. After four hours, the mixture is cooled to room temperature, filtered through Celite and washed through with toluene. The phases are separated, the organic phase is washed with water and dried, and the solvent is removed. For purification, the solids are filtered together with heptane/toluene through silica gel. Int-5 is obtained with a yield of 73% (43 g, 54 mmol).

41 g of Int-5 (52 mmol) are initially charged together with bis(pinacolato)diborane (30.6 g, 120 mmol) and potassium acetate (25.7 g, 261.8 mmol) in 650 ml of dioxane. The mixture is inertized with argon and then palladium acetate (235 mg, 1.05 mmol) and Sphos (860 mg, 2.09 mmol) are added. The mixture is stirred at reflux overnight. The mixture is cooled to room temperature, filtered through Celite and washed through with toluene. The phases are separated, the organic phase is washed with water and dried, and the solvent is removed. The crude product is subsequently recrystallized (toluene/heptane) and then purified by column chromatography (heptane/EtOAc). MON-36-Br is obtained with a yield of 30% (15 g, 15 mmol).

Synthesis of the Polymers

The comparative polymers V1 and V2 and the inventive polymers Po1 to Po40 are prepared by SUZUKI coupling by the process described in WO 2003/048225 from the monomers disclosed above.

In the preparation of the polymers, the monomers specified below are used in the reaction mixture in the corresponding percentages, as specified below. The polymers V1 and V2 and Po1 to Po40 prepared in this way contain the structural units, after elimination of the leaving groups, in the percentages reported in the table below (percent figures=mol %).

In the case of the polymers which are prepared from monomers having aldehyde groups, the latter are converted to crosslinkable vinyl groups after the polymerization by WITTIG reaction by the process described in WO 2010/097155 (examples with synthesis method on pages 36/37). The polymers listed correspondingly in the table below thus have crosslinkable vinyl groups rather than the aldehyde groups originally present.

The palladium and bromine contents of the polymers are determined by ICP-MS. The values determined are below 10 ppm.

The molecular weights $M_w$ and the polydispersities D are determined by means of gel permeation chromatography (GPC) (model: Agilent HPLC System Series 1100, column: PL-RapidH from Polymer Laboratories; solvent: THF with 0.12% by volume of o-dichlorobenzene; detection: UV and refractive index; temperature: 40° C.). Calibration is effected with polystyrene standards.

B) Device Examples

The general process for producing OLEDs comprising layers that have been applied from solution is described in WO 2004/037887 and WO 2010/097155. This process is matched to the circumstances described hereinafter (variation in layer thickness, materials).

The polymers of the invention are used in OLEDs with the following layer sequence:
substrate,
ITO (50 nm),
hole injection layer (HIL) (20 nm),
hole transport layer (HTL) (20 nm),
emission layer (EML) (30 nm),
hole blocker layer (HBL) (10 nm)
electron transport layer (ETL) (40 nm),
cathode (Al) (100 nm).

Substrates used are glass plates coated with structured ITO (indium tin oxide) of thickness 50 nm. The hole injection layer is applied by means of spin-coating in an inert atmosphere. For this purpose, a hole-transporting crosslink-

| Polymer | MON A | % | MON B | % | MON C | % | Mw/D |
|---|---|---|---|---|---|---|---|
| V1 | MON-102-Br | 50 | MON-1-BE | 30 | MON-30-BE | 20 | 138K/2.1 |
| V2 | MON-101-BE | 30 | MON-20-Br | 50 | MON-30-BE | 20 | 115K/3.4 |
| Po1 | MON-1-Br | 30 | MON-20-BE | 50 | MON-30-Br | 20 | 150K/3.9 |
| Po5 | MON-2-Br | 30 | MON-20-BE | 50 | MON-30-Br | 20 | 65K/2.8 |
| Po18 | MON-3-Br | 30 | MON-20-BE | 50 | MON-30-Br | 20 | 68K/2.5 |

In addition, the following polymers of the invention are prepared:

| Polymer | MON A | % | MON B | % | MON C | % | MON D | % | MON E | % | Mw/D |
|---|---|---|---|---|---|---|---|---|---|---|---|
| Po2 | MON-2-Br | 30 | MON-20-BE | 50 | MON-32-Br | 20 | — | — | — | — | 50K/2.3 |
| Po3 | MON-5-Br | 40 | MON-22-BE | 50 | MON-30-Br | 10 | — | — | — | — | 85K/3.2 |
| Po4 | MON-3-Br | 30 | MON-24-BE | 50 | MON-31-Br | 20 | — | — | — | — | 43K/3.5 |
| Po6 | MON-1-BE | 40 | MON-23-Br | 50 | MON-32-BE | 10 | — | — | — | — | 78K/2.3 |
| Po7 | — | — | MON-20-BE | 50 | MON-4-Br | 50 | — | — | — | — | 53K/3.3 |
| Po8 | MON-3-Br | 25 | MON-24-BE | 50 | MON-4-Br | 25 | — | — | — | — | 65K/3.7 |
| Po9 | MON-1-BE | 40 | MON-25-Br | 50 | MON-31-BE | 10 | — | — | — | — | 73K/4.2 |
| Po10 | MON-5-Br | 30 | MON-22-BE | 50 | MON-30-Br | 20 | — | — | — | — | 105K/2.3 |
| Po11 | MON-1-Br | 20 | MON-20-BE | 50 | MON-32-Br | 10 | MON-2-Br | 20 | — | — | 95K/2.6 |
| Po12 | MON-6-BE | 30 | MON-25-Br | 50 | MON-30-BE | 10 | MON-32-BE | 10 | — | — | 67K/3.6 |
| Po13 | MON-1-BE | 40 | MON-21-Br | 50 | MON-31-BE | 10 | — | — | — | — | 115K/2.1 |
| Po14 | MON-1-BE | 25 | MON-21-Br | 50 | MON-30-BE | 25 | — | — | — | — | 130K/2.9 |
| Po15 | MON-5-Br | 40 | MON-24-BE | 50 | MON-4-Br | 10 | — | — | — | — | 75K/3.2 |
| Po16 | MON-3-Br | 30 | MON-20-BE | 50 | MON-32-Br | 20 | — | — | — | — | 95K/3.4 |
| Po17 | MON-1-Br | 40 | MON-20-BE | 50 | MON-30-Br | 10 | — | — | — | — | 85K/2.6 |
| Po19 | MON-1-BE | 30 | MON-25-Br | 50 | MON-31-BE | 20 | — | — | — | — | 66K/2.7 |
| Po20 | MON-1-BE | 50 | MON-20-Br | 50 | — | — | — | — | — | — | 60K/2.5 |
| Po21 | MON-1-BE | 50 | MON-25-Br | 50 | — | — | — | — | — | — | 85K/2.8 |
| Po22 | MON-1-Br | 30 | MON-20-BE | 50 | MON-33-Br | 20 | — | — | — | — | 90K/2.4 |
| Po23 | MON-1-Br | 30 | MON-20-BE | 50 | MON-34-Br | 20 | — | — | — | — | 75K/3.4 |
| Po24 | MON-1-Br | 20 | MON-102-Br | 10 | MON-20-BE | 50 | MON-30-Br | 20 | — | — | 88K/2.5 |
| Po25 | MON-2-Br | 30 | MON-20-BE | 50 | MON-30-Br | 10 | MON-32-Br | 10 | — | — | 70K/2.2 |
| Po26 | MON-1-Br | 20 | MON-102-BE | 10 | MON-20-Br | 10 | MON-20-BE | 40 | MON-30-BE | 20 | 37K/1.9 |
| Po27 | MON-2-BE | 30 | MON-26-Br | 50 | Mon-30-BE | 20 | — | — | — | — | 65K/2.4 |
| Po28 | MON-20-BE | 50 | MON-35-Br | 50 | — | — | — | — | — | — | 40K/2.3 |
| Po29 | MON-1-Br | 30 | MON-20-BE | 50 | MON-35-Br | 20 | — | — | — | — | 25K/2.4 |
| Po30 | MON-2-Br | 30 | MON-20-BE | 50 | MON-30-Br | 10 | MON-32-Br | 10 | — | — | 70K/2.2 |
| Po31 | MON-102-BE | 10 | MON-1-Br | 30 | MON-20-BE | 40 | MON-30-Br | 20 | — | — | 70K/2.9 |
| Po32 | MON-7-Br | 30 | MON-20-BE | 50 | MON-30-BE | 20 | — | — | — | — | 50K/2.1 |
| Po33 | MON-35-BE | 30 | MON-20-Br | 50 | MON-30-BE | 20 | — | — | — | — | 60K/2.1 |
| Po34 | MON-8-BE | 40 | MON-23-Br | 50 | MON-32-BE | 10 | — | — | — | — | 78K/2.3 |
| Po35 | MON-8-BE | 25 | MON-21-Br | 50 | MON-30-BE | 25 | — | — | — | — | 130K/2.9 |
| Po36 | MON-8-Br | 30 | MON-20-BE | 50 | MON-32-Br | 20 | — | — | — | — | 95K/3.4 |
| Po37 | MON-8-Br | 40 | MON-20-BE | 50 | MON-30-Br | 10 | — | — | — | — | 85K/2.6 |
| Po38 | MON-8-Br | 30 | MON-20-BE | 50 | MON-30-Br | 20 | — | — | — | — | 68K/2.5 |
| Po39 | MON-2-Br | 50 | MON-20-BE | 50 | | | | | | | 80K/2.1 |
| Po40 | MON-102-Br | 10 | MON-1-Br | 40 | MON-20-BE | 50 | | | | | 110K/2.2 | able polymer and a p-doping salt are dissolved in toluene. Corresponding materials have been described in WO 2016/107668, WO 2013/081052 and EP2325190 inter alia. For a resulting layer thickness of 20 nm, a solids content of 6 mg/ml is used. The layer is subsequently baked on a hotplate at 200° C. in an inert gas atmosphere for 30 minutes.

The hole transport and emission layers are then applied to these coated glass plates.

The hole transport layers used are the compounds of the invention and comparative compounds, each dissolved in toluene. The solids content of these solutions is 5 mg/ml, since layer thicknesses of 20 nm are to be achieved by means of spin-coating. The layers are spun on in an inert gas atmosphere and baked on a hotplate at 240° C. for 30 minutes.

The emission layer is composed of the host material H1 and the emitting dopant D1. The materials are present in the emission layer in a proportion by weight of 92% H1 and 8% D1. The mixture for the emission layer is dissolved in toluene. The solids content of this solution is 9 mg/ml, since layer thicknesses of 30 nm are to be achieved by means of spin-coating.

The layers are spun on in an inert gas atmosphere and baked at 150° C. for 10 minutes.

The materials used in the present case are shown in the table below.

| HBL and ETL materials used |
|---|
| 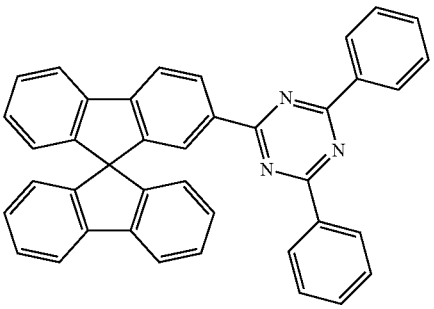 [SMILES: c1ccc(-c2nc(-c3ccccc3)nc(-c3ccc4c(c3)C3(c5ccccc5-c5ccccc53)c3ccccc3-4)n2)cc1] |
| ETM1 |
| 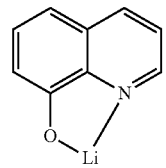 |
| ETM2 |

| Structural formulae of the materials used in the emission layer |
|---|
| 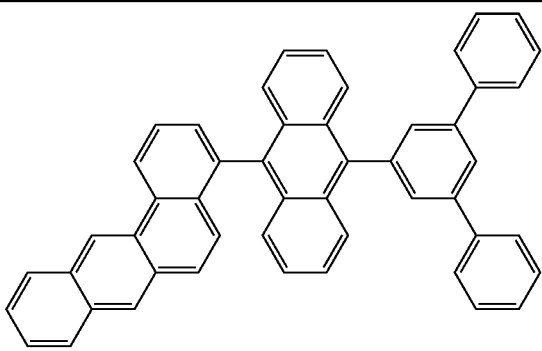 |
| H1 |
| 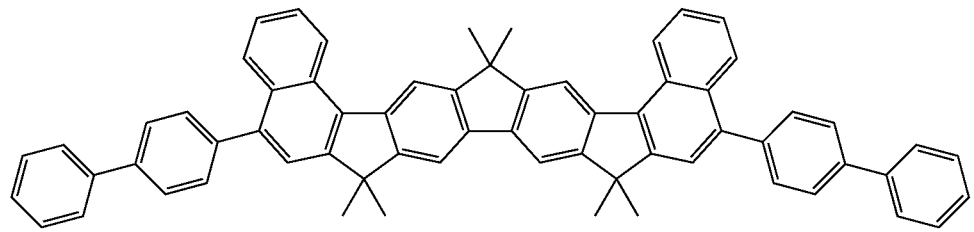 |
| D1 |

The materials for the hole blocker layer and electron transport layer are applied by thermal vapour deposition in a vacuum chamber and are shown in the table below. The hole blocker layer consists of ETM1. The electron transport layer consists of the two materials ETM1 and ETM2, which are blended by co-evaporation in a proportion by volume of 50% each.

The cathode is formed by the thermal evaporation of an aluminium layer of thickness 100 nm.

The OLEDs are characterized in a standard manner. For this purpose, the electroluminescence spectra and current-voltage-luminance characteristics (IUL characteristics) assuming Lambertian radiation characteristics and the (operating) lifetime are determined. The IUL characteristics are used to determine parameters, for example the external quantum efficiency (in %) at a particular brightness. LD80 @ 1000 cd/m² is the lifetime until the OLED, given a starting brightness of 1000 cd/m², has dropped to 80% of the starting intensity, i.e. to 800 cd/m².

The performance data and properties of the OLEDs produced are described hereinafter. The OLEDs produced are blue-emitting OLEDs.

1) For OLEDs comprising V1, V2, Po1, Po5 and Po18, the following results are obtained for lifetime and efficiency:

| Polymer in HTL | Efficiency at 1000 cd/m² % EQE | LD80 at 1000 cd/m² [h] |
|---|---|---|
| V1 | 4.4 | 198 |
| V2 | 7.4 | 121 |
| Po1 | 7.6 | 257 |
| Po5 | 7.4 | 279 |
| Po18 | 7.1 | 223 |

As the efficiency data obtained show, the inventive polymer Po1 brings great improvements compared to the comparative polymer V1. The efficiency rises by more than 50% compared to the comparative polymer V1. This shows the effect which is achieved through the use of the conjugation-interrupting substituted phenylene unit derived from the monomer MON-20-BE compared to the use of the indenofluorene unit derived from the monomer MON-102-Br. The indenofluorene unit is not a conjugation-interrupting unit.

Distinct improvements are also apparent with polymers containing other conjugation-interrupting units, for example the MON-21 to MON-26 units shown above, compared to comparative polymers having no conjugation-interrupting unit, for example V1 with the indenofluorene unit MON-102-Br.

As the lifetime data obtained show, the inventive polymers Po1, Po5 and Po18 also bring improvements over the comparative polymer V2. The efficiency remains virtually unchanged. This shows the effect which is achieved through the use of the ortho-substituted triarylamine structural units derived from the monomers MON-1-Br, MON-2-Br and MON-3-Br (in Po1, Po5 and Po18) compared to the use of the para-substituted triarylamine structural unit derived from the monomer MON-101-BE (in V2).

An improved lifetime compared to V2 is also obtained with further polymers of the invention that differ from Po1, Po5 and Po18 in that, rather than the structural units derived from the monomers MON-1-Br, MON-2-Br and MON-3-Br, they contain structural units derived from the monomers MON-4-Br, MON—S—Br, MON-6-BE, MON-7-Br, MON-8-BE and MON-8-Br.

2) In addition to the examples adduced above, OLEDs comprising the following polymers of the invention are examined:

| Polymer in HTL | Efficiency at 1000 cd/m² % EQE | LD80 at 1000 cd/m² [h] |
|---|---|---|
| Po2 | 7.6 | 143 |
| Po22 | 6.8 | 256 |
| Po23 | 8.0 | 129 |
| Po24 | 7.3 | 397 |
| Po25 | 7.5 | 230 |
| Po26 | 7.4 | 192 |
| Po27 | 6.7 | 234 |
| Po28 | 7.0 | 216 |
| Po37 | 7.5 | 216 |
| Po38 | 7.1 | 223 |

It is found here that these likewise have a very good efficiency. The relatively short lifetime in Po2 and Po23 is caused by the monomers MON-32-Br and MON-34-Br present in these polymers.

3) Finally, OLEDs each comprising one of the abovementioned inventive polymers Po3, Po4, Po6 to Po17, Po19 to Po21, Po29 to Po36, Po39 and Po40 as material for the HTL are produced. This likewise achieves good results for efficiency and lifetime.

In the inventive examples, the polymers of the invention are used in an HTML in combination with an EML which is applied from solution and contains a singlet emitter. This shows the excellent suitability of the polymers in this specific device setup with blue-emitting EML applied from solution.

The invention claimed is:
1. A polymer comprising at least one structural unit of formula (I):

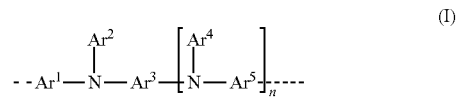

wherein $Ar^1$, $Ar^2$, $Ar^3$, $Ar^4$, and $Ar^5$
are the same or different and are selected from the group consisting of heteroaromatic ring systems having 5 to 40 aromatic ring atoms and are optionally substituted by one or more $R^1$ radicals and aromatic ring systems having 6 to 40 aromatic ring atoms and are optionally substituted by one or more $R^1$ radicals, with the proviso that at least one of the two $Ar^2$ and $Ar^4$ groups is substituted in each case by an $R^4$ group in at least one ortho position to the bond to N, wherein the $R^4$ group optionally defines a ring with the corresponding $Ar^2$ or $Ar^4$ group to which it is bonded, and wherein the $R^4$ group is bonded to the $Ar^2$ and/or $Ar^4$ group(s) directly or via a linker group X;

$R^1$ is the same or different in each instance and is selected from the group consisting of H, D, F, C(=O)$R^2$, CN, Si($R^2$)$_3$, N($R^2$)$_2$, P(=O)($R^2$)$_2$, O$R^2$, S(=O)$R^2$, S(=O)$_2$ $R^2$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; wherein two or more $R^1$ groups are optionally joined to one another so as to define a ring; and wherein the alkyl, alkoxy, alkenyl, and alkynyl groups and the aromatic and heteroaromatic ring systems are each optionally substituted by one or more $R^2$ groups; and wherein one or more CH$_2$ groups in the alkyl, alkoxy, alkenyl, and alkynyl groups are optionally replaced by —$R^2$C=C$R^2$—, —C≡C—, Si($R^2$)$_2$, $C=O$, $C=NR^2$, $-C(=O)O-$, $-C(=O)NR^2-$, $NR^2$, $P(=O)(R^2)$, $-O-$, $-S-$, $SO$, or $SO_2$;

$R^2$ is the same or different in each instance and is selected from the group consisting of H, D, F, $C(=O)R^3$, CN, $Si(R^3)_3$, $N(R^3)_2$, $P(=O)(R^3)_2$, $OR^3$, $S(=O)R^3$, $S(=O)_2 R^3$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; wherein two or more $R^1$ and/or $R^2$ groups are optionally joined to one another so as to define a ring; wherein the alkyl, alkoxy, alkenyl, and alkynyl groups and the aromatic and heteroaromatic ring systems are each optionally substituted by one or more $R^3$ groups; and wherein one or more $CH_2$ groups in the alkyl, alkoxy, alkenyl, and alkynyl groups are optionally replaced by $-R^3C=CR^3-$, $-C\equiv C-$, $Si(R^3)_2$, $C=O$, $C=NR^3$, $-C(=O)O-$, $-C(=O)NR^3-$, $NR^3$, $P(=O)(R^3)$, $-O-$, $-S-$, $SO$, or $SO_2$;

$R^3$ is the same or different in each instance and is selected from the group consisting of H, D, F, CN, alkyl, or alkoxy groups having 1 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; wherein two or more $R^3$ groups are optionally joined to one another so as to define a ring; and wherein the alkyl, alkoxy, alkenyl, and alkynyl groups, aromatic ring systems, and heteroaromatic ring systems are optionally substituted by F or CN;

$R^4$ is the same or different in each instance and is selected from the group consisting of heteroaromatic ring systems having 5 to 40 aromatic ring atoms and which is optionally substituted by one or more $R^2$ groups and aromatic ring systems having 6 to 40 aromatic ring atoms and which are optionally substituted by one or more $R^2$ radicals;

X is the same or different in each instance and is selected from the group consisting of $C(R^2)_2$, $Si(R^2)_2$, $NR^2$, O, S, and $C=O$;

n is 0 or 1;

and at least one structural unit selected from the group consisting of structural unit A has a structure of formula (II-A):

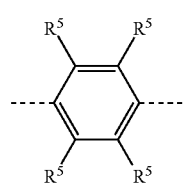

(II-A)

wherein there is at least one $R^5$ group other than H and D;

structural units B comprising two groups bonded directly to one another and selected from the group consisting of aryl groups having 6 to 40 aromatic ring atoms and optionally substituted in each case by one or more $R^5$ groups and heteroaryl groups having 5 to 40 aromatic ring atoms and optionally substituted in each case by one or more $R^5$ groups, wherein the conjugation plane of the second aryl or heteroaryl group is twisted about the axis of the bond between the two groups with respect to the conjugation plane of the first aryl or heteroaryl group; and structural units C of formula (II-C):

wherein

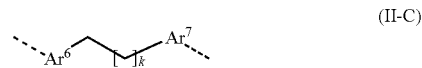

(II-C)

$Ar^6$ and $Ar^7$
are the same or different in each instance and are selected from the group consisting of aromatic ring systems having 6 to 40 aromatic ring atoms and optionally substituted by one or more $R^5$ groups and heteroaromatic ring systems having 5 to 40 aromatic ring atoms and optionally substituted by one or more $R^5$ groups;

$R^5$ is the same or different in each instance and is selected from the group consisting of H, D, F, $C(=O)R^2$, CN, $Si(R^2)_3$, $N(R^2)_2$, $P(=O)(R^2)_2$, $OR^2$, $S(=O)R^2$, $S(=O)_2 R^2$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; wherein two or more $R^1$ groups are optionally joined to one another so as to define a ring; wherein the alkyl, alkoxy, alkenyl, and alkynyl groups and the aromatic and heteroaromatic ring systems are each optionally substituted by one or more $R^2$ groups; and wherein one or more $CH_2$ groups in the alkyl, alkoxy, alkenyl, and alkynyl groups are optionally replaced by $-R^2C=CR^2-$, $-C\equiv C-$, $Si(R^2)_2$, $C=O$, $C=NR^2$, $-C(=O)O-$, $-C(=O)NR^2-$, $NR^2$, $P(=O)(R^2)$, $-O-$, $-S-$, $SO$, or $SO_2$;

k is an integer from 0 to 9, and wherein one or more $CH_2$ units in the alkylene chain of formula (II-C) are optionally replaced by a divalent unit selected from the group consisting of $C=O$, $C=NR^5$, $-C(=O)O-$, $-C(=O)NR^5-$, $Si(R^5)_2$, $NR^5$, $P(=O)(R^5)$, O, S, SO, and $SO_2$; and wherein one or more hydrogen atoms in the alkylene chain of formula (II-C) are optionally replaced by an $R^5$ group.

2. The polymer of claim 1, wherein $R^4$ is the same or different in each instance and is selected from the group consisting of aromatic ring systems having 6 to 20 aromatic ring atoms and optionally substituted by one or more $R^2$ groups.

3. The polymer of claim 1, wherein at least one group selected from the group consisting of $Ar^2$ and $Ar^4$ groups contains exactly one or exactly two $R^4$ groups in the ortho position to the nitrogen atom, wherein $R^4$ is bonded to the $Ar^e$ and/or $Ar^4$ group(s) directly or via a linker group X.

4. The polymer of claim 1, wherein the structural unit of formula (I) has a structure of one of formulae (I-1-A), (I-2-A-1), (I-2-A-2), or (I-2-A-3):

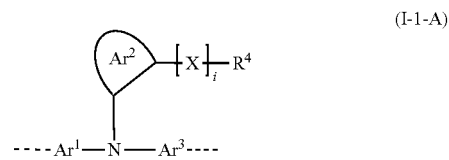

(I-1-A)

(I-2-A-1)

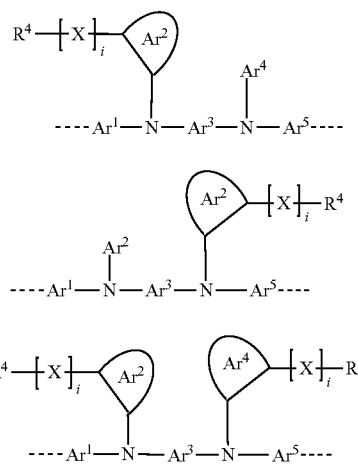

(I-2-A-2)

(I-2-A-3)

wherein
i is 0 or 1.

5. The polymer of claim 1, wherein the structural unit of formula (I) has a structure of one of formulae (I-1-B), (I-2-B-1), (I-2-B-2), or (I-2-B-3):

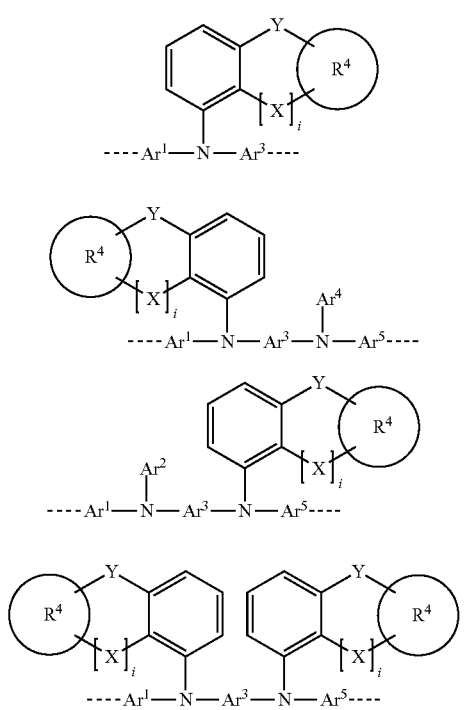

(I-1-B)

(I-2-B-1)

(I-2-B-2)

(I-2-B-3)

wherein
i is 0 or 1; and
Y in each instance is the same or different and is selected from the group consisting of a single bond, $C(R^2)_2$, $Si(R^2)_2$, $NR^2$, O, S, and C=O.

6. The polymer of claim 1, wherein the structural unit of formula (I) has a structure of one of formulae (I-1-A-A), (I-1-A-B), or (I-1-B-A):

(I-1-A-A)

(I-1-A-B)

(I-1-B-A)

wherein
i is 0 or 1;
Y is the same or different in each instance and is selected from the group consisting of a single bond, $C(R^2)_2$, $Si(R^2)_2$, $NR^2$, O, S, and C=O; and
the aromatic six-membered rings are each optionally substituted at the positions shown as unsubstituted by an $R^1$ or $R^2$ group.

7. A polymer comprising at least one structural unit of formula (I):

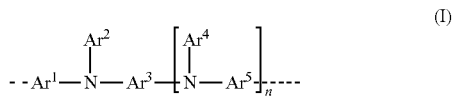

(I)

wherein $Ar^j$, $Ar^e$, $Ar^a$, $Ar^4$, and $Ar^5$ are the same or different and are selected from the group consisting of heteroaromatic ring systems having 5 to 40 aromatic ring atoms and are optionally substituted by one or more $R^1$ radicals and aromatic ring systems having 6 to 40 aromatic ring atoms and are optionally substituted by one or more $R^1$ radicals, with the proviso that at least one of the two $Ar^2$ and $Ar^4$ groups is substituted in each case by an $R^4$ group in at least one ortho position to the bond to N, wherein the $R^4$ group optionally defines a ring with the corresponding $Ar^2$ or $Ar^4$ group to which it is bonded, and wherein the $R^4$ group is bonded to the $Ar^2$ and/or $Ar^4$ group(s) directly or via a linker group X;
$R^1$ is the same or different in each instance and is selected from the group consisting of H, D, F, C(=O)$R^2$, CN, $Si(R^2)_3$, $N(R^2)_2$, $P(=O)(R^2)_2$, $OR^2$, $S(=O)R^2$, $S(=O)_2 R^2$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; wherein two or more $R^1$ groups are optionally joined to one another so as to define a ring; and wherein the alkyl, alkoxy, alkenyl, and alkynyl groups and the aromatic and heteroaromatic ring systems are each optionally substituted by one or more $R^2$ groups; and wherein one or more $CH_2$ groups in the alkyl, alkoxy, alkenyl, and alkynyl groups are optionally replaced by —R²C=CR²—, —C≡C—, Si(R²)₂, C=O, C=NR², —C(=O)O—, —C(=O)NR²—, NR², P(=O)(R²), —O—, —S—, SO, or SO₂;

R² is the same or different in each instance and is selected from the group consisting of H, D, F, C(=O)R³, CN, Si(R³)₃, N(R³)₂, P(=O)(R³)₂, OR³, S(=O)R³, S(=O)₂R³, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; wherein two or more R¹ and/or R² groups are optionally joined to one another so as to define a ring; wherein the alkyl, alkoxy, alkenyl, and alkynyl groups and the aromatic and heteroaromatic ring systems are each optionally substituted by one or more R³ groups; and wherein one or more CH₂ groups in the alkyl, alkoxy, alkenyl, and alkynyl groups are optionally replaced by —R³C=CR³—, —C≡C—, Si(R³)₂, C=O, C=NR³, —C(=O)O—, —C(=O)NR³—, NR³, P(=O)(R³), —O—, —S—, SO, or SO₂;

R³ is the same or different in each instance and is selected from the group consisting of H, D, F, CN, alkyl, or alkoxy groups having 1 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; wherein two or more R³ groups are optionally joined to one another so as to define a ring; and wherein the alkyl, alkoxy, alkenyl, and alkynyl groups, aromatic ring systems, and heteroaromatic ring systems are optionally substituted by F or CN;

R⁴ is the same or different in each instance and is selected from the group consisting of heteroaromatic ring systems having 5 to 40 aromatic ring atoms and which is optionally substituted by one or more R² groups and aromatic ring systems having 6 to 40 aromatic ring atoms and which are optionally substituted by one or more R² radicals;

X is the same or different in each instance and is selected from the group consisting of C(R²)₂, Si(R²)₂, NR², O, S, and C=O;

n is 0 or 1;

and at least one structural unit selected from the group consisting of structural units A comprising a planar aromatic group selected from the group consisting of aryl groups having 6 to 40 aromatic ring atoms and heteroaryl groups having 6 to 40 aromatic ring atoms, where the planar aromatic group comprises at least one R⁵ group which, on account of the space it occupies, brings about twisting of the planar aromatic group with respect to that plane which is formed by the planar aromatic groups of the directly adjacent structural units, and wherein the aryl groups and heteroaryl groups are each optionally substituted by one or more further R⁵ groups;

structural units B has a structure of formula (II-B):

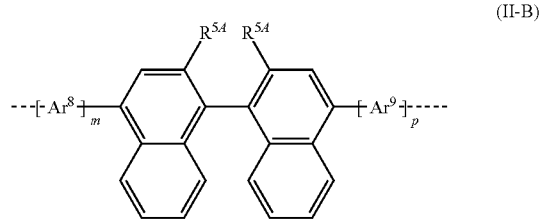

(II-B)

wherein

R⁵ᴬ is the same or different in each instance and is selected from the group consisting of H, D, F, C(=O) R², CN, Si(R²)₃, N(R²)₂, P(=O)(R²)₂, OR², S(=O)R², S(=O)₂R², straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; wherein two or more R¹ groups are optionally joined to one another so as to define a ring; wherein the alkyl, alkoxy, alkenyl, and alkynyl groups and the aromatic and heteroaromatic ring systems are each optionally substituted by one or more R² groups; and wherein one or more CH₂ groups in the alkyl, alkoxy, alkenyl, and alkynyl groups are optionally replaced by —R²C=CR²—, —C≡C—, Si(R²)₂, C=O, C=NR², —C(=O)O—, —C(=O)NR²—, NR², P(=O)(R²), —O—, —S—, SO, or SO₂;

Arᵍ and Arᵍ
are the same or different in each instance and are selected from the group consisting of aromatic ring systems having 6 to 40 aromatic ring atoms and optionally substituted by one or more R⁵ groups and heteroaromatic ring systems having 5 to 40 aromatic ring atoms and optionally substituted by one or more R⁵ groups;

m and p
are the same or different in each instance and are selected from the group consisting of 0 and 1;

and the naphthyl groups at the positions shown as unsubstituted are each optionally substituted by an R⁵ group; and structural units C of formula (II-C):

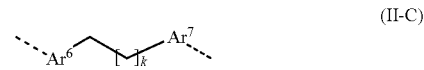

(II-C)

wherein

Ar⁶ and Ar⁷
are the same or different in each instance and are selected from the group consisting of aromatic ring systems having 6 to 40 aromatic ring atoms and optionally substituted by one or more R⁵ groups and heteroaromatic ring systems having 5 to 40 aromatic ring atoms and optionally substituted by one or more R⁵ groups;

R⁵ is the same or different in each instance and is selected from the group consisting of H, D, F, C(=O)R², CN, Si(R²)₃, N(R²)₂, P(=O)(R²)₂, OR², S(=O)R², S(=O)₂R², straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; wherein two or more $R^1$ groups are optionally joined to one another so as to define a ring; wherein the alkyl, alkoxy, alkenyl, and alkynyl groups and the aromatic and heteroaromatic ring systems are each optionally substituted by one or more $R^2$ groups; and wherein one or more $CH_2$ groups in the alkyl, alkoxy, alkenyl, and alkynyl groups are optionally replaced by —$R^2C$=$CR^2$—, —C≡C—, $Si(R^2)_2$, C=O, C=$NR^2$, —C(=O)O—, —C(=O)$NR^2$—, $NR^2$, P(=O)($R^2$), —O—, —S—, SO, or $SO_2$;

k is an integer from 0 to 9, and wherein one or more $CH_2$ units in the alkylene chain of formula (II-C) are optionally replaced by a divalent unit selected from the group consisting of C=O, C=$NR^5$, —C(=O)O—, —C(=O)$NR^5$—, $Si(R^5)_2$, $NR^5$, P(=O)($R^5$), O, S, SO, and $SO_2$; and wherein one or more hydrogen atoms in the alkylene chain of formula (II-C) are optionally replaced by an $R^5$ group.

8. The polymer of claim 1, wherein the structural unit B has a structure of formula (II-B):

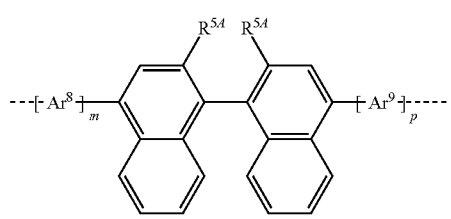

(II-B)

wherein
$R^{5A}$ is the same or different in each instance and is selected from the group consisting of H, D, F, C(=O)$R^2$, CN, $Si(R^2)_3$, $N(R^2)_2$, P(=O)($R^2$)$_2$, $OR^2$, S(=O)$R^2$, S(=O)$_2R^2$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; wherein two or more $R^1$ groups are optionally joined to one another so as to define a ring; wherein the alkyl, alkoxy, alkenyl, and alkynyl groups and the aromatic and heteroaromatic ring systems are each optionally substituted by one or more $R^2$ groups; and wherein one or more $CH_2$ groups in the alkyl, alkoxy, alkenyl, and alkynyl groups are optionally replaced by —$R^2C$=$CR^2$—, —C≡C—, $Si(R^2)_2$, C=O, C=$NR^2$, —C(=O)O—, —C(=O)$NR^2$—, $NR^2$, P(=O)($R^2$), —O—, —S—, SO, or $SO_2$;

$Ar^8$ and $Ar^g$
are the same or different in each instance and are selected from the group consisting of aromatic ring systems having 6 to 40 aromatic ring atoms and optionally substituted by one or more $R^5$ groups and heteroaromatic ring systems having 5 to 40 aromatic ring atoms and optionally substituted by one or more $R^5$ groups;

m and p
are the same or different in each instance and are selected from the group consisting of 0 and 1;
and the naphthyl groups at the positions shown as unsubstituted are each optionally substituted by an $R^5$ group.

9. The polymer of claim 1, wherein the sum total of the proportions of those structural units that correspond to a structural unit A, B or C in the polymer is between 20 and 75 mol %, based on 100 mol % of all copolymerized monomers present as structural units in the polymer.

10. The polymer of claim 1, wherein the sum total of the proportions of those structural units that correspond to a structural unit of the formula (I) in the polymer is between 10 and 60 mol %, based on 100 mol % of all copolymerized monomers present as structural units in the polymer.

11. The polymer of claim 1, wherein the polymer contains at least one structural unit having a crosslinkable group Q.

12. The polymer of claim 11, wherein the at least one structural unit having a crosslinkable group Q is a structural unit of formula (I), a structural unit A, a structural unit B, a structural unit C, or a structural unit selected from the group consisting of triarylamine, fluorene, indenofluorene, and spirobifluorene structural units.

13. The polymer of claim 11, wherein the proportion of structural units having a crosslinkable group Q in the polymer is in the range from 1 to 50 mol %, based on 100 mol % of all copolymerized monomers present as structural units in the polymer.

14. A polymer prepared by crosslinking the polymer of claim 11.

15. A mixture comprising at least one monomer of formula (M-I) and at least one monomer selected from the group consisting of monomers of formulae (M-II-A), (M-II-B), and (M-II-C):

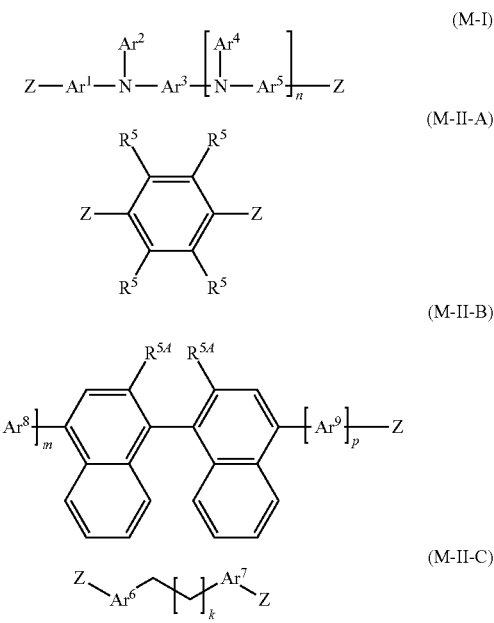

wherein
$R^{5A}$ is the same or different in each instance and is selected from the group consisting of H, D, F, C(=O)$R^2$, CN, $Si(R^2)_3$, $N(R^2)_2$, P(=O)($R^2$)$_2$, $OR^2$, S(=O)$R^2$, S(=O)$_2R^2$, straight-chain alkyl or alkoxy groups having 1 to 20 carbon atoms, branched or cyclic alkyl or alkoxy groups having 3 to 20 carbon atoms, alkenyl or alkynyl groups having 2 to 20 carbon atoms, aromatic ring systems having 6 to 40 aromatic ring atoms, and heteroaromatic ring systems having 5 to 40 aromatic ring atoms; wherein two or more $R^1$ groups are optionally joined to one another so as to define a ring; wherein the alkyl, alkoxy, alkenyl, and alkynyl groups and the aromatic and heteroaromatic ring systems are each optionally substituted by one or more $R^2$ groups; and wherein one or more $CH_2$ groups in the alkyl, alkoxy, alkenyl, and alkynyl groups are optionally replaced by $-R^2C=CR^2-$, $-C\equiv C-$, $Si(R^2)_2$, $C=O$, $C=NR^2$, $-C(=O)O-$, $-C(=O)NR^2-$, $NR^2$, $P(=O)(R^2)$, $-O-$, $-S-$, $SO$, or $SO_2$;

$Ar^g$ and $Ar^g$ are the same or different in each instance and are selected from the group consisting of aromatic ring systems having 6 to 40 aromatic ring atoms and optionally substituted by one or more $R^5$ groups and heteroaromatic ring systems having 5 to 40 aromatic ring atoms and optionally substituted by one or more $R^5$ groups;

m and p are the same or different in each instance and are selected from the group consisting of 0 and 1; and Z is the same or different in each instance and is a leaving group suitable for a polymerization reaction.

16. A mixture comprising at least one polymer of claim 1 and one or more further polymeric, oligomeric, dendritic, and/or low molecular weight substances.

17. A solution comprising one or more polymers of claim 1 and one or more solvents.

18. An electronic device comprising at least one polymer of claim 1.

19. The electronic device of claim 18, wherein the polymer is present in a layer selected from the group consisting of hole-transporting layers, hole injection layers, electron blocker layers, and emitting layers.

20. The electronic device of claim 18, wherein the electronic device comprises a blue-fluorescing emitting layer which has been applied from solution.

21. The polymer of claim 7, wherein the structural unit A has a structure of formula (II-A):

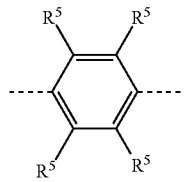

(II-A)

wherein there is at least one $R^5$ group other than H and D.

* * * * *